(12) United States Patent
Wang et al.

(10) Patent No.: US 10,072,356 B2
(45) Date of Patent: *Sep. 11, 2018

(54) MAGNETIC MATERIAL INCLUDING α"-FE$_{16}$(N$_x$Z$_{1-x}$)$_2$ OR A MIXTURE OF α"-FE$_{16}$Z$_2$ AND α"-FE$_{16}$N$_2$, WHERE Z INCLUDES AT LEAST ONE OF C, B, OR O

(71) Applicant: Regents of the University of Minnesota, Minneapolis, MN (US)

(72) Inventors: Jian-Ping Wang, Shoreview, MN (US);
Yanfeng Jiang, Minneapolis, MN (US);
Md Aminul Mehedi, Minneapolis, MN (US)

(73) Assignee: Regents of the University of Minnesota, Minneapolis, MN (US)

( * ) Notice: Subject to any disclaimer, the term of this patent is extended or adjusted under 35 U.S.C. 154(b) by 393 days.

This patent is subject to a terminal disclaimer.

(21) Appl. No.: 14/820,284

(22) Filed: Aug. 6, 2015

(65) Prior Publication Data

US 2016/0042849 A1 Feb. 11, 2016

Related U.S. Application Data

(60) Provisional application No. 62/035,155, filed on Aug. 8, 2014.

(51) Int. Cl.
*C30B 29/38* (2006.01)
*C22C 38/00* (2006.01)
(Continued)

(52) U.S. Cl.
CPC .......... *C30B 29/38* (2013.01); *C01B 21/0622* (2013.01); *C21D 1/26* (2013.01);
(Continued)

(58) Field of Classification Search
None
See application file for complete search history.

(56) References Cited

U.S. PATENT DOCUMENTS 5,032,947 A 7/1991 Li et al.
5,068,147 A 11/1991 Hori et al.
(Continued)

FOREIGN PATENT DOCUMENTS

CN 1156516 A 8/1997
CN 1621549 A 6/2005
(Continued)

OTHER PUBLICATIONS

Slater, "Electronic Structure of Alloys," Journal of Applied Physics, vol. 8, No. 6, Jun. 1937, 8 pp.
(Continued)

*Primary Examiner* — Kevin M Bernatz
(74) *Attorney, Agent, or Firm* — Shumaker & Sieffert, P.A.

(57) ABSTRACT

A magnetic material may include α"-Fe$_{16}$(N$_x$Z$_{1-x}$)$_2$ or a mixture of α"-Fe$_{16}$N$_2$ and α"-Fe$_{16}$Z$_2$, where Z includes at least one of C, B, or O, and x is a number greater than zero and less than one. In some examples, the magnetic material including α"-Fe$_{16}$(N$_x$Z$_{1-x}$)$_2$ or a mixture of α"-Fe$_{16}$N$_2$ and α"-Fe$_{16}$Z$_2$ may include a relatively high magnetic saturation, such as greater than about 219 emu/gram, greater than about 242 emu/gram, or greater than about 250 emu/gram. In addition, in some examples, the magnetic material including α"-Fe$_{16}$(N$_x$Z$_{1-x}$)$_2$ or a mixture of α"-Fe$_{16}$N$_2$ and α"-Fe$_{16}$Z$_2$ may include a relatively low coercivity. Techniques for forming the magnetic material are also described.

31 Claims, 15 Drawing Sheets

(51) Int. Cl.

| | | |
|---|---|---|
| C21D 6/00 | (2006.01) | |
| C21D 1/26 | (2006.01) | |
| C30B 19/00 | (2006.01) | |
| C23C 14/48 | (2006.01) | |
| C23C 14/58 | (2006.01) | |
| C23C 16/36 | (2006.01) | |
| C23C 16/448 | (2006.01) | |
| C23C 16/56 | (2006.01) | |
| C01B 21/06 | (2006.01) | |
| C23C 8/26 | (2006.01) | |
| C23C 28/04 | (2006.01) | |
| C23C 28/00 | (2006.01) | |
| H01F 1/06 | (2006.01) | |
| H01F 10/14 | (2006.01) | |
| C30B 23/00 | (2006.01) | |
| C30B 25/00 | (2006.01) | |
| C22C 1/10 | (2006.01) | |
| C30B 33/02 | (2006.01) | |
| C22C 33/02 | (2006.01) | |
| B22F 9/04 | (2006.01) | |
| H01F 41/18 | (2006.01) | |
| H01F 1/08 | (2006.01) | |

(52) U.S. Cl.
CPC ............. *C21D 6/00* (2013.01); *C22C 1/1031* (2013.01); *C22C 1/1084* (2013.01); *C22C 33/0292* (2013.01); *C22C 38/001* (2013.01); *C22C 38/002* (2013.01); *C23C 8/26* (2013.01); *C23C 14/48* (2013.01); *C23C 14/5806* (2013.01); *C23C 16/36* (2013.01); *C23C 16/4488* (2013.01); *C23C 16/56* (2013.01); *C23C 28/04* (2013.01); *C23C 28/42* (2013.01); *C30B 19/00* (2013.01); *C30B 23/00* (2013.01); *C30B 25/00* (2013.01); *C30B 33/02* (2013.01); *H01F 1/065* (2013.01); *H01F 10/147* (2013.01); *B22F 9/04* (2013.01); *B22F 2009/041* (2013.01); *H01F 1/08* (2013.01); *H01F 41/18* (2013.01)

(56) References Cited

U.S. PATENT DOCUMENTS

| | | |
|---|---|---|
| 5,137,588 A | 8/1992 | Wecker et al. |
| 5,330,554 A | 7/1994 | Koyano et al. |
| 5,449,417 A | 9/1995 | Shimizu et al. |
| 5,617,275 A * | 4/1997 | Ogura ................ G11B 5/1276 360/125.35 |
| 6,139,765 A | 10/2000 | Kitazawa et al. |
| 6,217,672 B1 | 4/2001 | Zhang |
| 6,319,485 B1 | 11/2001 | Nagatomi et al. |
| 6,457,629 B1 | 10/2002 | White |
| 6,778,358 B1 | 8/2004 | Jiang et al. |
| 6,841,259 B1 * | 1/2005 | Takahashi ............ B82Y 10/00 428/812 |
| 7,238,439 B2 | 7/2007 | Sasaki et al. |
| 9,715,957 B2 * | 7/2017 | Wang ................ H01F 1/055 |
| 2002/0117102 A1 | 8/2002 | Takahashi et al. |
| 2002/0191354 A1 | 12/2002 | Yoshikawa et al. |
| 2002/0197530 A1 | 12/2002 | Tani et al. |
| 2004/0247859 A1 | 12/2004 | Sasaki et al. |
| 2005/0208320 A1 | 9/2005 | Masada et al. |
| 2006/0105170 A1 | 5/2006 | Dobson et al. |
| 2006/0112873 A1 | 6/2006 | Uchida et al. |
| 2008/0166584 A1 | 7/2008 | Deligianni et al. |
| 2009/0042063 A1 | 2/2009 | Inoue et al. |
| 2009/0087688 A1 | 4/2009 | Masaki |
| 2010/0035086 A1 | 2/2010 | Inoue et al. |
| 2010/0104767 A1 | 4/2010 | Sskuma et al. |
| 2010/0288964 A1 | 11/2010 | Pirich et al. |
| 2011/0059005 A1 | 3/2011 | Sankar et al. |
| 2011/0074531 A1 | 3/2011 | Yamashita et al. |
| 2012/0090543 A1 | 4/2012 | Cheong |
| 2012/0145944 A1 | 6/2012 | Komuro et al. |
| 2012/0153212 A1 | 6/2012 | Liu |
| 2013/0126775 A1 | 5/2013 | Abe et al. |
| 2013/0140076 A1 | 6/2013 | Lee et al. |
| 2014/0001398 A1 | 1/2014 | Takahaski et al. |
| 2014/0008446 A1 | 1/2014 | Carr |
| 2014/0290434 A1 | 10/2014 | Matthiesen |
| 2014/0294657 A1 * | 10/2014 | Yamamoto ............ B22F 1/02 419/66 |
| 2014/0299810 A1 | 10/2014 | Wang et al. |
| 2015/0380135 A1 | 12/2015 | Wang et al. |
| 2015/0380158 A1 | 12/2015 | Brady et al. |
| 2016/0042846 A1 | 2/2016 | Wang et al. |
| 2016/0042849 A1 * | 2/2016 | Wang ................ C22C 38/002 420/121 |
| 2016/0141082 A1 | 5/2016 | Wang et al. |
| 2016/0189836 A1 | 6/2016 | Takahaski et al. |
| 2017/0186518 A1 * | 6/2017 | Wang ................ H01F 1/0054 |
| 2017/0243680 A1 * | 8/2017 | Wang ................ H01F 1/059 |

FOREIGN PATENT DOCUMENTS

| | | |
|---|---|---|
| CN | 102576591 A | 7/2012 |
| CN | 103339694 A | 10/2013 |
| CN | 103827986 A | 5/2014 |
| CN | 105849834 A | 8/2016 |
| EP | 0509361 A2 | 10/1992 |
| EP | 0633581 A1 | 1/1995 |
| EP | 0994493 A2 | 4/2000 |
| EP | 1548760 A2 | 6/2005 |
| EP | 1675133 A2 | 6/2006 |
| EP | 2492927 A1 | 8/2012 |
| EP | 2666563 A1 | 11/2013 |
| EP | 2696356 A1 | 2/2014 |
| JP | S61143557 A | 7/1986 |
| JP | S61157634 A | 7/1986 |
| JP | S62232101 A | 10/1987 |
| JP | S63132701 A | 6/1988 |
| JP | H02173209 A | 7/1990 |
| JP | H02212320 A | 8/1990 |
| JP | H03100124 A | 4/1991 |
| JP | H04217305 A | 8/1992 |
| JP | H05269503 A | 10/1993 |
| JP | H05311390 A | 11/1993 |
| JP | H05326239 A | 12/1993 |
| JP | H0696947 A | 4/1994 |
| JP | H06267722 A | 9/1994 |
| JP | H06311390 A | 11/1994 |
| JP | 2000176513 A | 6/2000 |
| JP | 2001135508 A | 5/2001 |
| JP | 2001176715 A | 6/2001 |
| JP | 2002334695 A | 11/2002 |
| JP | 2004319923 A | 11/2004 |
| JP | 2005183932 A | 7/2005 |
| JP | 2006155894 A | 6/2006 |
| JP | 2007070669 A | 3/2007 |
| JP | 2007273038 A | 10/2007 |
| JP | 2008311518 A | 12/2008 |
| JP | 2009259402 A | 11/2009 |
| JP | 2012190156 A | 10/2012 |
| JP | 2012193409 A | 10/2012 |
| JP | 2012246174 A | 12/2012 |
| JP | 2013069926 A | 4/2013 |
| JP | 2013080922 A | 5/2013 |
| JP | 2013102122 A | 5/2013 |
| KR | 1020120091091 A | 8/2012 |
| TW | 272293 B | 3/1996 |
| TW | I303072 B | 11/2008 |
| TW | 201249564 A | 12/2012 |
| TW | 201447934 A | 12/2014 |
| WO | WO 2011049080 A1 | 4/2011 |
| WO | WO 2012159096 A2 | 11/2012 |
| WO | WO 2013026007 A2 | 2/2013 |
| WO | WO 2013042721 A1 | 3/2013 |
| WO | WO 2013090895 A1 | 6/2013 |
| WO | WO 2014124135 A2 | 8/2014 |

(56) References Cited

FOREIGN PATENT DOCUMENTS

| WO | | 2014210027 | A1 | 12/2014 |
|---|---|---|---|---|
| WO | WO | 2014210027 | A1 | 12/2014 |
| WO | | 2015148810 | A1 | 10/2015 |
| WO | | 2016022685 | A1 | 2/2016 |
| WO | | 2016022711 | A1 | 2/2016 |
| WO | | 2016122712 | A1 | 8/2016 |
| WO | | 2016122971 | A1 | 8/2016 |
| WO | | 2016122987 | A1 | 8/2016 |

OTHER PUBLICATIONS

Kikkawa et al., "Fine Fe16N2 powder prepared by low-temperature nitridation," Materials Research Bulletin, vol. 43, ScienceDirect, Feb. 19, 2008, 8 pp.
Zayak et al., "First-principles investigations of homogenous lattice-distortive strain and shuffles in Ni2MnGA," Journal of Physics: Condensed Matter, vol. 15, No. 2, Jan. 22, 2003, 8 pp.
Bogaerts et al., "Monte Carlo simulation of an analytical glow discharge: motion of electrons, ions and fast neutrals in the cathode dark space," Spectrochimica Acta, vol. 50B, No. 1, Jan. 1995, 20 pp.
Gagnoud et al., "Electromagnetic Modelling of Induction Melting Devices in Cold Crucible," IEEE Transactions on Magnetics, vol. 24, No. 1, Jan. 1988, 5 pp.
Sakuma, "Electronic and Magnetic Structure of Iron Nitride, Fe16N2 (invited)," Journal of Applied Physics, vol. 79, No. 8, Apr. 15, 1996, 8 pp.
Ayuela et al. "*Ab initio* study of tetragonal variants in Ni2MnGa alloy," Journal of Physics: Condensed Matter, vol. 14, No. 20, May 27, 2002, 14 pp.
Becke, "Density-Functional Exchange-Energy Approximation With Correct Asymptotic Behavior," Physical Review A General Physics, vol. 38, No. 6, Sep. 15, 1988, 4 pp.
Floris et al., "Vibrational Properties of MnO and NiO from DFT+U-Based Density Functional Perturbation Theory," Physical Review B Condensed Matter, vol. 84, Oct. 2011, 6 pp.
Liechtenstein et al., "Density-Functional Theory and Strong Interactions: Orbital Ordering in Mott-Hubbard Insulators," Physical Review B Condensed Matter, vol. 52, No. 8, Aug. 15, 1995, 5 pp.
Vasil'Ev et al., "Structural and Magnetic Phase Transitions in Shape-Memory Alloys Ni2+xMn1-xGa," Physical Review B: Condensed Matter and Materials Physics, vol. 59. No. 2, Jan. 1, 1999, pp. 1113-1120.
Sozinov et al., "Crystal Structures and Magnetic Anisotropy Properties of Ni—Mn—Ga Martensitic Phases With Giant Magnetic-Field-Induced Strain," IEEE Transactions on Magnetics, vol. 38, No. 5, Sep. 2002, pp. 2814-2816.
Zayak et al., "Switchable Ni—Mn—Ga Heusler nanocrystals," Journal of Applied Physics vol. 104, No. 7, Oct. 2008, 6 pp.
Likhachev et al., "Modeling the Strain Response, Magneto-Mechanical Cycling Under the External Stress, Work Output and Energy Losses in Ni—Mn—Ga," Mechanics of Materials, vol. 38, May 2006 pp. 551-563.
Morisako et al., "Magnetic Anisotropy and Soft Magnetism of Iron Nitride Thin Films Prepared by Facing-Target Sputtering," Journal of Applied Physics, vol. 69, No. 8, Apr. 15, 1991, pp. 5619-5621.
Jordan et al., "Magnetic Fluid Hyperthermia (MFH): Cancer Treatment with AC Magnetic Field Induced Excitation of Biocompatible Superparamagnetic Nanoparticles," Journal of Magnetism and Magnetic Materials vol. 201, Jul. 1, 1999 pp. 413-419.
Chakrabarti et al., "Influence of Ni Doping on the Electronic Structure of Ni2MnGa," Physical Review B vol. 72, Aug. 5, 2005, 4 pp.
Kirby et al., "Anomalous ferromagnetism in TbMnO3 thin films," Journal of Applied Physics, vol. 105, No. 7, Apr. 2009, 5 pp.
"2014 Titans of Technology—Jian-Ping Wang," Minneapolis/St. Paul Business Journal, Sep. 19, 2014, 18 pp.
Brady et al., "The Formation of Protective Nitride Surfaces for PEM Fuel Cell Metallic Bipolar Plates," Journal of the Minerals, Aug. 2006, pp. 50-57.

Himmetoglu, et al., "First-Principles Study of Electronic and Structural Properties of CuO," Physical Review B. vol. 84, Sep. 14, 2011, 8 pp.
Wedel et al., "Low Temperature Crystal Structure of Ni—Mn—Ga Alloys," Journal of Alloys and Compounds, vol. 290, Aug. 30, 1999 pp. 137-143.
Min, "Enhancement of Fe Magnetic Moments in Ferromagnetic Fe16B2, Fe16C2, and Fe16N2," International Journal of Modern Physics B. vol. 7, No. 1-3, Jan. 1993, pp. 729-732.
Bozorth, "Atomic Moments of Ferromagnetic Alloys," The Physical Review, vol. 79, No. 5, Sep. 1, 1950. pp. 887.
Rong et al., "Fabrication of Bulk Nanocomposite Magnets Via Severe Plastic Deformation and Warm Compaction," Applied Physics Letters, vol. 96, No. 10, Mar. 8, 2010, 3 pp.
Lorenz et al., "Precise Determination of the Bond Percolation Thresholds and Finite-Size Scaling Corrections for the sc, fcc, and bcc Lattices," Physical Review E, vol. 57, No. 1, Jan. 1998, pp. 230-236.
Majkrzak, "Polarized Neutron Reflectometry," Physica B: Condensed Matter, vol. 173, No. 1 & 2, Aug. 1991, 16 pp.
Opeil et al., "Combined Experimental and Theoretical Investigation of the Premartensitic Transition in Ni2MnGa," Physical Review Letters, vol. 100, Apr. 25, 2008, 4 pp.
Gao et al., "Quantitative Correlation of Phase Structure With the Magnetic Moment in rf Sputtered Fe—N Films," Journal of Applied Physics, vol. 73, No. 10, May 15, 1993, pp. 6579-6581.
Ortiz et al., "Epitaxial Fe16N2 Films Grown by Sputtering," Applied Physics Letters, vol. 65. No. 21, Nov. 21, 1994, pp. 2737-2739.
Cheng et al., "Tempering of Iron-Carbon-Nitrogen Martensites," Metallurgical Transactions A: Physical Metallurgy and Materials Science, vol. 23A, No. 4, Apr. 1992, pp. 1129-1145.
Chikazumi, "Physics of Ferromagnetism," Oxford Science Publications, Ed. 2, 1999, pp. 199-203. (Applicant points out, in accordance with MPEP 609.04(a), that the year of publication, 1999, is sufficiently earlier than the effective U.S. filing date, Aug. 8, 2014, so that the particular month of publication is not in issue.).
Wehrenberg et al., "Shock Compression Response of α"-Fe16N2 Nanoparticles," Journal of Applied Physics, vol. 111, No. 8, Apr. 23, 2012, 8 pp.
Ceperley et al., "Ground State of the Electron Gas by a Stochastic Method," Physical Review Letters, vol. 45, No. 7, Aug. 18, 1980, pp. 566-569.
Borsa et al., "Phase Identification of Iron Nitrides and Iron Oxy-Nitrides with Mössbauer Spectroscopy," Hyperfine Interactions, vol. 151/152, Dec. 2003, pp. 31-48.
Cook, "Strain Induced Martensite Formation in Stainless Steel," Metallurgical Transactions A, vol. 18A, No. 2, Feb. 1987, pp. 201-210.
Sun et al., "Epitaxial Single Crystal Fe16N2 Films Grown by Facing Targets Sputtering," Journal of Applied Physics, vol. 79, No. 8, Apr. 15, 1996, pp. 5440-5442.
Ping et al., "Partitioning of Ga and Co Atoms in a Fe3B/Nd2Fe14B Nanocomposite Magnet," Journal of Applied Physics, vol. 83, No. 12, Jun. 15, 1998, pp. 7769-7775.
Scherlis et al., "Simulation of Heme Using DFT+U: A Step Toward Accurate Spin-State Energetics," The Journal of Physical Chemistry, vol. 111, No. 25, Apr. 21, 2007, pp. 7384-7391.
Jugovic et al., "A Review of Recent Developments in the Synthesis Procedures of Lithium Iron Phosphate Powders," Journal of Power Sources, vol. 190, Feb. 6, 2009, pp. 538-544.
Fullerton et al., "Structure and Magnetic Properties of Exchange-Spring Sm-Co/Co Superlattices," Applied Physics Letters vol. 72, No. 3, Jan. 19, 1998, pp. 380-382.
Van Voorthuysen et al., "Low-Temperature Extension of the Lehrer Diagram and the Iron-Nitrogen Phase Diagram," Metallurgical and Materials Transactions A: Physical Metallurgy and Materials Science, vol. 33A, No. 8, Aug. 2002, pp. 2593-2598.
Kita et al., "Magnetic Properties of Core-Shell Type Fe16N2 Nanoparticles," Journal of Magnetism and Magnetic Materials, vol. 310, 2007, pp. 2411-2413.

(56) References Cited

OTHER PUBLICATIONS

Kneller et al., "The Exchange-Spring Magnet: A New Material Principle for Permanent Magnets," IEEE Transaction on Magnetics, vol. 27, No. 4, Jul. 1991, pp. 3588-3600.

Lavernia et al., "The Rapid Solidification Processing of Materials: Science, Principles, Technology, Advances, and Applications," Journal of Material Science, vol. 45, 2010, pp. 287-325.

Casoli et al., "Exchange-Coupled FePt/Fe Bilayers with Perpendicular Magnetization," IEEE Transactions on Magnetics, vol. 41, No. 10, Oct. 2005, pp. 3877-3879.

Zhou et al., "Phase Separation in LixFePO4 Induced by Correlation Effects," Physical Review B, vol. 69, May 12, 2004, 4 pp.

Zhou et al., "First-Principles Prediction of Redox Potentials in Transition-Metal Compounds with LDA+U," Physical Review B. vol. 70, Dec. 20, 2004, 8 pp.

Zhou et al., "The Li Intercalation Potential of LiMPO4 and LiMSiO4 Olivines with M=Fe, Mn, Co, Ni," Electrochemistry Communications, vol. 6, Sep. 25, 2004, pp. 1144-1148.

Zhou et al., "Configurational Electronic Entropy and the Phase Diagram of Mixed-Valence Oxides: The Case of LixFePO4," Physical Review Letters, vol. 97, Oct. 13, 2006, 4 pp.

Herzer, "Grain Size Dependence of Coercivity and Permeability in Nanocrystalline Ferromagnets," IEEE Transactions on Magnetics, vol. 26, No. 5, Sep. 1990, pp. 1397-1402.

Ludtka et al., "In Situ Evidence of Enhanced Transformation Kinetics in a Medium Carbon Steel Due to a High Magnetic Field," Scripta Materialia, vol. 51, Apr. 20, 2004, pp. 171-174.

Felcher, "Neutron Reflection as a Probe of Surface Magnetism," Physical Review B: Condensed Matter, vol. 24, No. 3, Aug. 1, 1981, pp. 1595-1598.

Speich et al., "Elastic Constants of Binary Iron-Base Alloys," Metallurgical Transactions, vol. 3, No. 8, Aug. 1972, pp. 2031-2037.

Fernando et al., "Magnetic Moment of Iron in Metallic Environments," Physical Review B, vol. 61, No. 1, Jan. 1, 2000, pp. 375-381.

Felcher, "Magnetic Depth Profiling Studies by Polarized Neutron Reflection," Physica B: Condensed Matter, vol. 192, Nos. 1 & 2, Oct. 1993, pp. 137-149.

Gaunt, "The Magnetic Properties of Platinum Cobalt Near the Equiatomic Composition Part II. Mechanism of Magnetic Hardening," The Philosophical Magazine, vol. 13, No. 123, Mar. 1966, pp. 579-588.

Takahashi et al., "$\alpha''$-Fe16N2 Problem—Giant Magnetic Moment or Not," Journal of Magnetism and Magnetic Materials, vol. 208, No. 3, Jan. 11, 2000, pp. 145-157.

Shokrollahi et al., "Soft Magnetic Composite Materials (SMCs)," Journal of Materials Processing Technology, vol. 189, Feb. 20, 2007, pp. 1-12.

Sugita et al., "Magnetic and Electrical Properties of Single-Phase, Single-Crystal Fe16N2 Films Epitaxially Grown by Molecular Beam Epitaxy (Invited)," Journal of Applied Physics, vol. 79, No. 8, Apr. 15, 1996, pp. 5576-5581.

Takahashi et al., "Perpendicular Uniaxial Magnetic Anisotropy of Fe16N2(001) Single Crystal Films Grown by Molecular Beam Epitaxy," IEEE Transactions on Magnetics, vol. 35, No. 5, Sep. 1999, pp. 2982-2984.

Tanaka et al., "Electronic Band Structure and Magnetism of Fe16N2 Calculated by the FLAPW Method," Physical Review B: Condensed Matter and Materials Physics, vol. 62. No, 22, Dec. 1, 2000, pp. 15042-15046.

Zeng et al., "Exchange-Coupled Nanocomposite Magnets by Nanoparticle Self-Assembly," Nature, vol. 420, No. 6914, Nov. 28, 2002, pp. 395-398.

Du, "A Reevaluation of the Fe—N and Fe—C—N Systems," Journal of Phase Equilibria, vol. 14, No. 6, Aug. 24, 1993, pp. 682-693.

Jiang et al., "The Thermostability of the Fe16N2 Phase Deposited on a GaAs Substrate by Ion-Bean-Assisted Deposition," Journal of Physical Condensed Matter, vol. 6, Mar. 17, 1994, pp. L279-L282.

Jan et al., "Monte Carlo Simulations of Spin-1/2 Micelle and Microemulsion Models," Journal De Physique, vol. 49, No. 4, Apr. 1988, pp. 623-633.

Nelson, "Epitaxial Growth From the Liquid State and Its Application to the Fabrication of Tunnel and Laser Diodes," RCA Review, vol. 24, No. 4, Dec. 1963, pp. 603-615.

Shinno et al., "Effects of Film Thickness on Formation Processes of Fe16N2 in Nitrogen Ion-Implanted Fe Films," Surface and Coatings Technology vol. 103-104, May 1998, pp. 129-134.

Takahashi et al., "Ferromagnetic Resonance Studies of Fe16N2 Films with a Giant Magnetic Moment," Journal of Applied Physics, vol. 73, No. 10, May 15, 1993, pp. 6060-6062.

Shimba et al., "Preparation of Iron Nitride Fe16N2 Nanoparticles by Reduction of Iron Nitrate," J. Japan Inst. Metals, vol. 74, No. 3, 2010, 5 pp. (Applicant points out, in accordance with MPEP 609.04(a), that the year of publication, 2010, is sufficiently earlier than the effective U.S. filing date, Aug. 8, 2014, so that the particular month of publication is not in issue.).

Hook et al., "Magnetic Order," Solid State Physics, Ed. 2, Ch. 8, 1991, pp. 219-252. (Applicant points out, in accordance with MPEP 609.04(a), that the year of publication, 1991, is sufficiently earlier than the effective U.S. filing date, Aug. 8, 2014, so that the particular month of publication is not in issue.).

Hsu et al., "First-Principles Study for Low-Spin LaCoO3 with a Structurally Consistent Hubbard U," Physical Review B, vol. 79, Mar. 31, 2009, 9 pp.

Hsu et al., "Spin-State Crossover and Hyperfine interactions of Ferric Iron in MgSiO3 Perovskite," Physical Review Letters, vol. 106, Mar. 18, 2011, 4 pp.

McCurrie, "Chapter 3: The Structure and Properties of Alinco Permanent Magnet Alloys," Handbook of Ferromagnetic Materials, vol. 3, 1982, 82 pp. (Applicant points out, in accordance with MPEP 609.04(a), that the year of publication, 1982, is sufficiently earlier than the effective U.S. filing date, Aug. 8, 2014, so that the particular month of publication is not in issue.).

Kulik et al., "Density Functional Theory in Transition-Metal Chemistry: A Self-Consistent Hubbard U Approach," Physical Review Letters, vol. 97, Sep. 8, 2006, 4 pp.

Bae et al., "Cost Effective Parallel-Branch Spiral Inductor with Enhanced Quality Factor and Resonance Frequency," Electronics and Telecommunications Research Institute, 2007, pp. 87-90. (Applicant points out, in accordance with MPEP 609.04(a), that the year of publication, 2007, is sufficiently earlier than the effective U.S. filing date, Aug. 8, 2014, so that the particular month of publication is not in issue.).

Galanakis et al., "Spin-Polarization and Electronic Properties of Half-Metallic Heusler Alloys Calculated from First Principles," Journal of Physics: Condensed Matter, vol. 19, No. 31, Jul. 3, 2007 (online), 16 pp.

Al-Omari et al., "Magnetic Properties of Nanostructured CoSm/FeCo Films," Physical Review B, vol. 52, No. 5, Aug. 1, 1995, pp. 3441-3447.

Mazin et al., "Insulating Gap in FeO: Correlations and Covalency," Physical Review B, vol. 55, No. 19, May 15, 1997, pp. 12822-12825.

Solovyev et al., "Corrected Atomic Limit in the Local-Density Approximation and the Electronic Structure of d Impurities in Rb," Physical Review B, vol. 50, No. 23, Dec. 15, 1994, pp. 16861-16871.

Campos et al., "Evaluation of the Diffusion Coefficient of Nitrogen in Fe4N1-x Nitride Layers During Microwave Post-Discharge Nitriding," Applied Surface Science, vol. 249, 2005, pp. 54-59.

Issakov et al., "Fast Analytical Parameters Fitting of Planar Spiral Inductors," 2008 IEEE International Conference on Microwaves, Communications, Antennas and Electronic Systems, May 13-14, 2008, 10 pp.

Borchers et al., "Observation of Antiparallel Magnetic Order in Weakly Coupled Co/Cu Multilayers," Physical Review Letters, vol. 82, No. 13, Mar. 29, 1999, pp. 2796-2799.

Takahashi et al., "Structure and Magnetic Moment of $\alpha''$-Fe16N2 Compound Films: Effect of Co and H on Phase Formation (Invited)," Journal of Applied Physics, vol. 79, No. 8, Apr. 15, 1996, pp. 5564-5569.

(56) References Cited

OTHER PUBLICATIONS

Buschbeck et al., "Full Tunability of Strain Along the fcc-bcc Bain Path in Epitaxial Films and Consequences for Magnetic Properties," Physical Review Letters, vol. 103, Nov. 20, 2009, 4 pp.
Chakhalian et al., "Magnetism at the Interface Between Ferromagnetic and Superconducting Oxides," Nature Physics, vol. 2, Apr. 1, 2006, pp. 244-248.
Cui et al., "Phase Transformation and Magnetic Anisotropy of an Iron-Palladium Ferromagnetic Shape-Memory Alloy," Acta Materialia, vol. 52, No. 1, Jan. 5, 2004, 35-47.
Davies et al., "Anisotropy Dependence of Irreversible Switching in Fe/SmCo and FeNi/FePt Exchange Spring Magnet Films," Applied Physics Letters, vol. 86, No. 26, Jun. 27, 2005, 3 pp.
Herbst et al., "Neodymium-Iron-Boron Permanent Magnets," Journal of Magnetism and Magnetic Materials, vol. 100, Nos. 1-3, Nov. 1991, pp. 57-78.
Fidler et al., "Recent Developments in Hard Magnetic Bulk Materials," Journal of Physics: Condensed Matter, vol. 16, Jan. 23, 2004, pp. 455-470.
Haenl et al., "Room-Temperature Ferroelectricity in Strain SrTiO3," Nature, vol. 430, Aug. 12, 2004, pp. 758-761.
Hoppler et al., "Giant Superconductivity-Induced Modulation of the Ferromagnetic Magnetization in a Cuprate-Manganite Superlattice," Nature Materials, vol. 8, Apr. 2009, pp. 315-319.
Coey, "The Magnetization of Bulk α"-Fe16N2 (Invited)," Journal of Applied Physics, vol. 76, No. 19, Nov. 15, 1994, pp. 6632-6636.
Coey et al., "The Magnetization of α"-Fe16N2," Journal of Physics: Condensed Matter, vol. 6, 1994, pp. 23-28.
Coey, "Magic Moments in Magnetism," Physics World, vol. 6, No. 8, Aug. 1993, pp. 25-26.
Qiu et al., "Tuning the Crystal Structure and Magnetic Properties of FePt Nanomagnets," Advanced Materials, vol. 19, Jun. 6, 2007, pp. 1703-1706.
Wang, "FePt Magnetic Nanoparticles and Their Assembly for Future Magnetic Media," Proceedings of the IEEE, vol. 96, No. 11, Nov. 2008, pp. 1847-1863.
Qiu et al., "Monodispersed and Highly Ordered L10 FePt Nanoparticles Prepared in the Gas Phase," Applied Physics Letters, vol. 88, May 9, 2006, 3 pp.
Qiu et al., "In Situ Magnetic Field Alignment of Directly Ordered L10 FePt Nanoparticles," Applied Physics Letters, vol. 89, Nov. 29, 2006, 3 pp.
Liu et al., "High Energy Products in Rapidly Annealed Nanoscale Fe/Pt Multilayers," Applied Physics Letters, vol. 72, No. 4, Jan. 26, 1998, pp. 483-485.
Wang et al., "Fabrication of Fe16N2 Films by Sputtering Process and Experimental Investigation of Origin of Giant Saturation Magnetization in Fe16N2," IEEE Transactions on Magnetics, vol. 48, No. 5, May 2012, pp. 1710-1717.
Shi et al., "Diamond-Like Carbon Films Prepared by Facing-Target Sputtering," Thin Solid Films, vols. 420-421, Dec. 2, 2002, pp. 172-175.
Jiang et al., "Improving Exchange-Spring Nanocomposite Permanent Magnets," Applied Physics Letters, vol. 85, No. 22, Nov. 29, 2004, pp. 5293-5295.
Zhou et al., "Permanent-Magnet Properties of Thermally Processed FePt and FePt—Fe Multilayer Films," IEEE Transactions on Magnetics, vol. 38, No. 5, Sep. 2002, pp. 2802-2804.
MacLaren, "Role of Alloying on the Shape Memory Effect in Ni2MnGa," Journal of Applied Physics, vol. 91, No. 10, May 15, 2002, pp. 7801-7803.
Perdew et al., "Self-Interaction Correction to Density-Functional Approximations for Many-Electron Systems," Physical Review B, vol. 23, No. 10, May 15, 1981, pp. 5048-5079.
Dong et al., "Shape Memory and Ferromagnetic Shape Memory Effects in Single-Crystal Ni2MnGa Thin Films," Journal of Applied Physics, vol. 95, No. 5, Mar. 1, 2004, pp. 2593-2600.
Bland et al., "Ferromagnetic Moments in Metastable Magnetic Films by Spin-Polarized-Neutron Reflection," Physical Review Letters, vol. 58, No. 12, Mar. 23, 1987, pp. 1244-1247.
Bland et al., "Layer Selective Magnetometry in Ultrathin Magnetic Structures by Polarised Neutron Reflection," Journal of Magnetism and Magnetic Materials, vol. 165, Jun. 1997, pp. 46-51.
Ji et al., "Elemental Specific Study on FeCo—Au nanoparticles," Bulletin of the American Physical Society, APS Meeting 2010, vol. 55, No. 2, Mar. 15-19, 2010, 1 pp.
Coey, "Permanent Magnet Applications" Journal of Magnetism and Magnetic Materials, vol. 248, Apr. 24, 2002, pp. 441-456.
Zhang et al., "Polarizer angular dependence of spin transfer oscillation in magnetic tunnel junction," Bulletin of the American Physical Society, APS Meeting 2010, vol. 55, No. 2, Mar. 15-19, 2010, 1 pp.
Kronmüller et al., "Micromagnetic Analysis of the Magnetic Hardening Mechanisms in RE-Fe—B Magnets," Journal De Physique, C8, No. 12, Tome 49, Dec. 1988, 6 pp.
Tang et al., "Formation of Nanocrystalline Fe—N—B—Cu Soft Magnetic Ribbons," Journal of Non-Crystalline Solids, vol. 337, 2004, pp. 276-279.
Chen et al., "Modeling of On-Chip Differential Inductors and Transformers/Baluns," IEEE Transactions on Electron Devices, vol. 54, No. 2, Feb. 2007, pp. 369-371.
Ji et al., "N Site Ordering Effect on Partially Ordered Fe16N2," Applied Physics Letters, vol. 98, No. 9, Feb. 28, 2011, 3 pp.
Ji et al. "Epitaxial High Saturation Magnetization FeN Thin Films on Fe(001) Seeded GaAs(001) Single Crystal Wafer Using Facing Target Sputterings," Journal of Applied Physics, vol. 109, No. 7, Apr. 2011, 6 pp.
Ji et al., "Theory of Giant Saturation Magnetization in α"-Fe16N2: Role of Partial Localization in Ferromagnetism of 3d Transition Metals," New Journal of Physics, vol. 12, Jun. 17, 2010, 8 pp.
Cho, "The Best Refrigerator Magnet Ever?," Science/AAAD News, Science Now, Mar. 19, 2010, retrieved from the internet http://news.sciencemag.org/physics/2010/03/best-refrigerator-magnet-ever?sms_ss=email, 2pp.
Ji et al., "Perpendicular Magnetic Anisotropy and High Spin-Polarization Ratio in Epitaxial Fe-N Thin Films," Physical Review B, vol. 84, Dec. 14, 2011, 8 pp.
Ziegler, "SRIM—The Stopping and Range of Ions in Matter," retrieved from http://srim.org/ on Oct. 13, 2016, 4 pp.
Jiang et al., "FeN Foils by Nitrogen Ion-Implantation," Journal of Applied Physics, vol. 115, Mar. 12, 2014, 3 pp.
Jiang et al., "9 T High Magnetic Field Annealing Effects on FeN Bulk Sample," Journal of Applied Physics, vol. 115, Mar. 13, 2014, 3 pp.
"International Energy Outlook 2013," U.S. Energy Information Administration, Jul. 2013, 312 pp.
Croat, "Current Status of Rapidly Solidified Nd—Fe—B Permanent Magnets," IEEE Transactions on Magnetics, vol. 25, No. 5, Sep. 1989, pp. 3550-3554.
Perdew et al., "Generalized Gradient Approximation Made Simple," Physical Review Letters, vol. 77, No. 18, Oct. 28, 1996, pp. 3865-3868.
Guo et al., "A Broadband and Scalable Model for On-Chip Inductors Incorporating Substrate and Conductor Loss Effects," IEEE Radio Frequency Integrated Circuits Symposium, Jun. 12-14, 2005, pp. 593-596.
Jack, "The Occurrence and the Crystal Structure of α"-Iron Nitride; A New Type of Interstitial Alloy Formed During the Tempering of Nitrogen-Martensin," Proceedings of the Royal Society of London, vol. 208, Sep. 24, 1951, pp. 216-224.
Jack, "The Iron-Nitrogen System: The Preparation and the Crystal Structures of Nitrogen-Austenite (γ) and Nitrogen-Martensite (α')*," Proceedings of the Royal Society of London, Mar. 13, 1951, pp. 200-217.
Yamanaka et al., "Humidity Effects in Fe16N2 Fine Powder Preparation by Low-Temperature Nitridation," Journal of Solid State Chemistry, vol. 183, Aug. 4, 2010, pp. 2236-2241.
Nakajima et al., "Large Magnetization Induced in Single Crystalline Iron Films by High-Dose Nitrogen Implantation," Applied Physics Letters, vol. 56, No. 1, Jan. 1, 1990, pp. 92-94.
Nakajima et al., "Nitrogen-Implantation-Induced Transformation of Iron to Crystalline Fe16N2 in Epitaxial Iron Films," Applied Physics Letters, vol. 54, No. 25, Jun. 19, 1989, pp. 2536-2538.

(56) References Cited

OTHER PUBLICATIONS

Nakajima et al., "Formation of Ferromagnetic Iron Nitrides in Iron Thin Films by High-Dose Nitrogen Ion Implantation," Journal of Applied Physics, vol. 65, No. 11, Jun. 1, 1989, pp. 4357-4361.

Kaneko et al., "Fe—Cr—Co Ductile Magnet With (BH)max =8 MGOe," AIP Conference Proceedings, 1976, 2 pp. (Applicant points out, in accordance with MPEP 609.04(a), that the year of publication, 1976, is sufficiently earlier than the effective U.S. filing date, Aug. 8, 2014, so that the particular month of publication is not in issue.).

Strnat, "Modern Permanent Magnets for Applications in Electro-Technology," Proceedings of the IEEE, vol. 78, No. 6, Jun. 1990, pp. 923-946.

Strnat et al., "Bonded Rare Earth-Cobalt Permanent Magnets," Proceedings of the $12^{th}$ Rare Earth Research Conference, vol. 1, Jul. 18-22, 1976, 11 pp.

Strnat et al., "Rare Earth-Cobalt Permanent Magnets," Journal of Magnetism and Magnetic Materials, vol. 100, Nos. 1-3, Nov. 1991, pp. 38-56.

Yang et al., "The Effect of Strain Induced by Ag Underlayer on Saturation Magnetization of Partially Ordered Fe16N2 Thin Films," Applied Physics Letters, vol. 103, Dec. 12, 2013, 4 pp.

Lewis et al., "Perspectives on Permanent Magnetic Materials for Energy Conversion and Power Generation," Metallurgical and Materials Transactions A, vol. 44A, Jan. 2013, 19 pp.

Pauling, "The Nature of the Interatomic Forces in Metals," Physical Review, vol. 54, Dec. 1, 1938, pp. 899-904.

Davison et al., "Shock Compression of Solids," Physics Reports, vol. 55, No. 4, Apr. 1979, pp. 255-379.

Liu et al., "Nanocomposite Exchange-Spring Magnet Synthesized by Gas Phase Method: From Isotropic to Anisotropic," Applied Physics Letters, vol. 98, Jun. 3, 2011, 3 pp.

Liu et al., "Discovery of localized states of Fe 3D electrons in Fe16N2 and Fe8N films: an evidence of the existence of giant saturation magnetization," arXiv: 0909.4478, Sep. 2009, 13 pp.

Amato et al., "Exchange-Spring Behavior of Hard/Soft Magnetic Multilayers: Optimization Study of the Nanostructure," Physica B: Condensed Matter, vol. 275, Nos. 1-3, Jan. 2000, pp. 120-123.

Tijssens et al., "Towards an Improved Continuum Theory for Phase Transformations," Materials Science and Engineering, vol. 378, 2004, pp. 453-458.

Komuro et al., "Epitaxial Growth and Magnetic Properties of Fe16N2 Films with High Saturation Magnetic Flux Density (Invited)," Journal of Applied Physics, vol. 67, No. 9, May 1, 1990, pp. 5126-5130.

Brady et al., "Alloy Design of Intermetallics for Protective Scale Formation and for use as Precursors for Complex Ceramic Phase Surfaces," Intermetallics, vol. 12, Apr. 1, 2004, pp. 779-789.

Brady et al., "Pre-Oxidized and Nitrided Stainless Steel Alloy Foil for Proton Exchange Membrane Fuel Cell Bipolar Plates: Part 1. Corrosion, Interfacial Contact Resistance, and Surface Structure," Journal of Power Sources, vol. 195, Mar. 20, 2010, pp. 5610-5618.

"Annual Energy Outlook 2015, with projects to 2040," U.S. Energy Information Administration, Apr. 2015, 154 pp.

Kim et al., "New Magnetic Material Having Ultrahigh Magnetic Moment," Applied Physics Letters, vol. 20, No. 12, Jun. 15, 1972, pp. 492-494.

Zhuge et al., "Preparation and Property of Iron Nitrides by Ball Mill Method," Journal of Functional Materials, vol. 31, No. 5, 2000, pp. 471-472 (Abstract Only (on last page)) (Applicant points out, in accordance with MPEP 609.04(a), that the year of publication, 2000, is sufficiently earlier than the effective U.S. filing date, Aug. 8, 2014, so that the particular month of publication is not in issue.).

Takahashi et al., "Magnetic Moment of α"-Fe16N2 Films (Invited)," Journal of Applied Physics, vol. 76, No. 10, Nov. 15, 1994, pp. 6642-6647.

Takahashi et al., "Structure and Magnetic Moment of Fe16N2 Sputtered Film," Journal of Magnetism and Magnetic Materials, vol. 174, Nos. 1-2, Oct. 1, 1997, pp. 57-69.

Takahashi et al., "Magnetocrystalline Anisotropy for α'-Fe—C and α'-Fe—N Films," IEEE Transactions on Magnetics, vol. 37, No. 4, Jul. 2001, pp. 2179-2181.

Mühlethaler et al., "Improved Core-Loss Calculation for Magnetic Components Employed in Power Electronic Systems," IEEE Transactions on Power Electronics, vol. 27, No. 2, Feb. 2012, pp. 964-973.

Watanabe et al., "Perpendicular Magnetization of Epitaxial FePt(001) Thin Films with High Squareness and High Coercive Force," Japanese Journal of Applied Physics, vol. 35, No. 10A, Oct. 1, 1996, pp. 1264-1267.

Zhang et al., "Thermal Stability of Partially Ordered Fe16N2 Film on Non-Magnetic Ag Under Layer," Journal of Applied Physics, vol. 115, No. 17A, Mar. 20, 2014, 3 pp.

Uijttewaal et al., "Understanding the Phase Transitions of the Ni2MnGa Magnetic Shape Memory System from First Principles," Physical Review Letters, vol. 102, Jan. 23, 2009, 4 pp.

Pugaczowa-Michalska et al., "Electronic Structure and Magnetic Properties of Ni2MnGa1-xGex and Disordered Ni2MnSn Heusler Alloys," Acta Physica Polonica A, vol. 115, No. 1, Jan. 2009, pp. 241-243.

Brewer et al., "Magnetic and Physical Microstructure of Fe16N2 Films Grown Epitaxially on Si(001)," Journal of Applied Physics, vol. 81, No. 8, Apr. 15, 1997, pp. 4128-4130.

Abdellateef et al., "Magnetic Properties and Structure of the α"-Fe16N2 Films," Journal of Magnetism and Magnetic Materials, vol. 256, Nos. 1-3, Jan. 11, 2003, pp. 214-220.

Brewer et al., "Epitaxial Fe16N2 Films Grown on Si(001) by Reactive Sputtering," Journal of Applied Physics, vol. 79, No. 8, Apr. 15, 1996, pp. 5321-5323.

Van Genderen et al., "Atom Probe Analysis of the First Stage of Tempering of Iron-Carbon-Nitrogen Martensite," Zeitschrift Für Metallkunde, vol. 88, No. 5, May 1997, pp. 401-409.

Takahashi et al., "Impurity effect of carbon on structure and saturation magnetization of Fe—N films," Journal of Magnetism and Magnetic Materials, vol. 210, 2000, pp. 333-340.

Huang et al., "Magnetism of α'-FeN Magnetism and α"-(Fe16N2) Fe Nitrides," Journal of Magnetism and Magnetic Materials, vol. 135, 1994, pp. 226-230.

Huang et al., "Spin-Density Distribution in Ferromagnetic α"-Fe16N2," Physical Review B: Condensed Matter, vol. 51, No. 5, Feb. 1, 1995, pp. 3222-3225.

Cococcioni et al., "Linear Response Approach to the Calculation of the Effective Interaction Parameters in the LDA+U Method," Physical Review B, vol. 71, Jan. 18, 2005, 16 pp.

Takahashi, "Discovery of Fe16N2 with Giant Magnetic Moment and Its Future View," IEEE Translation Journal on Magnetics in Japan, vol. 6, No. 12, Dec. 1991, pp. 1024-1038.

Zhang et al., "Strain Effect of Multi layer FeN Structure on GaAs Substrate," Journal of Applied Physics, vol. 113, No. 17, Apr. 10, 2013, 3 pp.

"New Compound Opens Way to EV Magnet without Rare Earths," Nikkei.com Morning Edition, Mar. 4, 2011, 1 pp.

Coey et al., "Magnetic nitrides," Journal of Magnetism and Magnetic Materials, vol. 200, Mar. 10, 1999, pp. 405-420.

Tomioka et al., "Iron Nitride Powder Produced as Substitute for Rare Metal," Nikkei Technology, Mar. 7, 2011, 2 pp.

Ji et al., "Direct Observation of Giant Saturation Magnetization in Fe16N2," arXiv: 1211.0553, Nov. 2012, 27 pp.

Zheng et al., "Iron Nitride Thin Films Deposited by Chloride Assisted Plasma Enhanced Chemical Vapour Deposition: Facile Stoichiometry Control and Mechanism Study," Journal of Applied Physics D: Applied Physics, vol. 42, No. 18, Sep. 21, 2009, 9 pp.

Ji et al., "Strain Induced Giant Magnetism in Epitaxial Fe16N2 Thin Film," Applied Physics Letters, vol. 102, Feb. 21, 2013, 4 pp.

Lanska et al., "Composition and Temperature Dependence of the Crystal Structure of Ni—Mn—Ga Alloys," Journal of Applied Physics, vol. 95, No. 12, Jun. 15, 2004, pp. 8074-8078.

Takahashi et al., "Growth Mechanism of FeN Films by Means of an Atmospheric Pressure Halide Chemical Vapor Deposition," Materials Chemistry and Physics, vol. 65, Jan. 18, 2000. pp. 113-116.

(56) References Cited

OTHER PUBLICATIONS

Ji et al., "Growth and Depth-Dependence of Saturation Magnetization of Iron Nitride Thin Films on MgO Substrate," Spin, vol. 2, No. 1, Mar. 2012, 4 pp.
"Nanocrystalline soft magnetic material, FINEMET," Materials Magic, Hiatchi Metals, Apr. 2005, 12 pp.
Gutfleisch et al., "Magnetic Materials and Devices for the 21$^{st}$ Century: Stronger, Lighter, and More Energy Efficient," Advanced Materials, vol. 23, 2011, Dec. 15, 2010, pp. 821-842.
Ferguson et al., "The Tempering of Fe—C—N Martensite" Scripta Metallurgica, vol. 18, No. 11, Nov. 1984, pp. 1189-1194.
Brown et al., "The Crystal Structure and Phase Transitions of the Magnetic Shape Memory Compound Ni2MnGa," Journal of Physics: Condensed Matter, vol. 14, No. 43, Oct. 18, 2002, pp. 10159-10171.
Bruno, "Tight-Binding Approach to the Orbital Magnetic Moment and Magnetocrystalline Anisotropy of Transition-Metal Monolayers," Physical Review B, vol. 39, No. 1, Jan. 1, 1989, pp. 865-868.
Blöchl, "Projector Augmented-Wave Method," Physical Review B, vol. 50, No. 24, Dec. 15, 1994, pp. 17953-17979.
Entel et al., "Ab Initio Modeling of Martensitic Transformation (MT) in Magnetic Shape Memory Alloys," Journal of Magnetism and Magnetic Materials, vol. 310, Nov. 27, 2006, pp. 2761-2763.
Hohenberg et al., "Inhomogeneous Electron Gas," Physical Review, vol. 136, No. 3B, Nov. 9, 1964, pp. 864-871.
Sit et al., "Realistic Quantitative Descriptions of Electron Transfer Reactions: Diabatic Free-Energy Surfaces from First-Principles Molecular Dynamics," Physical Review Letters, vol. 97, Jul. 11, 2006, 4 pp.
Paseka et al., "Structure and Magnetic Properties of Ball-Milled Iron Nitride Powders," Journal of Alloys and Compounds, vol. 274, Mar. 10, 1998, pp. 248-253.
Giannozzi et al., "Quantum ESPRESSO: A Modular and Open-Source Software Project for Quantum Simulations of Materials," Journal of Physics: Condensed Matter, vol. 21, Sep. 1, 2009, pp. 1-19.
Tong et al., "Low Temperature Wafer Direct Bonding," Journal of Microelectromechanical Systems, vol. 3, No. 1, Mar. 1994, pp. 29-35.
Fan et al., "Ferromagnetism at the Interfaces of Antiferromagnetic FeRh Epilayers," Physical Review B, vol. 82, Nov. 12, 2010, 5 pp.
Yao et al., "Formation and Magnetic Properties of Fe16N2 Films Prepared by Ion-Beam-Assisted Deposition," Journal of Magnetism and Magnetic Materials, vol. 177-181, Jan. 1998, pp. 1291-1292.
Skomski et al., "Giant Energy Product in Nanostructured Two-Phase Magnets," Physical Review B, vol. 48, No. 21, Dec. 1, 1993, pp. 15812-15816.
Tickle et al., "Magnetic and Magnetomechanical Properties of Ni2MnGa," Journal of Magnetism and Magnetic Materials, vol. 195, No. 3, Jun. 11, 1999, pp. 627-638.
Sabiryanov et al., "Electronic Structure and Magnetic Properties of Hard/Soft Multilayers," Journal of Magnetism and Magnetic Materials, vol. 177-181, Pt. 2, Jan. 1998, pp. 989-990.
Metzger et al., "Magnetism of α"-Fe16N2 (Invited)," Journal of Applied Physics, vol. 76, No. 10, Nov. 15, 1994, pp. 6626-6631.
Kardonina et al., "Transformations in the Fe—N System," Metal Science and Heat Treatment, vol. 52, Nos. 9-10, Oct. 2010, pp. 5-15.
Chu et al., "Opportunities and Challenges for a Sustainable Energy Future," Nature, vol. 488, No. 7411, Aug. 16, 2012, pp. 294-303.
Blundell et al., "Polarized Neutron Reflection as a Probe of Magnetic Films and Multilayers," Physical Review B, vol. 46, No. 6, Aug. 1, 1992, pp. 3391-3400.
Zhang et al., "Energy Barriers and Hysteresis in Martensitic Phase Transformations," Acta Materialia, vol. 57, Jul. 17, 2009, pp. 4332-4352.
Kikkawa et al., "Particle Size Dependence in Low Temperature Nitridation Reaction for Fe16N2," Journal of Alloys and Compounds, vol. 449, Dec. 21, 2006 (online), pp. 7-10.
Okamoto et al., "Crystal Distortion and the Magnetic Moment of Epitaxially Grown α"-Fe16N2," Journal of Magnetism and Magnetic Materials, vol. 208, 2000, pp. 102-114.
Roy et al., "Depth Profile of Uncompensated Spins in an Exchange Bias System," Physical Review Letters, vol. 95, Jul. 21, 2005, 4 pp.
Uchida et al., "Magnetocrystalline Anisotropy Energies of Fe16N2 and Fe16C2," Journal of Magnetism and Magnetic Materials, vol. 310, 2007, pp. 1796-1798.
Wang et al., "Properties of a New Soft Magnetic Material," Nature, vol. 407, Sep. 14, 2000, pp. 150-151.
Dudarev et al., "Electron-Energy-Loss Spectra and the Structural Stability of Nickel Oxide: An LSDA+U Study," Physical Review B, vol. 57, No. 3, Jan. 15, 1998, pp. 1505-1509.
Kart et al., "DFT Studies on Structure, Mechanics and Phase Behavior of Magnetic Shape Memory Alloys: Ni2MnGa," Physica Status Solidi, vol. 205, No. 5, 2008, pp. 1026-1035.
Barman et al., "Structural and Electronic Properties of Ni2MnGa," Physical Review B, vol. 72, Nov. 8, 2005, 7 pp.
Atiq et al., "Preparation and the Influence of Co, Pt and Cr Additions on the Saturation Magnetization of α"-Fe16N2 Thin Films," Journal of Alloys and Compounds, vol. 479, Feb. 23, 2009, pp. 755-758.
Okamoto et al., "Characterization of Epitaxially Grown Fe—N Films by Sputter Beam Method," Journal of Applied Physics, vol. 79, No. 3, Feb. 1, 1996, pp. 1678-1683.
Sugita et al., "Magnetic and Mössbauer Studies of Single-Crystal Fe16N2 and Fe—N Martensite Films Epitaxially Grown by Molecular Beam Epitaxy (Invited)," Journal of Applied Physics, vol. 76, No. 10, Nov. 15, 1994, pp. 6637-6641.
Sugita et al., "Giant Magnetic Moment and Other Magnetic Properties of Epitaxially Grown Fe16N2 Single-Crystal Films (Invited)," Journal of Applied Physics, vol. 70, No. 10, Nov. 15, 1991, pp. 5977-5982.
Toops et al., "Pre-Oxidized and Nitrided Stainless Steel Alloy Foil for Proton Exchange Membrane Fuel Cell Bipolar Plates. Part 2: Single-Cell Fuel Evaluation of Stamped Plates," Journal of Power Sources, vol. 195, Mar. 19, 2010, pp. 5619-5627.
Klemmer et al., "Magnetic Hardening and Coercivity Mechanisms in L1 Ordered FePd Ferromagnets," Scripta Metallurgica et Materialia, vol. 33, Nos. 10-11, Dec. 1, 1995, pp. 1793-1805.
Ohtani et al., "Magnetic Properties of Mn—Al—C Permanent Magnet Alloys," IEEE Transactions on Magnetics, vol. MAG-13, No. 5, Sep. 1977, pp. 1328-1330.
Osaka et al., "A Soft Magnetic CoNiFe Film With High Saturation Magnetic Flux Density and Low Coercivity," Nature, vol. 392, Apr. 23, 1998, pp. 796-798.
Schrefl et al., "Exchange Hardening in Nano-Structured Two-Phase Permanent Magnets," Journal of Magnetism and Magnetic Materials, vol. 127, Jul. 12, 1993, pp. 273-277.
Kakeshita et al., "Effect of Magnetic Fields on Athermal and Isothermal Martensitic Transformations in Fe—Ni—Mn Alloys," Materials Transactions, vol. 34, No. 5, 1993, pp. 415-422.
Koyano et al., "Magnetization of α' Iron Nitride Produced Through the fcc→bct Martensitic Transformation in High Magnetic Field," Journal of Applied Physics, vol. 100, No. 3, Aug. 1, 2006, 5 pp.
Oku et al., "Small-Angle Polarized Neutron Scattering Study of Spherical Fe16N2 Nano-Particles for Magnetic Recording Tape," Physica B, vol. 404, Sep. 1, 2009, pp. 2575-2577.
Shimoda et al., "High-Energy Cast Pr—Fe—B Magnets," Journal of Applied Physics, vol. 64, No. 10, Nov. 15, 1988, pp. 5290-5292.
Weber et al., "Search for Giant Magnetic Moments in Ion-Beam-Synthesized α"-Fe16N2," Thin Solid Films, vol. 279, Nos. 1-2, Jun. 1996, pp. 216-220.
Takahashi et al., "Preparation of FeN Thin Films by Chemical Vapor Deposition Using a Chloride Source," Materials Letters, vol. 42, No. 6, Mar. 2000, pp. 380-382.
Stern et al., "Electronic and Structural Properties of Fe3Pd-Pt Ferromagnetic Shape Memory Alloys," Journal of Applied Physics, vol. 91, No. 10, May 15, 2002, pp. 7818-7820.
Qian et al., "NiZn Ferrite Thin Films Prepared by Facing Target Sputtering," IEEE Transactions Magnetics, vol. 33, No. 5, Sep. 1997, pp. 3748-3750.

(56) References Cited

OTHER PUBLICATIONS

Takahashi et al., "New Soft Magnetic Material of α'-Fe—C With High Bs," Journal of Magnetism and Magnetic Materials, vol. 239, Nos. 1-3, Feb. 1, 2002, pp. 479-483.
Inoue et al., "Enhancement of the Formation of Fe16N2 on Fe Films by Co Additions (Invited)," Journal of Applied Physics, vol. 76, No. 10, Nov. 15, 1994, pp. 6653-6655.
Tsuchiya et al., "Spin Transition in Magnesiowüstite in Earth's Lower Mantle," Physical Review Letters, vol. 96, May 18, 2006, 4 pp.
Liu et al., "Nucleation Behavior of Bulk Ni—Cu Alloy and Pure Sb in High Magnetic Fields," Journal of Crystal Growth, vol. 321, Mar. 2, 2011, pp. 167-170.
Liu et al., "Effects of High Magnetic Alloys on Solidification Microstructure of Al—Si Alloys," Journal of Material Science, vol. 46, 2011, pp. 1628-1634.
Okunev et al., "The Low-Temperature Electric Conductivity of YBaCuO and LaSrMnO Dielectric Films Obtained by a Pulsed Laser Sputter Deposition Technique," Technical Physics Letters, vol. 26, No. 10, May 6, 2000, pp. 903-906.
Anisimov et al., "Density-Functional Calculation of Effective Coulomb interactions in Metals," Physical Review B, vol. 43, No. 10, Apr. 1, 1991, pp. 7570-7574.
Anisimov et al., "Band-Structure Description of Mott Insulators (NiO, MnO, FeO, CoO)," Journal of Physics: Condensed Matter, vol. 2, No. 17, Apr. 30, 1990, pp. 3973-3987.
Anisimov et al., "First-Principles Calculations of the Electronic Structure and Spectra of Strongly Correlated Systems: the LDA+U Method," Journal of Physics: Condensed Matter, vol. 9, No. 4, Jan. 27, 1997, pp. 767-808.
Anisimov et al., "Band Theory and Mott Insulators: Hubbard U Instead of Stoner I," Physical Review B, vol. 44, No. 3, Jul. 15, 1991, pp. 943-954.
Campo et al., "Extended DFT+U+V Method With On-Site and Inter-Site Electronic Interactions," Journal of Physics: Condensed Matter, vol. 22, Jan. 19, 2010 (online), 12 pp.
Nimura et al., "Facing Targets Sputtering System for Depositing Co—Cr Perpendicular Magnetic Recording Media," Journal of Vacuum Science Technology, vol. 5, No. 1, Jan. 1987, pp. 109-110.
Lauter et al., "Highlights from the Magnetism Reflectometer at the SNS," Physica B, vol. 404, Sep. 1, 2009, pp. 2543-2546.
Godlevsky et al., "Soft Tetragonal Distortions in Ferromagnetic Ni2MnGa and Related Materials from First Principles," Physical Review B, vol. 63, Mar. 2, 2001, 5 pp.
Hou et al., "SmCo5/Fe Nanocomposites Synthesized from Reductive Annealing of Oxide Nanoparticles," Applied Physics Letters, vol. 91, Oct. 12, 2007, 3 pp.
Zhang et al., "Shift of the Eutectoid Point in the Fe—C Binary System by a High Magnetic Field," Journal of Physics D: Applied Physics, vol. 40, Oct. 19, 2007, pp. 6501-6506.
Pickett et al., "Reformulation of the LDA+U Method for a Local-Orbital Basis," Physical Review B, vol. 58, No. 3, Jul. 15, 1998, pp. 1201-1209.
Kohn et al., "Self-Consistent Equations Including Exchange and Correlation Effects," Physical Review, vol. 140, No. 4A, Nov. 15, 1965, pp. 1133-1138.
Gong et al., "Mechanically Alloyed Nanocomposite Magnets," Journal of Applied Physics, vol. 75, No. 10, May 15, 1994, pp. 6649-6651.
Li et al., "Effect of Assistant rf Field on Phase Composition of Iron Nitride Film Prepared by Magnetron Sputtering Process," Journal of Vacuum Science & Technology A, vol. 24, No. 1, Dec. 23, 2005 (online), pp. 170-173.
Liu et al., "Nanocrystalline Soft Magnetic Ribbon with α"-Fe16N2 Nanocrystallites Embedded in Amorphous Matrix," Journal of Magnetism and Magnetic Materials, vol. 320, Jun. 10, 2008, pp. 2752-2754.
Wallace et al., "Enhanced Fe Moment in Nitrogen Martensite and Fe16N2 (Invited)," Journal of Applied Physics, vol. 76, No. 10, Nov. 15, 1994, pp. 6648-6652.
Wang et al., "Searching, Fabricating and Characterizing Magnetic Materials With Giant Saturation Magnetization," TMRC 2014, Aug. 11, 2014, 2 pp.
Wang et al., "Growth, Structural, and Magnetic Properties of Iron Nitride Thin Films Deposited by dc Magnetron Sputtering," Applied Surface Science, vol. 220, May 20, 2003, pp. 30-39.
Yamamoto et al., "Formation of Fe16N2 in Deformed Iron by Ion Implantation Method," Proceedings of 1998 International Conference on Ion Implantation Technology, Jun. 22-26, 1998, 4 pp.
Rui et al., "In-Cluster-Structured Exchange-Coupled Magnets with High Energy Densities," Applied Physics Letters, vol. 89, Sep. 19, 2006, 3 pp.
Bao et al., "Synthesis and Properties of α"-Fe16N2 in Magnetic Particles," Journal of Applied Physics, vol. 75, No. 10, May 15, 1994, pp. 5870-5872.
Gao et al., "Exchange-coupling interaction and effective anisotropy in nanocomposite permanent materials," Chinese Science Bulletin, vol. 47, No. 14, Jul. 2002, 4 pp.
Grimsditch et al., "Exchange-spring systems: Coupling of hard and soft ferromagnets as measured by magnetization and Brillouin light scattering (Invited)," Journal of Applied Physics, vol. 85, No. 8, Apr. 15, 1999, 5 pp.
Stäblein, "Chapter 7: Hard Ferrites and Plastoferrites," Handbook of Ferromagnetic Materials, vol. 3, 1982, 162 pp. (Applicant points out, in accordance with MPEP 609.04(a), that the year of publication, 1982, is sufficiently earlier than the effective U.S. filing date, Aug. 8, 2014, so that the particular month of publication is not in issue.).
U.S. Appl. No. 15/129,439, by Wang et al., filed Sep. 27, 2016.
U.S. Appl. No. 62/107,733, by Wang et al., filed Jan. 26, 2015.
U.S. Appl. No. 62/107,748, by Wang et al., filed Jan. 26, 2015.
U.S. Appl. No. 62/035,245, by Wang et al., filed Aug. 8, 2014.
U.S. Appl. No. 62/035,230, by Wang et al., filed Aug. 8, 2014.
U.S. Appl. No. 62/107,700, by Wang et al., filed Jan. 26, 2015.
U.S. Appl. No. 61/840,221, by Wang et al., filed Jun. 27, 2013.
U.S. Appl. No. 61/840,248 by Wang et al., filed Jun. 27, 2013.
Notice of Allowance from U.S. Appl. No. 14/821,520, dated Nov. 2, 2017, 7 pp.
Huang et al., "Synthesis and characterization of Fe16N2 in bulk form," Journal of Applied Physics, vol. 75, No. 10, May 15, 1994, 3 pp.
Tsubakino et al., "Formation of Fe16N2 in iron sheet by an ion implantation method," Materials Chemistry and Physics 54, Elsevier, Jul. 1998, pp. 301-304.
Tsubakino et al., "High resolution transmission electron microscopic study of the formation of Fe16N2 in bulk iron by ion implantation," Material Letters 26, Elsevier, Feb. 1996, pp. 155-159.
Office Action from U.S. Appl. No. 14/821,520, dated Mar. 8, 2017, 12 pp.
Aoshima et al., "Preparation and Characterization of Fe—N Nanoparticles by Gas Flow Sputtering," Japanese Journal of Applied Physics, vol. 47, No. 1, Jan. 22, 2008, 4 pp.
Coey et al., "The Magnetization of a"-Fe16N2," Journal of Physics: Condensed Matter, vol. 6, 1994, pp. 23-28. Per MPEP 609.09(a), Applicant points out that the year of publication, 1994, is sufficiently earlier than the effective U.S. filing date, Aug. 5, 2015, and any foreign priority date so that the particular month of publication is not in issue.
Jack et al., "The Synthesis, Structure, and Characterization of a'Fe16N2", Journal of Applied Physics, American Institute of Physics, Nov. 15, 1994.
Turgut et al., "Thermal Plasma Synthesis of ?-FeN, Nanoparticles as Precursors for the Fe16N2 Synthesis by Annealing," ResearchGate, MRS Online Proceeding Library Jan. 2011, 7 pp.
Tanaka et al., "Study on Crystal Structure and Electronic State of Ferromagnetic Nitride a"-Fe16N2", Jan. 1, 1999.
Response to Office Action dated Mar. 8, 2017, from U.S. Appl. No. 14/821,520, filed Jun. 8, 2017, 13 pp.
Final Office Action from U.S. Appl. No. 14/821,520, dated Jul. 13, 2017, 11 pp.
Response to Office Action dated Jul. 13, 2017, from U.S. Appl. No. 14/821,520, filed Oct. 13, 2017, 13 pp.

(56) References Cited

OTHER PUBLICATIONS

Notice of Allowance from U.S. Appl. No. 14/821,520, dated Mar. 20, 2018, 6 pp.
Frisk et al., "A New Assessment of the Fe—N Phase Diagram," Calphad, vol. 11, No. 2, pp. 127-134, Pergamon Journals, 1987. Per MPEP 609.04(a), Applicant points out that the year of publication is sufficiently earlier than the effective U.S. filing date and any foreign priority date so that the particular month of publication is not in issue.
Watanabe et al., "A new challenge: grain boundary engineering for advanced materials by magnetic filed application," Journal of Materials Science, vol. 41, No. 23, Dec. 2006, 15 pp.

\* cited by examiner

US 10,072,356 B2

MAGNETIC MATERIAL INCLUDING $\alpha''$-$FE_{16}(N_xZ_{1-x})_2$ OR A MIXTURE OF $\alpha''$-$FE_{16}Z_2$ AND $\alpha''$-$FE_{16}N_2$, WHERE Z INCLUDES AT LEAST ONE OF C, B, OR O

CROSS-REFERENCE TO RELATED APPLICATIONS

This application claims the benefit of U.S. Provisional Patent Application No. 62/035,155, filed Aug. 8, 2014, the entire content of which is incorporated herein by reference.

GOVERNMENT RIGHTS

This invention was made with Government support under contract number DE-AR0000199 awarded by DOE, Office of ARPA-E. The Government has certain rights in this invention.

TECHNICAL FIELD

The disclosure relates to magnetic materials and techniques for forming magnetic materials.

BACKGROUND

Magnetic materials, including both hard magnetic materials and soft magnetic materials, are used in many different applications. Soft magnetic materials possess relatively low coercivity, while hard magnetic materials possess relatively high coercivity. For example, soft magnetic materials may be used in transformer and inductor cores, magnetic recording write heads, microwave devices, magnetic shielding, and the like. Hard magnetic materials may be used in electric motors, magnetic recording media, and the like.

SUMMARY

The disclosure describes magnetic materials including $\alpha''$-$Fe_{16}(N_xZ_{1-x})_2$ or $\alpha'$-$Fe_8(N_xZ_{1-x})$, or a mixture of at least one of $\alpha''$-$Fe_{16}N_2$ or $\alpha'$-$Fe_8N$ and at least one of $\alpha''$-$Fe_{16}Z_2$ or $\alpha'$-$Fe_8Z$, where Z includes at least one of C, B, or O, and x is a number greater than zero and less than one. In some examples, the magnetic material including $\alpha''$-$Fe_{16}(N_xZ_{1-x})_2$ or $\alpha'$-$Fe_8(N_xZ_{1-x})$, or a mixture of at least one of $\alpha''$-$Fe_{16}N_2$ or $\alpha'$-$Fe_8N$ and at least one of $\alpha''$-$Fe_{16}Z_2$ or $\alpha'$-$Fe_8Z$ may include a relatively high magnetic saturation. In addition, in some examples, the magnetic material including $\alpha''$-$Fe_{16}(N_xZ_{1-x})_2$ or $\alpha'$-$Fe_8(N_xZ_{1-x})$, or a mixture of at least one of $\alpha''$-$Fe_{16}N_2$ or $\alpha'$-$Fe_8N$ and at least one of $\alpha''$-$Fe_{16}Z_2$ or $\alpha'$-$Fe_8Z$ may include a relatively low coercivity.

In some examples, the magnetic material may include a multilayer structure that includes alternating layers of $\alpha''$-$Fe_{16}N_2$ or $\alpha'$-$Fe_8N$ and $\alpha''$-$Fe_{16}Z_2$ or $\alpha'$-$Fe_8Z$. In other examples, the magnetic material may include a mixture including $\alpha''$-$Fe_{16}N_2$ phase domains or $\alpha'$-$Fe_8N$ phase domains and $\alpha''$-$Fe_{16}Z_2$ phase domains or $\alpha'$-$Fe_8Z$ phase domains. In other examples, the magnetic material may include $\alpha''$-$Fe_{16}(N_xZ_{1-x})_2$ phase domains or $\alpha'$-$Fe_8(N_xZ_{1-x})$ phase domains, wherein x is greater than zero and less than one. By controlling the ratio of $\alpha''$-$Fe_{16}N_2$ or $\alpha'$-$Fe_8N$ phase domains and $\alpha''$-$Fe_{16}Z_2$ or $\alpha'$-$Fe_8Z$ phase domains, or the ratio of N atoms and Z atoms in $\alpha''$-$Fe_{16}(N_xZ_{1-x})_2$ or $\alpha'$-$Fe_8(N_xZ_{1-x})$, the coercivity of the magnetic material may be controlled.

Magnetic material including $\alpha''$-$Fe_{16}(N_xZ_{1-x})_2$ or a mixture of $\alpha''$-$Fe_{16}N_2$ and $\alpha''$-$Fe_{16}Z_2$ may be formed by any of a variety of techniques. Example techniques described herein include chemical vapor deposition (CVD), liquid phase epitaxy (LPE), sputtering, ion implantation, nitridizing and carbonizing a workpiece under an applied strain, milling an iron-containing powder in presence of nitrogen and carbon, a continuous casting, pressing, and quenching process, or the like. Other example techniques include molecular beam epitaxy (MBE) and low temperature epitaxy.

In some examples, the disclosure describes a magnetic material including at least one of an $\alpha''$-$Fe_{16}(N_xZ_{1-x})_2$ phase domain or an $\alpha'$-$Fe_8(N_xZ_{1-x})$ phase domain, wherein Z includes at least one of C, B, or O, and wherein x is a number greater than zero and less than one.

In some examples, the disclosure describes a magnetic material including at least one of an $\alpha''$-$Fe_{16}N_2$ phase domain or an or an $\alpha'$-$Fe_8N$ phase domain; and at least one of an $\alpha''$-$Fe_{16}Z_2$ phase domain or an $\alpha'$-$Fe_8Z$ phase domain, wherein Z includes at least one of C, B, or O.

In some examples, the disclosure describes methods for forming a magnetic material including at least one of an $\alpha''$-$Fe_{16}(N_xZ_{1-x})_2$ phase domain or an or an $\alpha'$-$Fe_8(N_xZ_{1-x})$ phase domain, wherein Z includes at least one of C, B, or O, and wherein x is a number greater than zero and less than one.

In some examples, the disclosure describes methods for forming a magnetic material including at least one of an $\alpha''$-$Fe_{16}N_2$ phase domain or an $\alpha'$-$Fe_8N$ phase domain; and at least one of an $\alpha''$-$Fe_{16}Z_2$ phase domain or an $\alpha'$-$Fe_8Z$ phase domain, wherein Z includes at least one of C, B, or O.

The details of one or more examples are set forth in the accompanying drawings and the description below. Other features, objects, and advantages will be apparent from the description and drawings, and from the claims.

BRIEF DESCRIPTION OF DRAWINGS

The summary, as well as the following detailed description, is further understood when read in conjunction with the appended drawings. For the purpose of illustrating the disclosure, there are shown in the drawings examples; however, the disclosure is not limited to the specific techniques, compositions, and devices disclosed. In addition, the drawings are not necessarily drawn to scale.

DETAILED DESCRIPTION

Figure 1:
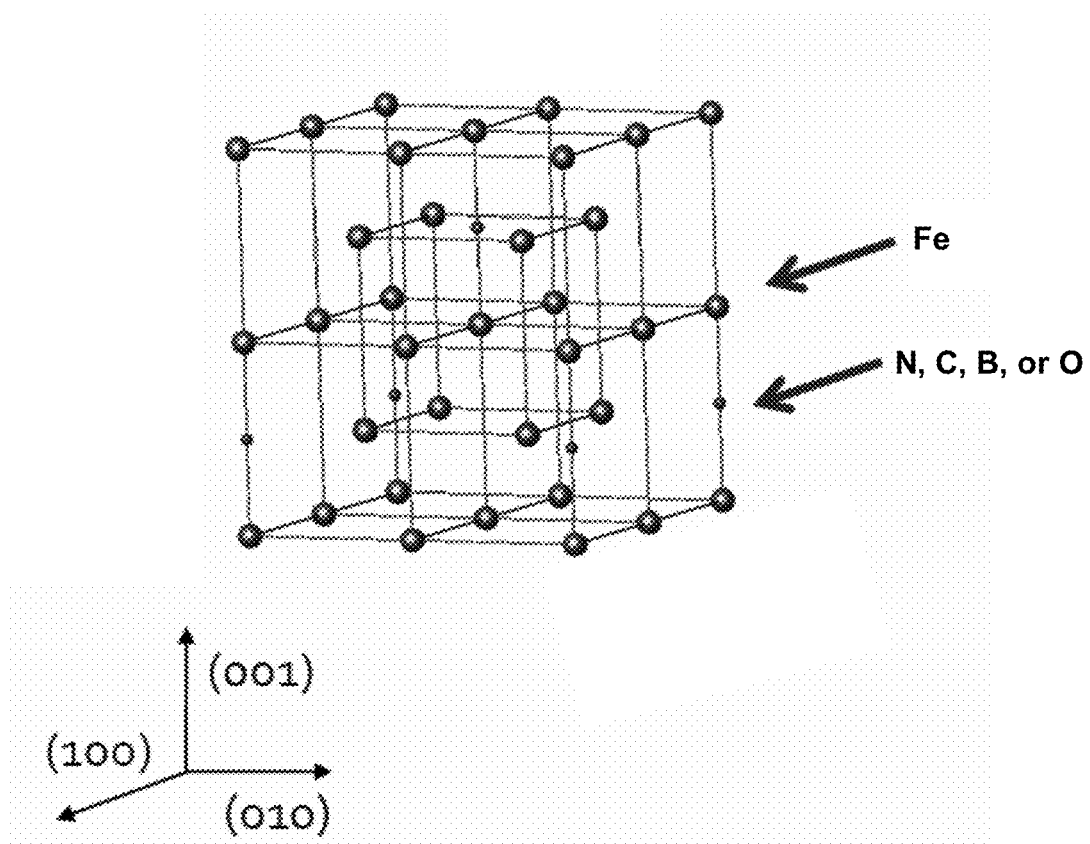
FIG. 1 is a conceptual diagram that shows an $\alpha''$-$Fe_{16}X_2$ unit cell, where X is at least one of N, C, B, or O.

The present disclosure may be understood more readily by reference to the following detailed description taken in connection with the accompanying figures and examples, which form a part of this disclosure. It is to be understood that this disclosure is not limited to the specific devices, methods, applications, conditions or parameters described and/or shown herein, and that the terminology used herein is for the purpose of describing particular examples and is not intended to be limiting of the claims. When a range of values is expressed, another example includes from the one particular value and/or to the other particular value. Similarly, when values are expressed as approximations, by use of the antecedent "about," it will be understood that the particular value forms another example. All ranges are inclusive and combinable. Further, a reference to values stated in a range includes each and every value within that range.

It is to be appreciated that certain features of the disclosure which are, for clarity, described herein in the context of separate examples, may also be provided in combination in a single example. Conversely, various features of the disclosure that are, for brevity, described in the context of a single example, may also be provided separately or in any subcombination.

The disclosure describes magnetic materials including $\alpha''\text{-Fe}_{16}(N_xZ_{1-x})_2$ or $\alpha'\text{-Fe}_8(N_xZ_{1-x})$, or a mixture of at least one of $\alpha''\text{-Fe}_{16}N_2$ or $\alpha'\text{-Fe}_8N$ and at least one of $\alpha''\text{-Fe}_{16}Z_2$ or $\alpha'\text{-Fe}_8Z$, where Z includes at least one of C, B, or O, and x is a number greater than zero and less than one. In some examples, the magnetic material including $\alpha''\text{-Fe}_{16}(N_xZ_{1-x})_2$ or $\alpha'\text{-Fe}_8(N_xZ_{1-x})$, or a mixture of at least one of $\alpha''\text{-Fe}_{16}N_2$ or $\alpha'\text{-Fe}_8N$ and at least one of $\alpha''\text{-Fe}_{16}Z_2$ or $\alpha'\text{-Fe}_8Z$, may include a relatively high magnetic saturation, such as greater than about 219 emu/gram, greater than about 242 emu/gram, or greater than about 250 emu/gram. In addition, in some examples, the magnetic material including $\alpha''\text{-Fe}_{16}(N_xZ_{1-x})_2$ or $\alpha'\text{-Fe}_8(N_xZ_{1-x})$, or a mixture of at least one of $\alpha''\text{-Fe}_{16}N_2$ or $\alpha'\text{-Fe}_8N$ and at least one of $\alpha''\text{-Fe}_{16}Z_2$ or $\alpha'\text{-Fe}_8Z$ may include a relatively low coercivity. For example, the coercivity of the magnetic material may be less than about 10 Oerstads. In some examples, magnetic materials with a coercivity of less than about 10 Oerstads may be referred to as soft magnetic materials. The combination of relatively high magnetic saturation and relatively low coercivity may make the magnetic material an attractive soft magnetic material for use in transformer and inductor cores, magnetic recording media write heads, microwave devices, magnetic shielding, and the like. In some examples, the magnetic material including $\alpha''\text{-Fe}_{16}(N_xZ_{1-x})_2$ or $\alpha'\text{-Fe}_8(N_xZ_{1-x})$, or a mixture of at least one of $\alpha''\text{-Fe}_{16}N_2$ or $\alpha'\text{-Fe}_8N$ and at least one of $\alpha''\text{-Fe}_{16}Z_2$ or $\alpha'\text{-Fe}_8Z$ also may possess high magnetic permeability, high frequency response, and the like.

For purposes of description only, the following description will primarily refer to $\alpha''\text{-Fe}_{16}(N_xZ_{1-x})_2$ or a mixture of $\alpha''\text{-Fe}_{16}N_2$ and $\alpha''\text{-Fe}_{16}Z_2$. However, those of skill in the art will recognize that similar principles and examples may apply to and include $\alpha'\text{-Fe}_8(N_xZ_{1-x})$ or a mixture of $\alpha'\text{-Fe}_8N$ and $\alpha'\text{-Fe}_8Z$, or mixtures between these different phases.

In some examples, the magnetic material may include a multilayer structure that includes alternating layers of $\alpha''\text{-Fe}_{16}N_2$ and $\alpha''\text{-Fe}_{16}Z_2$, where Z includes at least one of C, B, or O. In other examples, the magnetic material may include a mixture including $\alpha''\text{-Fe}_{16}N_2$ phase domains and $\alpha''\text{-Fe}_{16}Z_2$ phase domains. In other examples, the magnetic material may include $\alpha''\text{-Fe}_{16}(N_xZ_{1-x})_2$ phase domains, wherein x is greater than zero and less than one. By controlling the ratio of $\alpha''\text{-Fe}_{16}N_2$ phase domains and $\alpha''\text{-Fe}_{16}Z_2$ phase domains or the ratio of N atoms and Z atoms in $\alpha''\text{-Fe}_{16}(N_xZ_{1-x})_2$, the coercivity of the magnetic material may be controlled.

For example, $\alpha''\text{-Fe}_{16}N_2$ may have a magnetic easy axis lying along the <001> axis, while $\alpha''\text{-Fe}_{16}Z_2$ may have an easy axis lying perpendicular to the <001> axis, such as in the <010> axis or the <100> axis. Because the easy axes are perpendicular, the magnetic anisotropy of $\alpha''\text{-Fe}_{16}N_2$ and $\alpha''\text{-Fe}_{16}Z_2$ may cancel each other when mixed together, reducing the coercivity of the magnetic material including a mixture of $\alpha''\text{-Fe}_{16}N_2$ and $\alpha''\text{-Fe}_{16}Z_2$. Similarly, in $\alpha''\text{-Fe}_{16}(N_xZ_{1-x})_2$, N atoms and Z atoms may distort the iron crystalline structure in opposite ways, such that mixing N atoms and Z atoms reduces magnetocrystalline anisotropy and coercivity of the magnetic material compared to $\alpha''\text{-Fe}_{16}N_2$ alone or $\alpha''\text{-Fe}_{16}Z_2$ alone. Both $\alpha''\text{-Fe}_{16}N_2$ and $\alpha''\text{-Fe}_{16}Z_2$ possess relatively high saturation magnetizations, such that a material including a mixture of $\alpha''\text{-Fe}_{16}N_2$ and $\alpha''\text{-Fe}_{16}Z_2$ may have relatively high saturation magnetization, regardless of the ratio of $\alpha''\text{-Fe}_{16}N_2$ to $\alpha''\text{-Fe}_{16}Z_2$.

Magnetic material including $\alpha''\text{-Fe}_{16}(N_xZ_{1-x})_2$ or a mixture of $\alpha''\text{-Fe}_{16}N_2$ and $\alpha''\text{-Fe}_{16}Z_2$ may be formed by any of a variety of techniques. Example techniques described herein include chemical vapor deposition (CVD), liquid phase epitaxy (LPE), sputtering, ion implantation, nitridizing and carbonizing a workpiece under an applied strain, milling an iron-containing powder in presence of nitrogen and carbon, a continuous casting, pressing, and quenching process, or the like. Other example techniques include molecular beam epitaxy (MBE) and low temperature epitaxy.

FIG. 1 is a conceptual diagram that shows an $\alpha''$-$Fe_{16}X_2$ unit cell. As shown in FIG. 1, in the $\alpha''$-$Fe_{16}X_2$ phase, the X atoms are aligned along the (002) (iron) crystal planes. The X atoms may include at least one of N, C, B, or O. When all the X atoms are N atoms, the iron nitride unit cell is distorted such that the length of the unit cell along the <001> axis is approximately 6.28 angstroms (Å) while the length of the unit cell along the <010> and <100> axes is approximately 5.72 Å. The $\alpha''$-$Fe_{16}N_2$ unit cell may be referred to as a bct unit cell when in the strained state. When the $\alpha''$-$Fe_{16}N_2$ unit cell is in the strained state, the <001> axis may be referred to as the c-axis of the unit cell. The c-axis may be the magnetic easy axis of the $\alpha''$-$Fe_{16}N_2$ unit cell. In other words, $\alpha''$-$Fe_{16}N_2$ crystals exhibit magnetic anisotropy.

$\alpha''$-$Fe_{16}N_2$ has high saturation magnetization and magnetic anisotropy constant. The high saturation magnetization and magnetic anisotropy constants result in a magnetic energy product that may be higher than rare earth magnets. Additionally, iron and nitrogen are abundant elements, and thus are relatively inexpensive and easy to procure.

Calculations show that the magnetocrystalline anisotropy of $\alpha''$-$Fe_{16}N_2$ may be about $1.6 \times 10^7$ erg/cm$^3$. $\alpha''$-$Fe_{16}N_2$ also has a relatively high theoretical magnetic saturation moment of about 2.3 Bohr magnetons per iron atom $\mu_B$/Fe.

Similarly, when X includes at least one of C, B, or O (Z atoms) $\alpha''$-$Fe_{16}Z_2$ may be a hard magnetic material when the Z atoms are ordered within the iron crystal lattice. Similar to $\alpha''$-$Fe_{16}N_2$, the Z atoms (C, B, or O) in ordered $\alpha''$-$Fe_{16}Z_2$ may be positioned at interstitial sites within the iron crystal. However, in ordered $\alpha''$-$Fe_{16}Z_2$, the lattice parameters may be different than the lattice parameters of $\alpha''$-$Fe_{16}N_2$. For example, while not wishing to be bound by any theory, the presence of carbon atoms is expected to reduce the distance between the C atoms and the surrounding Fe atoms lying in the (002) (iron) crystal planes from 3.74 Angstroms to 3.68 Angstroms. This is expected to increase p-d mixing, which is expected to increase bandwidth and lower the density of states. This is expected to reduce the magnetocrystalline anisotropy of $\alpha''$-$Fe_{16}C_2$ to a negative value. Similar results may be expected for B and O atoms.

Ordered $\alpha''$-$Fe_{16}Z_2$, such as when Z is carbon (C), may exhibit magnetocrystalline anisotropy with a magnetic easy axis lying in the a-b plane (e.g., [100]; perpendicular to the c-axis). Hence, the direction of magnetocrystalline anisotropy in $\alpha''$-$Fe_{16}Z_2$ may be substantially perpendicular to the direction of magnetocrystalline anisotropy in $\alpha''$-$Fe_{16}N_2$. Calculations show that the magnetocrystalline anisotropy in ordered $\alpha''$-$Fe_{16}C_2$ may be about $-1.4 \times 10^7$ erg/cm$^3$. $\alpha''$-$Fe_{16}C_2$ also has a relatively high theoretical magnetic saturation moment of about 2.1$\mu_B$/Fe.

Hence, when ordered $\alpha''$-$Fe_{16}C_2$ is mixed in predetermined quantities with $\alpha''$-$Fe_{16}N_2$ with c-axes of the respective $\alpha''$-$Fe_{16}C_2$ and $\alpha''$-$Fe_{16}N_2$ crystals oriented in substantially the same direction, the magnetocrystalline anisotropies of $\alpha''$-$Fe_{16}C_2$ and $\alpha''$-$Fe_{16}N_2$ may substantially cancel. This may result in a material with a magnetocrystalline anisotropy value of near zero (depending on the volume ratio of $\alpha''$-$Fe_{16}C_2$ to $\alpha''$-$Fe_{16}N_2$), while providing a theoretical magnetic saturation moment of, e.g., about 2.2$\mu_B$/Fe (the average of the theoretical magnetic saturation moments of $\alpha''$-$Fe_{16}N_2$ and $\alpha''$-$Fe_{16}C_2$). For example, a magnetic material including a volume ratio of $\alpha''$-$Fe_{16}N_2$ to $\alpha''$-$Fe_{16}C_2$ of about 4.667:5.333 may have a magnetic anisotropy of about 0 and a theoretical magnetic saturation moment of about 2.2$\mu_B$/Fe. In this way, a mixture of predetermined volumes of $\alpha''$-$Fe_{16}N_2$ domains and $\alpha''$-$Fe_{16}C_2$ domains may produce a magnetic material with a magnetocrystalline anisotropy value of near zero and a relatively high magnetic saturation moment. Similar results may be expected when B, O, or both are substituted for C, based on the similar atomic radii of C, B, and O.

Figure 2:
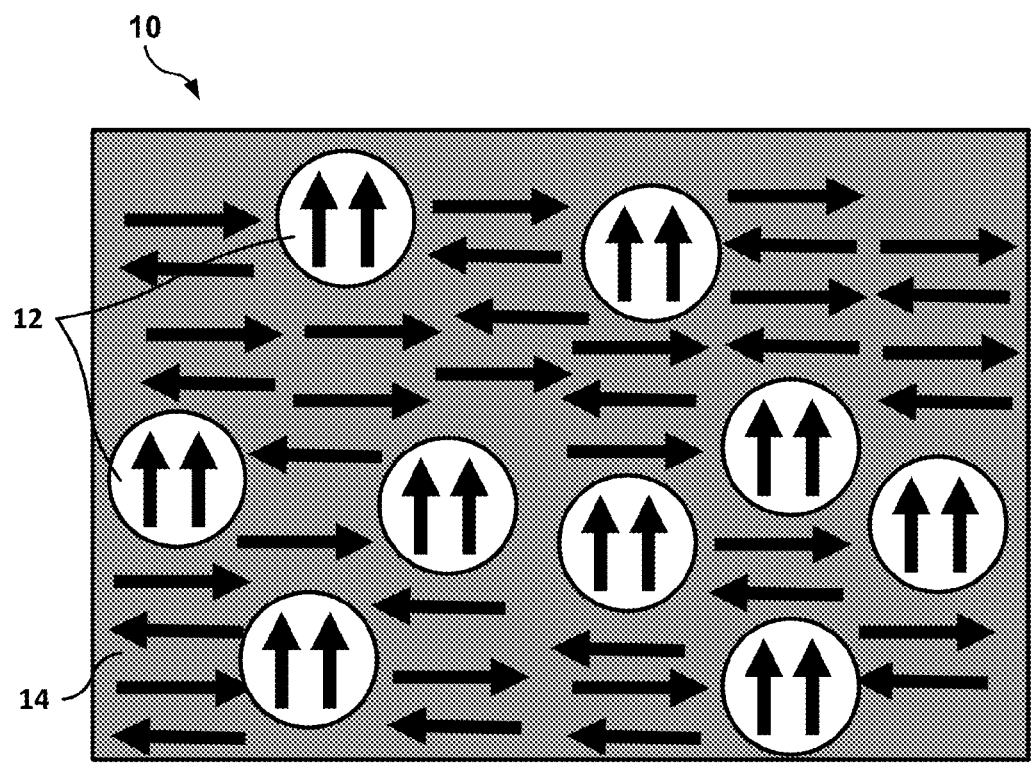
FIG. 2 is a conceptual diagram illustrating a magnetic material including domains of $\alpha''$-$Fe_{16}N_2$ and domains of $\alpha''$-$Fe_{16}Z_2$, where Z includes at least one of C, B, or O.

In some examples, the resulting material may be similar to that shown in FIG. 2. FIG. 2 is a conceptual diagram illustrating a soft magnetic material 10 including domains of $\alpha''$-$Fe_{16}N_2$ 12 and domains of $\alpha''$-$Fe_{16}Z_2$ 14, where Z includes at least one of C, B, or O. In some examples, discrete domains of $\alpha''$-$Fe_{16}N_2$ 12 may be present, along with discrete domains of $\alpha''$-$Fe_{16}Z_2$ 14. The easy axes of the domains of $\alpha''$-$Fe_{16}N_2$ 12 are illustrated as being oriented substantially vertically in FIG. 2, while the easy axes of the domains of $\alpha''$-$Fe_{16}Z_2$ domains are illustrated as being oriented substantially horizontally in FIG. 2. When domains of $\alpha''$-$Fe_{16}N_2$ 12 and domains of $\alpha''$-$Fe_{16}Z_2$ 14 are present in predetermined volumes (e.g., about 4.667:5.333), this may lead the magnetocrystalline anisotropy of similar magnitudes and opposite signs to annihilate each other, resulting in a magnetic material 10 with high saturation magnetization and low magnetocrystalline anisotropy.

In other examples, rather than all of the respective domains of $\alpha''$-$Fe_{16}N_2$ 12 having their magnetic easy axes lying in substantially the same direction, the respective easy axes of the respective domains of $\alpha''$-$Fe_{16}N_2$ 12 may be substantially randomly distributed. Similarly, the respective easy axes of the respective domains of $\alpha''$-$Fe_{16}Z_2$ 14 may be substantially randomly distributed. This also may lead to a magnetic material 10 with high saturation magnetization and low magnetocrystalline anisotropy.

In some examples, magnetic material 10 including a mixture of domains of $\alpha''$-$Fe_{16}N_2$ 12 and domains of $\alpha''$-$Fe_{16}Z_2$ 14 may not include only domains of $\alpha''$-$Fe_{16}N_2$ 12 and domains of $\alpha''$-$Fe_{16}Z_2$ 14. For example, magnetic material 10 may include at least one $Fe_{16}(N_xZ_{1-x})_2$ phase domain in addition to domains of $\alpha''$-$Fe_{16}N_2$ 12 and domains of $\alpha''$-$Fe_{16}Z_2$ 14. The size of the domains may be between about 1 nm and about 100 micrometers. The average domain size distribution may influence the permeability of the material as evidenced by the slope of the hysteresis loop. In some examples, magnetic material 10 including a mixture of domains of $\alpha''$-$Fe_{16}N_2$ 12 and domains of $\alpha''$-$Fe_{16}Z_2$ 14 may include other iron phases, other iron nitride phases, other iron carbide phases, or other phases including other constituents (e.g., dopants or impurities) present in the magnetic material.

In some examples, the structure shown in FIG. 2 may be formed by annealing a material including a mixture of iron, carbon, and nitrogen in selected ratios to convert the mixture of iron, carbon, and nitrogen to domains of $\alpha''$-$Fe_{16}N_2$ 12 and domains of $\alpha''$-$Fe_{16}Z_2$ 14. In other examples, the structure shown in FIG. 2 may be formed by first forming particles including $\alpha''$-$Fe_{16}N_2$ and particles including $\alpha''$-$Fe_{16}Z_2$ (e.g., using milling), then consolidating the particles to form the material including domains of $\alpha''$-$Fe_{16}N_2$ 12 and domains of $\alpha''$-$Fe_{16}Z_2$ 14. Further details regarding example techniques for forming the material illustrated in FIG. 2 will be described below.

In some examples, rather than including discrete domains of $\alpha''$-$Fe_{16}N_2$ and $\alpha''$-$Fe_{16}Z_2$, a material may include one or more crystals of $\alpha''$-$Fe_{16}(N_xZ_{1-x})_2$, where Z includes at least one of C, B, or O, and x is a number greater than 0 and less than 1. In these examples, rather than forming discrete domains, the iron, nitrogen, and Z atoms form a crystalline structure in which some interstitial locations are filled by nitrogen atoms and some interstitial locations are filled by Z atoms. For example, FIG. 1 illustrates an example $\alpha''\text{-}Fe_{16}X_2$ unit cell, as described above. The unit cell in FIG. 1 illustrates five X atoms (1 X atom is fully in the unit cell, and 4 X atoms are partially in the unit cell). In $\alpha''\text{-}Fe_{16}(N_xZ_{1-x})_2$ at least some of the X atoms may be N atoms, and at least some of the X atoms may be Z (C, B, or O) atoms. Although $\alpha''\text{-}Fe_{16}(N_xZ_{1-x})_2$ may not include some N atoms and some Z atoms in each unit cell (e.g., some unit cells may include only N atoms and some unit cells may include only Z atoms), when averaged over the volume of the soft magnetic material, the ratio of Fe to N to Z atoms may be expressed by the chemical formula $Fe_{16}(N_xZ_{1-x})_2$, where x is greater than 0 and less than 1. In some examples, X may be about 0.5 or about 0.4667.

In some examples, the magnetic material including $Fe_{16}(N_xZ_{1-x})_2$ may not include only $Fe_{16}(N_xZ_{1-x})_2$. For example, the magnetic material may include at least one $\alpha''\text{-}Fe_{16}N_2$ phase domain or at least one $\alpha''\text{-}Fe_{16}Z_2$ domain in addition to at least one $Fe_{16}(N_xZ_{1-x})_2$ phase domain. In some examples, the magnetic material including $Fe_{16}(N_xZ_{1-x})_2$ may include other iron phases, other iron nitride phases, other iron carbide phases, or other phase including other constituents (e.g., dopants or impurities) present in the magnetic material.

In some examples, a magnetic material including at least one $\alpha''\text{-}Fe_{16}(N_xZ_{1-x})_2$ phase domain may include at least about 35 volume percent $\alpha''\text{-}Fe_{16}(N_xZ_{1-x})_2$ phase domain(s). In other examples, the magnetic material may include at least about 40 volume percent, at least about 50 volume percent, or at least about 60 volume percent $\alpha''\text{-}Fe_{16}(N_xZ_{1-x})_2$ phase domain(s). Similarly a magnetic material including a mixture of $\alpha''\text{-}Fe_{16}N_2$ and $\alpha''\text{-}Fe_{16}Z_2$ may include at least about 35 volume percent of the combination of $\alpha''\text{-}Fe_{16}N_2$ and $\alpha''\text{-}Fe_{16}Z_2$ phase domains. In other examples, the magnetic material may include at least about 40 volume percent, at least about 50 volume percent, or at least about 60 volume percent of the combination of $\alpha''\text{-}Fe_{16}N_2$ and $\alpha''\text{-}Fe_{16}Z_2$ phase domains.

In some examples, the magnetic material including $Fe_{16}(N_xZ_{1-x})_2$ or a mixture of $\alpha''\text{-}Fe_{16}N_2$ and $\alpha''\text{-}Fe_{16}Z_2$ may have a saturation magnetization of at least about 219 emu/gram, which is the saturation magnetization of pure iron. In some examples, the magnetic material including $Fe_{16}(N_xZ_{1-x})_2$ or a mixture of $\alpha''\text{-}Fe_{16}N_2$ and $\alpha''\text{-}Fe_{16}Z_2$ may have a saturation magnetization of at least about 242 emu/gram, which is the saturation magnetization of $Fe_{65}Co_{35}$. In some examples, the magnetic material including $Fe_{16}(N_xZ_{1-x})_2$ or a mixture of $\alpha''\text{-}Fe_{16}N_2$ and $\alpha''\text{-}Fe_{16}Z_2$ may have a saturation magnetization of at least about 250 emu/gram.

Figure 3:
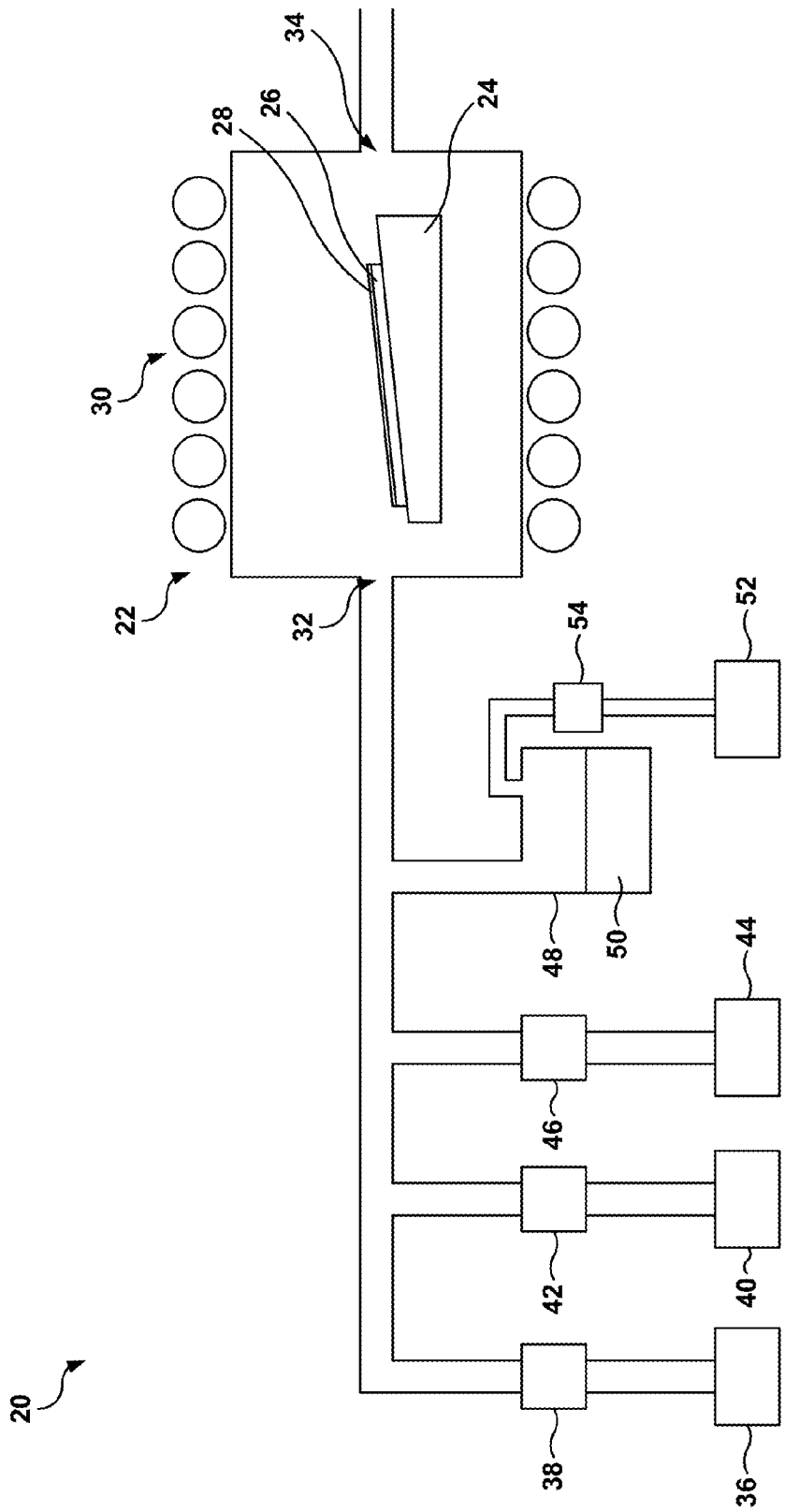
FIG. 3 is a conceptual and schematic diagram illustrating an example chemical vapor deposition system for forming a magnetic material including at least one layer including $\alpha''$-$Fe_{16}(N_xZ_{1-x})_2$ or a mixture of $\alpha''$-$Fe_{16}N_2$ and $\alpha''$-$Fe_{16}Z_2$, where Z includes at least one of C, B, or O.

In some examples, the magnetic material including $Fe_{16}(N_xZ_{1-x})_2$ or a mixture of $\alpha''\text{-}Fe_{16}N_2$ and $\alpha''\text{-}Fe_{16}Z_2$ may have a magnetic coercivity of less than or equal to about 10 Oerstads. In some examples, the magnetic material including $\alpha''\text{-}Fe_{16}(N_xZ_{1-x})_2$ or a mixture of $\alpha''\text{-}Fe_{16}N_2$ and $\alpha''\text{-}Fe_{16}Z_2$ also may possess high magnetic permeability, high frequency response, or the like In some examples, the magnetic material including $Fe_{16}(N_xZ_{1-x})_2$ or a mixture of $\alpha''\text{-}Fe_{16}N_2$ and $\alpha''\text{-}Fe_{16}Z_2$ may be formed using chemical vapor deposition (CVD). FIG. 3 is a conceptual and schematic diagram illustrating an example CVD system 20 for forming a magnetic material including $\alpha''\text{-}Fe_{16}(N_xZ_{1-x})_2$ or a mixture of $\alpha''\text{-}Fe_{16}N_2$ and $\alpha''\text{-}Fe_{16}Z_2$, where Z includes at least one of C, B, or O. In particular, CVD system 20 may be used to form a coating including iron, nitrogen, and at least one of carbon, boron, or oxygen, which then may be annealed to form a magnetic material including $\alpha''\text{-}Fe_{16}(N_xZ_{1-x})_2$ or a mixture of $\alpha''\text{-}Fe_{16}N_2$ and $\alpha''\text{-}Fe_{16}Z_2$.

System 20 includes a CVD chamber 22, which may enclose a susceptor 24. A substrate 26 is held by susceptor 24, and coating 28 is formed over at least a portion of substrate 26. CVD chamber 22 may include, for example, quartz or another refractory material. In some examples, CVD chamber 22 may be formed of a material that is substantially transparent to radio frequency (RF) magnetic energy.

In some examples, CVD chamber 22 is at least partially surrounded by RF induction coils 30. RF induction coils 30 may be electrically connected to an RF source (not shown in FIG. 3), which causes an alternating electrical current at RF to flow through RF induction coils 30. In some examples, the RF magnetic field generated by RF induction coils 30 may be absorbed by susceptor 24, which converts the RF energy to heat. This heats substrate 46. Hence, in some examples, susceptor 24 may include graphite or another material that absorbs RF energy of the frequency generated by RF induction coils 30.

In some examples, susceptor 24 may be shaped or oriented to position substrate 26 at an incline with respect to inlet 32. Positioning substrate 26 at an incline with respect to inlet 32 may reduce or substantially eliminate downstream depletion, which is a phenomena in which downstream portions of substrate 46 are coated with a thinner coating than upstream portions of substrate 26 due to depletion of reactants from the coating gas as the coating gas flows along a substantially horizontal substrate 26.

In some examples, rather than including a susceptor 24 heated by RF induction coils 30, CVD chamber 22 may be heated such that an entire volume of CVD chamber 22 is heated. For example, CVD chamber 22 may be disposed in a furnace, or CVD chamber 22 may be formed of a material that absorbs RF energy and heats the volume of CVD chamber 22.

Substrate 26 may include any material on which coating 28 may be formed. For example, substrate 26 may include a semiconductor, such as silicon, GaAs, InGaAs, or the like. In other examples, the substrate may include another material, such as a glass; a high temperature polymer; SiC; MgO; $SiO_2$ (e.g., a layer of $SiO_2$ on a Si or other semiconductor substrate); a metal layer, such as Fe, Al, Cu; or the like.

In some examples, substrate 26 may include a crystalline material with a different lattice structure, different lattice parameters, or both, than at least one of $\alpha''\text{-}Fe_{16}N_2$, $\alpha''\text{-}Fe_{16}Z_2$, or $\alpha''\text{-}Fe_{16}(N_xZ_{1-x})_2$, where Z includes at least one of C, B, or O. In some examples, substrate 46 additionally or alternatively may have a different coefficient of thermal expansion (CTE) than at least one of $\alpha''\text{-}Fe_{16}N_2$, $\alpha''\text{-}Fe_{16}Z_2$, or $\alpha''\text{-}Fe_{16}(N_xZ_{1-x})_2$. In examples in which substrate 26 includes at least one of a different lattice structure, different lattice parameters, or a different CTE than at least one of $\alpha''\text{-}Fe_{16}N_2$, $\alpha''\text{-}Fe_{16}Z_2$, or $\alpha''\text{-}Fe_{16}(N_xZ_{1-x})_2$, substrate 26 may exert a strain on coating 28 during an annealing technique, which may facilitate formation of at least one of $\alpha''\text{-}Fe_{16}(N_xZ_{1-x})_2$ or a mixture of $\alpha''\text{-}Fe_{16}N_2$ and $\alpha''\text{-}Fe_{16}Z_2$ in coating 28.

CVD chamber 22 may include an inlet 32 and an outlet 34. Inlet 32 may be fluidically connected to one or more sources of coating gases. For example, in system 20, inlet 32 is fluidically connected to a carrier gas source 36, a first source 40 of a coating constituent, and a second source 44 of a coating constituent, and a third source 48 of a coating constituent.

In some examples, carrier gas source 36 may include a gas that carries the coating gas to the interior of CVD chamber 22. In some examples, carrier gas source 36 may include a source of substantially inert gas (e.g., a gas that is substantially non-reactive with other elements and compounds present in system 20 during operation of system 20). A substantially inert gas may include, for example, a noble gas, such as argon.

In some examples, carrier gas source 36 additionally or alternatively may include a gas that may react with one or more elements and compounds present in system 20. For examples, carrier gas source 36 may include a source of hydrogen gas ($H_2$). In some examples, hydrogen gas may react with an iron precursor to liberate iron. In some instances, carrier gas source 36 may include a mixture of a substantially inert gas and a gas that reacts with one or more elements and compounds present in system 20. For example, carrier gas source 36 may include a mixture of hydrogen gas and argon.

Carrier gas source 36 may be fluidically connected to CVD chamber 22 via conduit or piping, and at least one valve 38. Valve 38 may be used to control flow of carrier gas from carrier gas source 36 to CVD chamber 22.

System 20 also includes first source 40. First source 40 may include a source of a vapor including a nitrogen-containing compound. In some examples, first source 40 may include a gaseous source of a nitrogen precursor, such as gaseous ammonia ($NH_3$). In other examples, first source 40 may include a liquid or solid source of a nitrogen precursor, such as ammonium nitrate ($NH_4NO_3$; solid), an amide (liquid or solid), or hydrazine (liquid).

Amides include a C—N—H bond and hydrazine includes an N—N bond Ammonium nitrate, amides and hydrazine may serve as a nitrogen donor for forming the powder including iron nitride. Example amides include carbamide (($NH_2$)$_2$CO; also referred to as urea), methanamide (Formula 1), benzamide (Formula 2), and acetamide (Formula 3), although any amide may be used.

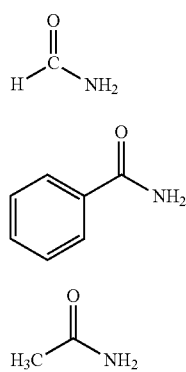

Formula 1

Formula 2

Formula 3

In some examples, amides may be derived from carboxylic acids by replacing the hydroxyl group of a carboxylic acid with an amine group. Amides of this type may be referred to as acid amides.

In examples in which the nitrogen-containing compound in first source 40 is a solid or liquid, first source 40 may include a heat source to vaporize the nitrogen-containing compound and form a vapor including a nitrogen-containing compound.

First source 40 may be fluidically connected to CVD chamber 22 via conduit or piping, and at least one valve 42. Valve 42 may be used to control flow of nitrogen-containing vapor from first source 40 to CVD chamber 22.

System 20 also includes second source 44. Second source 44 may include a source of a vapor including a Z atom-containing compound, where Z includes at least one of carbon, boron, or oxygen. For the purposes of description only, FIGS. 3 and 4 will be described with second source 44 being a source of a carbon-containing compound. However, it will be appreciated that similar principles may be applied to sources of a boron-containing material, sources of an oxygen containing material, or both.

In some examples, second source 44 may include a gaseous source of a carbon-containing compound, such as gaseous carbon monoxide (CO), gaseous carbon dioxide ($CO_2$), or gaseous methane ($CH_4$). In other examples, second source 44 may include a liquid or solid source of a carbon-containing compound, such as pure carbon (e.g., graphite) or urea. In examples in which the carbon-containing compound in second source 44 is a solid or liquid, second source 44 may include a heat source to vaporize the carbon-containing compound and form a vapor including a carbon-containing compound.

Second source 44 may be fluidically connected to CVD chamber 22 via conduit or piping, and at least one valve 46. Valve 46 may be used to control flow of carbon-containing vapor from second source 44 to CVD chamber 22.

In some examples, such as when urea is used both for the carbon source and the nitrogen source, system 20 may not include separate first and second sources 40 and 44 for the nitrogen-containing compound and the carbon-containing compound, but may instead include a single source for both the nitrogen-containing compound and the carbon-containing compound.

System 20 also includes third source 48. Third source 48 may include a source of iron or an iron precursor (or donor). In the example shown in FIG. 3, third source 48 contains a liquid iron donor 50, such as $FeCl_3$ or $Fe(CO)_5$. Third source 48 is fluidically coupled to a gas source 52 via valve 54, which controls flow of gas from gas source 52 into third source 48. In some examples, gas source 52 may be a source of hydrogen ($H_2$) has or another reducing gas.

Gas from gas source 52 flows into third source 48 and vaporizes at least some of liquid iron donor 50. Gas from gas source 52 then carries the vapor including the iron-containing compound into CVD chamber 22 through inlet 32.

Valves 38, 42, 46, and 54 may be used to control the total flow rate of gases and vapors into CVD chamber 22, and the relative proportion of carrier gas, the vapor including the nitrogen-containing compound, the vapor including the carbon-containing compound, and the vapor including the iron-containing compound in the gases and vapors flowing into CVD chamber 22. For example, valves 38, 42, 46, and 54 may be controlled to allow the carrier gas, the vapor including the nitrogen-containing compound, the vapor including the carbon-containing compound, and the vapor including the iron-containing compound to flow into CVD chamber 22 to produce an atomic ratio of iron to the combination nitrogen and carbon in the gases and vapors flowing into CVD chamber 22 to be between about 11.5:1 (iron:nitrogen+carbon) and about 5.65:1 (iron:nitrogen+carbon). For example, the atomic ratio of iron to the combination of nitrogen and carbon in the gases and vapors flowing into CVD chamber 42 may be about 9:1 (iron:nitrogen+carbon), about 8:1 (iron:nitrogen+carbon), or about 6.65:1 (iron:nitrogen+carbon).

Additionally, valves 42 and 46 may be controlled to control the relative flow rates of the vapor including the nitrogen-containing compound and the vapor including the carbon-containing compound to produce a predetermined atomic ratio of nitrogen to carbon in the gases flowing into CVD chamber 22. For example, valves 42 and 46 may be controlled to control the relative flow rates of the vapor including the nitrogen-containing compound and the vapor including the carbon-containing compound to produce an atomic ratio of nitrogen to carbon of between about 0.1:1 and about 10:1, such as about 1:1 or about 4.667:5.333.

In some examples, valves 38, 42, 46, and 54 may be controlled to produce a flow rate of the carrier gas between about 5 standard cm$^3$/minute (sccm) and about 5,000 sccm, flow rate of the vapor including the nitrogen-containing compound between about 10 sccm and about 1,000 sccm, a flow rate of the vapor including the carbon-containing compound between about 0.1 sccm and about 1,000 sccm, and a flow rate of the vapor including the iron-containing compound between about 100 sccm and about 5,000 sccm. Flow rates such as these may result in a growth rate of coating 28 of between about 100 micrometers per hour (μm/h) and about 1,000 μm/h.

In some examples, substrate 26 may be heated by susceptor 44 and RF induction coils 30 above at least one of a decomposition temperature of the iron-containing compound, the decomposition temperature of the nitrogen-containing compound, or a decomposition temperature of the carbon-containing compound. For example, substrate 26 may be heated to a temperature between about 200° C. and about 1,000° C. by susceptor 24 and RF induction coils 30.

In some examples in which substantially only susceptor 24 and substrate 26 is heated, the iron-containing compound, the nitrogen-containing compound, and the carbon-containing compound may decompose to release iron, nitrogen, and carbon, or may react with each other to form an iron-nitrogen-carbon compound. Because substrate 26 is heated, this reaction or reactions may occur at the surface of substrate 26, resulting in coating 28 being formed and including iron, nitrogen, and carbon.

In examples in which substantially the entire volume of CVD chamber 22 is heated (e.g., by a furnace), the decomposition reactions or reaction between the iron-containing compound, the nitrogen-containing compound, and the carbon-containing compound may occur above substrate within the volume of CVD chamber 22. The liberated iron, carbon, and nitrogen atoms or iron-carbide-nitride compound then may deposit over the surface of substrate 26 in coating 28.

In some examples, a reaction between the iron-containing compound, the nitrogen containing compound, and the carbon-containing compound may include:

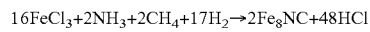

$16FeCl_3 + 2NH_3 + 2CH_4 + 17H_2 \rightarrow 2Fe_8NC + 48HCl$

As described above, the ratio of iron to nitrogen plus carbon in the gases and vapors entering CVD chamber 22 during formation of coating 28 may be between about 11.5:1 (iron:(nitrogen+carbon)) and about 5.65:1 (iron:(nitrogen+carbon)), such as about 8:1 (iron:(nitrogen+carbon)). Coating 28 may include approximately the same ratio of iron to nitrogen in the gases and vapors entering CVD chamber 22. Thus, coating 28 may include an iron to nitrogen plus carbon ratio of between about 11.5:1 (iron:(nitrogen+carbon)) and about 5.65:1 (iron:(nitrogen+carbon)), such as about 9:1 (iron:(nitrogen+carbon)), about 8:1 (iron:(nitrogen+carbon)), or about 6.65:1 (iron:(nitrogen+carbon)).

In some examples, portions of substrate 26 may be masked, leaving only portions of substrate 26 exposed over which coating 28 is formed. In other examples, coating 28 may be etched after deposition of coating 28 to remove the portions of coating 28, leaving only portions of substrate 26 coated with coating 28. In this way, coating 28 may be controllably formed over only selected portions of substrate 26 and later converted to the magnetic material.

Once coating 28 has been formed to a predetermined thickness, substrate 26 and coating 28 may be removed from CVD chamber 22 and subjected to an annealing technique. The annealing technique may facilitate magnetic material including at least one of α"-Fe$_{16}$(N$_x$Z$_{1-x}$)$_2$ phase (where Z includes at least one of C, B, or O) or a mixture of α"-Fe$_{16}$N$_2$ phase and α"-Fe$_{16}$Z$_2$ phase.

The annealing technique may be carried out at a temperature that produces strain in coating 28 due to differences in the coefficients of thermal expansion for substrate 26 and coating 28 to access at least one of the mixture of α"-Fe$_{16}$N$_2$ phase and α"-Fe$_{16}$C$_2$ phase or the α"-Fe$_{16}$(N$_x$C$_{1-x}$)$_2$ phase. Additionally, the annealing technique allows diffusion of N+ ions, C+ ions, or both within iron crystals in coating 28 to form at least one of α"-Fe$_{16}$N$_2$, α"-Fe$_{16}$C$_2$, or α"-Fe$_{16}$(N$_x$C$_{1-x}$)$_2$. In some examples, annealing at relatively low temperatures allows transformation of partial Fe$_8$N disordered phase into α"-Fe$_{16}$N$_2$ ordered phase. Similarly, annealing at relatively low temperatures is expected to allow transformation of partial Fe$_8$C disordered phase into α"-Fe$_{16}$C$_2$ ordered phase and partial Fe$_8$(N$_x$C$_{1-x}$) disordered phase into α"-Fe$_{16}$(N$_x$C$_{1-x}$)$_2$ ordered phase.

In some examples, the annealing technique may be carried out at a temperature below about 300° C., such as between about 120° C. and about 300° C., between about 120° C. and about 220° C., or between about 150° C. and about 220° C. The annealing technique may be performed in a nitrogen (N$_2$) or argon (Ar) atmosphere, or in a vacuum or near-vacuum.

The temperature and duration of the annealing step may be selected based on, for example, a size of the sample and diffusion coefficient of nitrogen atoms in iron and carbon atoms in iron at the annealing temperature. Based on these factors, the temperature and duration may be selected to provide sufficient time for nitrogen atoms to diffuse to locations within coating 28 to form Fe$_{16}$N$_2$ domains, α"-Fe$_{16}$C$_2$ domains, and/or α"-Fe$_{16}$(N$_x$C$_{1-x}$)$_2$ domains.

Additionally, the temperature and duration of the annealing technique may be selected based on a desired volume fraction of the respective phase domains in coating 28. For example, at a selected temperature, a longer annealing technique may result in a higher volume fraction of α"-Fe$_{16}$N$_2$, α"-Fe$_{16}$C$_2$, and/or α"-Fe$_{16}$(N$_x$C$_{1-x}$)$_2$. Similarly, for a given annealing technique duration, a higher temperature may result in a higher volume fraction of α"-Fe$_{16}$N$_2$, α"-Fe$_{16}$C$_2$, and/or α"-Fe$_{16}$(N$_x$C$_{1-x}$)$_2$. However, for durations above a threshold value, the additional volume fraction of α"-Fe$_{16}$N$_2$, α"-Fe$_{16}$C$_2$, and/or α"-Fe$_{16}$(N$_x$C$_{1-x}$)$_2$ may be limited or eliminated, as the volume fraction of α"-Fe$_{16}$N$_2$, α"-Fe$_{16}$C$_2$, and/or α"-Fe$_{16}$(N$_x$C$_{1-x}$)$_2$ reaches a relatively stable value. For example, at a temperature of about 150° C., after about 20 hours, the volume fraction of α"-Fe$_{16}$N$_2$ reaches a stable value. The duration of the annealing step may be at least about 5 hours, such as at least about 20 hours, or between about 5 hours and about 100 hours, or between about 5 hours and about 80 hours or between about 20 hours and about 80 hours, or about 40 hours.

Fe$_8$N and α"-Fe$_{16}$N$_2$ have similar body-centered tetragonal (bct) crystalline structure. However, in α"-Fe$_{16}$N$_2$, nitrogen atoms are ordered within the iron lattice, while in Fe$_8$N, nitrogen atoms are randomly distributed within the iron lattice. The annealing technique facilitates formation of the bct α"-Fe$_{16}$N$_2$ phase crystalline structure at least in part due to the strain exerted on the iron crystal lattice as a result of differential expansion of substrate 26 and coating 28 during the annealing step. For example, the coefficient of thermal expansion for iron is 11.8 µm/m·K, while for silicon it is 2.6 µm/m·K. This difference in thermal expansion coefficients results in a compression stress substantially parallel the major plane of coating 28 and a corresponding stretching force being generated along the <001> crystalline direction on a coating 28 with an (110) face. In some examples, the strain on coating 28 may be between about 0.3% and about 7%, which may result in a substantially similar strain on individual crystals of the iron nitride, such that the unit cell is elongated along the <001> axis between about 0.3% and about 7%. This may facilitate incorporation of nitrogen atoms at the preferred positions of the $\alpha''$-$Fe_{16}N_2$ crystal.

Similarly, carbon atoms in $\alpha''$-$Fe_{16}C_2$ and nitrogen and carbon atoms in $\alpha''$-$Fe_{16}(N_xC_{1-x})_2$ may be aligned along the (002) (iron) crystal planes. The annealing technique facilitates formation of the bct $\alpha''$-$Fe_{16}C_2$ phase crystalline structure or $\alpha''$-$Fe_{16}(N_xC_{1-x})_2$ in coating 28 at least in part due to the strain exerted on the iron crystal lattice as a result of differential expansion of substrate 26 and coating 28 during the annealing step.

Figure 4:
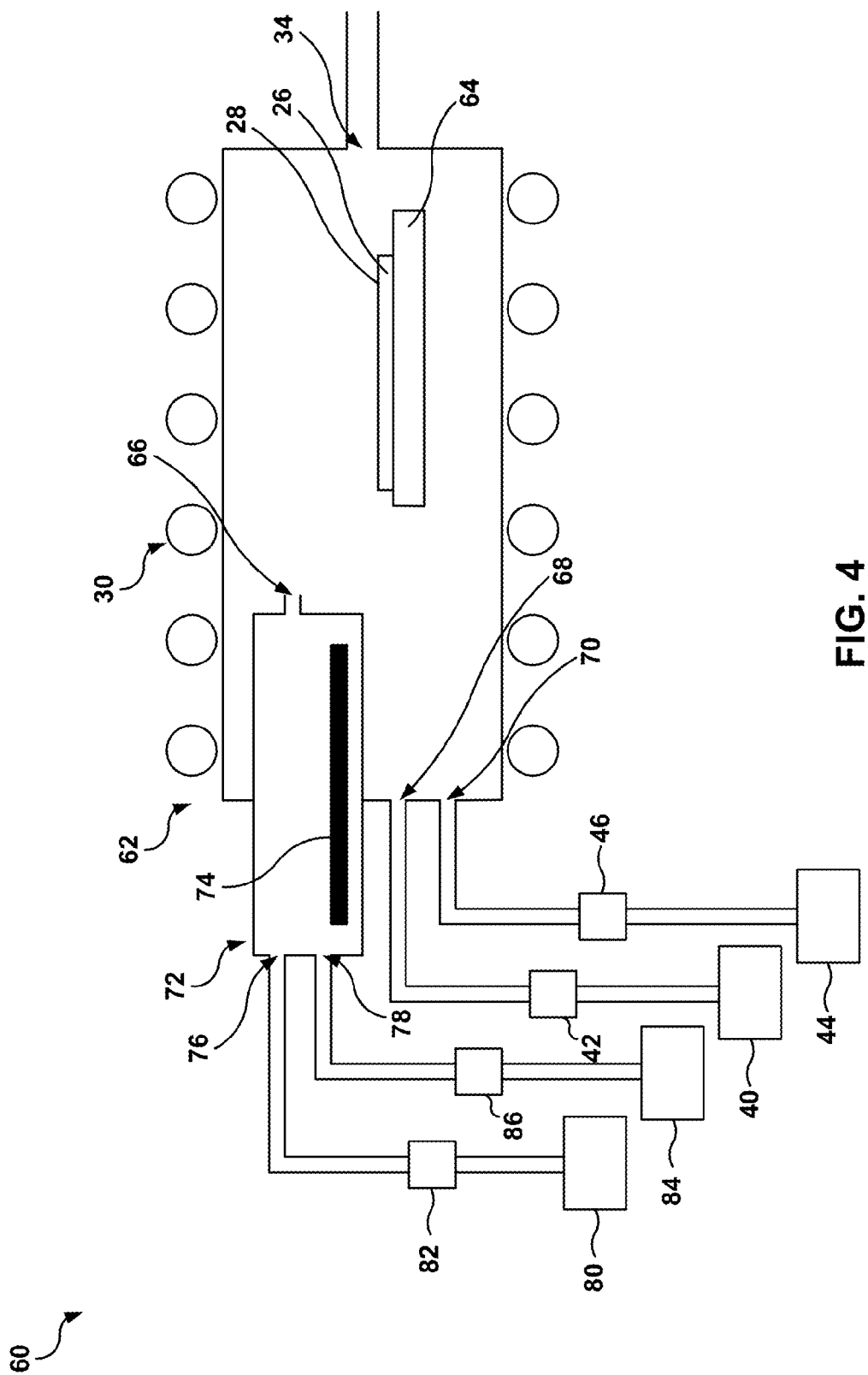
FIG. 4 is a conceptual and schematic diagram illustrating an example chemical vapor deposition system for forming a magnetic material including $\alpha''$-$Fe_{16}(N_xZ_{1-x})_2$ or a mixture of $\alpha''$-$Fe_{16}N_2$ and $\alpha''$-$Fe_{16}Z_2$, where Z includes at least one of C, B, or O.

Although FIG. 3 illustrates an example system 20 for CVD using a liquid iron-containing material, in other examples, CVD may be performed using a solid iron-containing material. FIG. 4 is a conceptual and schematic diagram illustrating an example chemical vapor deposition system 60 for forming a magnetic material including $\alpha''$-$Fe_{16}(N_xZ_{1-x})_2$ or a mixture of $\alpha''$-$Fe_{16}Z_2$ and $\alpha''$-$Fe_{16}N_2$, where Z includes at least one of C, B, or O. Similar to FIG. 3, FIG. 4 will be described with respect to examples where Z is carbon. However, it will be appreciated that similar principles may be applied to sources of a boron-containing material, sources of an oxygen containing material, or both. In some examples, system 60 of FIG. 4 may be similar to or substantially the same as system 20 described with reference to FIG. 3, aside from the differences described herein.

System 60 includes a CVD chamber 62. CVD chamber 62 encloses a susceptor 64, which may be similar or substantially the same as susceptor 24 of FIG. 3. In the example illustrated in FIG. 4, susceptor 64 is not shaped or oriented to position substrate 26 at an incline with respect to inlets 66, 68, and 70. In other examples, susceptor 64 may be shaped or oriented to position substrate 26 at an incline with respect to inlets 66, 68, and 70. CVD chamber 62 may include, for example, quartz or another refractory material. In some examples, CVD chamber 62 may be formed of a material that is substantially transparent to radio frequency (RF) magnetic energy.

CVD chamber 62 is at least partially surrounded by RF induction coils 30. RF induction coils 30 may be similar to or substantially the same as RF induction coils 30 illustrated in FIG. 3. CVD chamber 62 encloses substrate 26, over which coating 28 is formed. Substrate 26 is disposed on susceptor 64.

In some examples, rather than including a susceptor 64 heated by RF induction coils 30, CVD chamber 62 may be heated such that an entire volume of CVD chamber 62 is heated. For example, CVD chamber 62 may be disposed in a furnace, or CVD chamber 62 may be formed of a material that absorbs RF energy and heats the volume of CVD chamber 62.

CVD chamber 62 may include inlets 66, 68, and 70 and an outlet 34. Inlets 66, 68, and 70 may be fluidically connected to one or more sources of coating gases. For example, in system 60, inlet 66 is fluidically connected to a chamber 72 enclosing a solid iron-containing material 74, inlet 68 is fluidically coupled to a first source 40 of a coating constituent via a valve 42, and inlet 70 is fluidically coupled to a second source 44 of a coating constituent via a valve 46. First source 40, valve 42, second source 44, and valve 46 may be similar to or substantially the same as described above with respect to FIG. 3. For example, first source 40 may include a source of a vapor including a nitrogen-containing compound and second source 44 may include a source of a vapor including a carbon-containing compound (more generally, a source of a vapor including at least one of a carbon-containing compound, a boron-containing compound, or an oxygen-containing compound.

Chamber 72 encloses a solid iron-containing material 74. In some examples, iron-containing material 74 may include an iron-containing powder, billet, or thin film deposited on a substrate. In some examples, iron-containing material 74 includes substantially pure iron (e.g., iron with a purity of greater than 90 at. %). In other examples, iron-containing material 74 may include iron oxide (e.g., $Fe_2O_3$ or $Fe_3O_4$).

Chamber 72 may include a first inlet 76 and a second inlet 78. First inlet 76 may be fluidically connected to a first gas source 80 by a valve 82. First gas source 80 may include a source of an acid or chloride, such as HCl. The acid or chloride may react with iron-containing material 74 to form an iron-containing vapor. For example, HCl may react with iron-containing material 74 to form iron chloride ($FeCl_3$), which may be heated to form a vapor.

Second inlet 78 may be fluidically coupled to a carrier gas source 84 by a valve 86. In some examples, carrier gas source 84 may include a source of substantially inert gas (e.g., a gas that is substantially non-reactive with other elements and compounds present in system 60 during operation of system 60). A substantially inert gas may include, for example, a noble gas, such as argon.

Valves 42, 46, 82, and 86 may be used to control the total flow rate of gases and vapors into CVD chamber 62, and the relative proportion of carrier gas, nitrogen-containing vapor, carbon-containing vapor, and iron-containing vapor in the gases and vapors flowing into CVD chamber 62. For example, valves 42, 46, 82, and 86 may be controlled to allow deposition of coating 28, which includes iron, carbon, and nitrogen, and as described with respect to FIG. 3.

In some examples, to form coating 28, valves 42, 46, 82, and 86 may be controlled to allow the carrier gas, the vapor including the nitrogen-containing compound, the vapor including the carbon-containing compound, and the vapor including the iron-containing compound to flow into CVD chamber 62 to produce an atomic ratio of iron to the combination nitrogen and carbon in the gases and vapors flowing into CVD chamber 62 to be between about 11.5:1 (iron:(nitrogen+carbon)) and about 5.65:1 (iron:(nitrogen+carbon)). For example, the atomic ratio of iron to the combination of nitrogen and carbon in the gases and vapors flowing into CVD chamber 62 may be about 9:1 (iron:(nitrogen+carbon)), about 8:1 (iron:(nitrogen+carbon)), or about 6.65:1 (iron:(nitrogen+carbon)).

Additionally, valves 42 and 46 may be controlled to control the relative flow rates of the vapor including the nitrogen-containing compound and the vapor including the carbon-containing compound to produce a predetermined atomic ratio of nitrogen to carbon in the gases flowing into CVD chamber 62. For example, valves 42 and 46 may be controlled to control the relative flow rates of the vapor including the nitrogen-containing compound and the vapor including the carbon-containing compound to produce an atomic ratio of nitrogen to carbon of between about 0.1:1 and about 10:1, such as about 1:1 or about 4.667:5.333.

In some examples, to form coating 28, the flow rate of the carrier gas may be between about 5 sccm and about 5,000 sccm, the flow rate of the vapor including the nitrogen-containing compound may be between about 10 sccm and about 1,000 sccm, the flow rate of the vapor including the carbon-containing compound may be between about 0.1 sccm and about 1,000 sccm, and the flow rate of the vapor including the iron-containing compound may be between about 100 sccm and about 5,000 sccm. Flow rates such as these may result in a growth rate of coating 28 of between about 100 µm/h and about 1,000 µm/h.

In some examples, the HCl may react with Fe in chamber 72 according to the following reaction:

$$Fe+HCl \rightarrow FeCl_3+H_2$$

The $FeCl_3$ and $H_2$ may flow into CVD chamber 62 through first inlet 66, where the vapors may mix with the nitrogen-containing vapor, such as $NH_3$. In some examples, the nitrogen-containing vapor and the iron containing vapor may react according to the following reaction to deposit coating 28 including an approximately 8:1 ratio of iron to nitrogen plus carbon:

$$16FeCl_3+2NH_3+2CH_4+17H_2 \rightarrow 2Fe_8NC+48HCl$$

As described above with respect to FIG. 3, once coating 28 has been formed to a predetermined thickness, coating 28 may be annealed to transform at least some of the iron, carbon, and nitride mixture coating 28 to at least one of $\alpha''\text{-}Fe_{16}(N_xC_{1-x})_2$ or a mixture of $\alpha''\text{-}Fe_{16}N_2$ and $\alpha''\text{-}Fe_{16}C_2$. The annealing technique may be similar to or substantially the same as that described above with respect to FIG. 3.

By using CVD to form coating 28 over substrate 26, magnetic material including at least one of $\alpha''\text{-}Fe_{16}(N_xC_{1-x})_2$ or a mixture of $\alpha''\text{-}Fe_{16}N_2$ and $\alpha''\text{-}Fe_{16}C_2$ may be incorporated into other products formed using CVD and existing manufacturing techniques that utilize CVD. Using existing CVD manufacturing operations, including masking, magnetic material including at least one of $\alpha''\text{-}Fe_{16}(N_xC_{1-x})_2$ or a mixture of $\alpha''\text{-}Fe_{16}N_2$ and $\alpha''\text{-}Fe_{16}C_2$ may be deposited over predetermined portions or regions of substrate 26. For example, magnetic materials including at least one of $\alpha''\text{-}Fe_{16}(N_xC_{1-x})_2$ or a mixture of $\alpha''\text{-}Fe_{16}N_2$ and $\alpha''\text{-}Fe_{16}C_2$ may be incorporated into CMOS (complementary metal-oxide-semiconductor) integrated circuit devices, and the CVD technique for forming magnetic materials including at least one of $\alpha''\text{-}Fe_{16}(N_xC_{1-x})_2$ or a mixture of $\alpha''\text{-}Fe_{16}N_2$ and $\alpha''\text{-}Fe_{16}C_2$ may be incorporated into existing CMOS processing techniques. In other examples, magnetic materials including at least one of $\alpha''\text{-}Fe_{16}(N_xC_{1-x})_2$ or a mixture of $\alpha''\text{-}Fe_{16}N_2$ and $\alpha''\text{-}Fe_{16}C_2$ formed using CVD may be incorporated into other devices utilizing magnetic materials.

CVD may allow growth of coating 28 faster than some other techniques, such as molecular beam epitaxy (MBE), while, in some examples, forming superior coatings compared to some other techniques, such as sputtering.

In other examples, a coating (e.g., coating 28) may be formed over a substrate (e.g., substrate 26) using liquid phase epitaxy (LPE). In LPE, a solution including the coating materials may be cooled to form a supersaturated solution. The coating materials in the solution deposit a coating over a substrate immersed or submerged in the solution. In some examples, the degree of supersaturation may be low, such that the LPE technique is a near-equilibrium process. This may result in coatings with high crystalline quality (e.g., near-perfect crystalline structure). Additionally, because the concentration of the coating materials in the solution are much greater than the concentration of coating materials in vapor phase techniques, the growth rate of the coating may be greater than the growth rate for coatings grown using vapor phase techniques.

Figure 5:
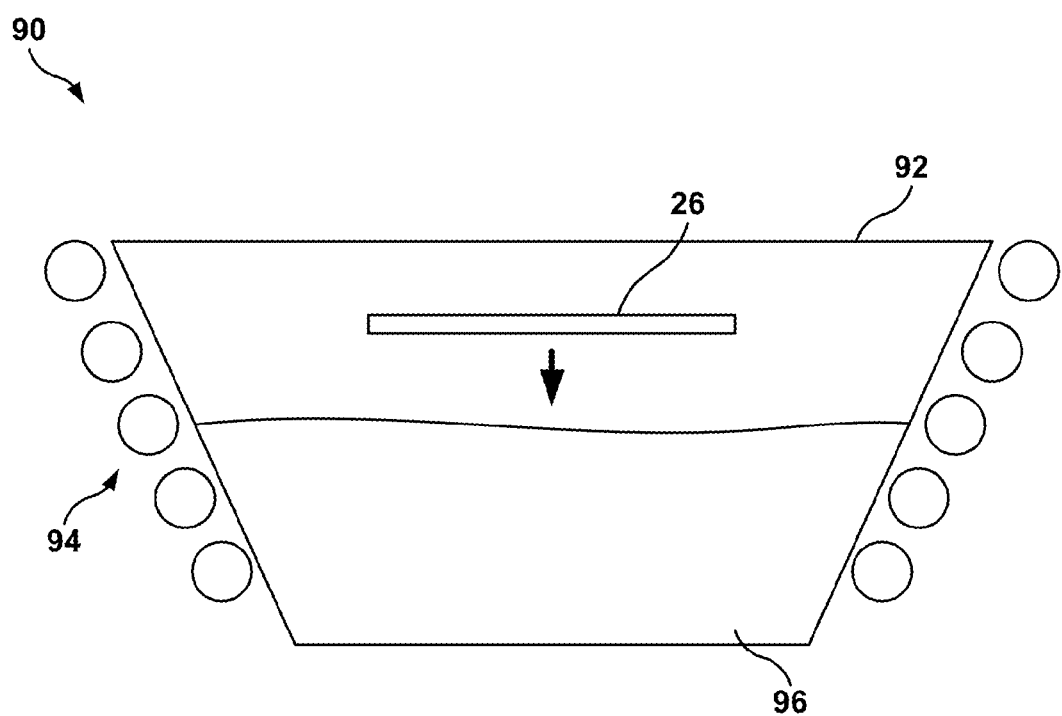
FIG. 5 is a conceptual and schematic diagram illustrating an example system for forming a coating including iron, nitrogen, and carbon over a substrate using LPE.

FIG. 5 is a conceptual and schematic diagram illustrating an example system 90 for forming a coating including iron, nitrogen, and carbon over a substrate 26 using LPE. System 90 includes a crucible 92 in which a coating solution 96 is contained. System 90 also includes RF induction coils 94, which at least partially surrounded crucible 92. RF induction coils 94 may be electrically connected to an RF source (not shown in FIG. 5), which causes an alternating electrical current at RF to flow through RF induction coils 94. In some examples, the RF magnetic field generated by RF induction coils 94 may be absorbed by coating solution 96 or by crucible 92, such that coating solution 96 is heated.

Coating solution 96 may include a solution of iron in a solvent. Coating solution 96 may include a first solution when forming a layer including iron and nitrogen and a second, different solution when forming a layer including iron, carbon, and nitrogen.

In some examples, the solvent may include a nitrogen-containing compound, such as ammonium nitrate, urea, an amide or hydrazine. In some examples, the solvent may be oversaturated with nitrogen at the deposition temperature and pressure. Example amides include carbamide $((NH_2)_2CO;$ also referred to as urea), methanamide (Formula 1 above), benzamide (Formula 2 above), acetamide (Formula 3 above), and acid amides, although any amide may be used. The amide may be selected to be a liquid at the temperatures experienced by coating solution 96 during the LPE technique.

Coating solution 96 also may include a carbon-containing compound. For example, coating solution 96 may include dissolved carbon monoxide, dissolved carbon dioxide, dissolved methane, or urea.

Coating solution 96 also includes an iron source. In some examples, the iron source may include an iron-containing compound. In some examples, the iron source includes a liquid iron donor, such as $FeCl_3$ or $Fe(CO)_5$. In other examples, the iron source may include an iron-containing powder. In some examples, the iron-containing powder may include substantially pure iron (e.g., iron with a purity of greater than 90 at. %). In some examples, the iron-containing powder may include iron oxide (e.g., $Fe_2O_3$ or $Fe_3O_4$).

During the LPE process for forming a coating including iron, carbon, and nitrogen, the coating solution 96 may be heated to a temperature near or above the liquidus temperature of the iron, carbon, and nitrogen mixture, such as near or above the eutectic temperature of the iron, carbon, and nitrogen mixture, to be deposited over substrate 26. In some examples, the solvent may not include the iron source, the carbon source, or both when heated to the temperature above the liquidus temperature.

The iron source and carbon source then may be dissolved in the solvent to form a coating solution 96 that is saturated with the iron-containing material, the carbon source, or both. Substrate 26 then may be immersed in coating solution 96.

Coating solution 96 and substrate 26 then may be cooled to a temperature that is below the liquidus temperature of the iron-carbon-nitrogen coating to be formed. This causes coating solution 96 to be supersaturated with the iron-containing material, the carbon-containing material, or both, which drives the LPE coating technique. In some examples the temperature at which the LPE coating technique is performed may be between about 600° C. and about 1,000°

C. This temperature may be in a two-phase region, which provides a driving force for precipitation of iron-carbon-nitrogen over the surface of substrate 26. In some examples, the concentration of iron, carbon, and nitrogen in coating solution 96 and the temperature at which the LPE coating technique is performed may be controlled to provide an atomic ratio of iron to nitrogen plus carbon between about 11.5:1 (iron:(nitrogen+carbon)) and about 5.65:1 (iron:(nitrogen+carbon)). For example, the atomic ratio between iron and nitrogen atoms may be about 9:1 (iron:(nitrogen+carbon)), about 8:1 (iron:(nitrogen+carbon)), or about 6.65:1 (iron:(nitrogen+carbon)). Although FIG. 5 has been described with respect to a mixture of iron, nitrogen and carbon, similar concepts may be applied to form coatings including iron, nitrogen, and at least one of boron or oxygen.

After the coating that includes iron, carbon, and nitrogen has been formed, the coating may be annealed under conditions similar to or substantially the same as those described with respect to FIG. 3. The annealing may facilitate formation of $\alpha''\text{-Fe}_{16}(N_xZ_{1-x})_2$ phase (where Z includes at least one of C, B, or O) or a mixture of $\alpha''\text{-Fe}_{16}N_2$ phase and $\alpha''\text{-Fe}_{16}Z_2$ phase in the coating to form the magnetic material.

Figure 6:
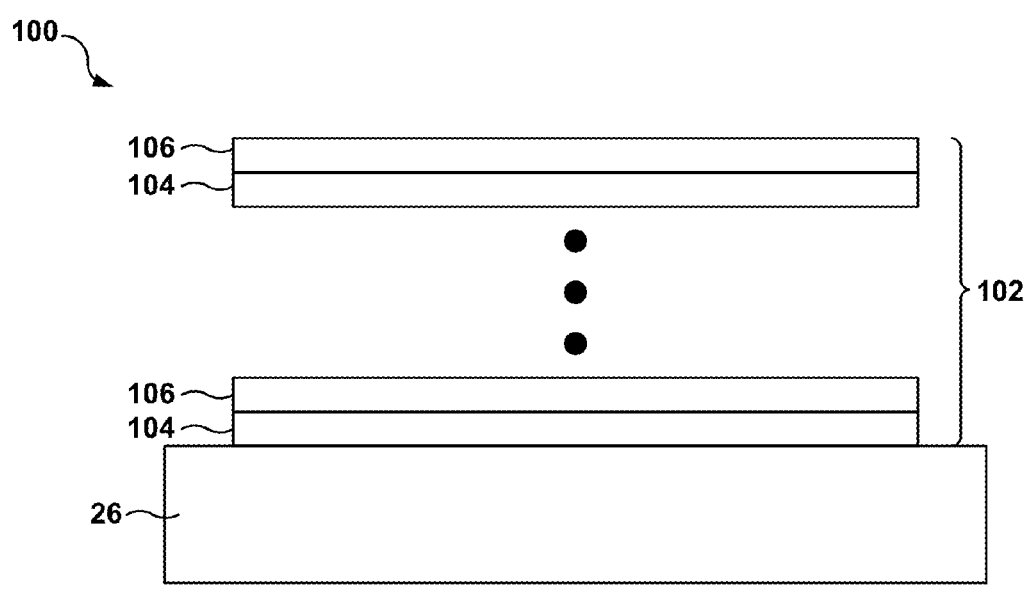
FIG. 6 is a conceptual and schematic diagram illustrating an example article including a substrate and a multilayer magnetic material including a first set of layers including $\alpha''$-$Fe_{16}N_2$ and a second set of layers including $\alpha''$-$Fe_{16}Z_2$, where Z includes at least one of C, B, or O.

As described above with respect to FIG. 2, in some examples, a magnetic material may include a mixture of $\alpha''\text{-Fe}_{16}N_2$ phase domains and $\alpha''\text{-Fe}_{16}Z_2$ phase domains. Although FIG. 2 illustrates phase domains of $\alpha''\text{-Fe}_{16}N_2$ and $\alpha''\text{-Fe}_{16}Z_2$ mixed within a single layer, in other examples, a magnetic material may include layers of $\alpha''\text{-Fe}_{16}N_2$ alternating with layers of $\alpha''\text{-Fe}_{16}Z_2$. In instances in which the thickness of the individual layers are sufficiently thin (e.g., less than about 50 nm), the multilayer structure may have properties similar to the material illustrated in FIG. 2, which has relatively high saturation magnetization, and may have relatively low coercivity. FIG. 6 is a conceptual and schematic diagram illustrating an example article 100 including a substrate 26 and a multilayer magnetic material 102 including a first set of layers 104 including $\alpha''\text{-Fe}_{16}N_2$ and a second set of layers 106 including $\alpha''\text{-Fe}_{16}Z_2$, where Z includes at least one of C, B, or O.

Each layer of first set of layers 104 may include $\alpha''\text{-Fe}_{16}N_2$ phase domains. Similarly, each layer of second set of layers 106 may include $\alpha''\text{-Fe}_{16}Z_2$ phase domains, where Z includes at least one of C, B, or O. Each layer of first set of layers 104 may be formed using, for example, CVD or LPE. Although FIG. 6 illustrates a layer of first set of layers 104 being on substrate 26, in other examples, a layer of second set of layers 106 may be on substrate 26. Similarly, although FIG. 6 illustrates a layer of second set of layers 106 being the outer layer of multilayer magnetic material 102, in other examples, a layer of first set of layers 106 may be the outer layer of multilayer magnetic material 102.

For example, with respect to system 20 shown in FIG. 3, valves 38, 42, 46, and 54 may be controlled to allow deposition of alternating layers from first set of layers 104 and second set of layers 106 to form a coating that is annealed to form multilayer magnetic material 102. To form a layer from first set of layers 104, which includes $\alpha''\text{-Fe}_{16}N_2$, valves 38, 42, 46, and 54 may be controlled to allow the carrier gas, the vapor including the nitrogen-containing compound, and the vapor including the iron-containing compound to flow into CVD chamber 22, while preventing the vapor including the carbon-containing compound from flowing into CVD chamber 22. In some examples, to form a layer from first set of layers 104, valves 38, 42, 46, and 54 may be controlled to allow the carrier gas, the vapor including the nitrogen-containing compound, and the vapor including the iron-containing compound to flow into CVD chamber 22 to produce an atomic ratio of iron to nitrogen in the gases and vapors flowing into CVD chamber 22 to be between about 11.5:1 (iron:nitrogen) and about 5.65:1 (iron:nitrogen). For example, the atomic ratio between iron and nitrogen atoms in the of the gases and vapors flowing into CVD chamber 22 may be about 9:1 (iron:nitrogen), about 8:1 (iron:nitrogen), or about 6.65:1 (iron:nitrogen).

In some examples, to form a layer from first set of layers 104, the flow rate of the carrier gas may be between about 5 sccm and about 5,000 sccm, the flow rate of the vapor including the nitrogen-containing compound may be between about 10 sccm and about 1,000 sccm, and the flow rate of the vapor including the iron-containing compound may be between about 100 sccm and about 5,000 sccm. Flow rates such as these may result in a growth rate of a layer from first set of layers 16 of between about 100 µm/h and about 1,000 µm/h.

In some examples, substrate 26 may be heated by susceptor 24 and RF induction coils 30 above a decomposition temperature of the iron-containing compound, the decomposition temperature of the nitrogen-containing compound, or both. For example, substrate 26 may be heated to a temperature between about 200° C. and about 1,000° C. by susceptor 24 and RF induction coils 30.

In some examples in which substantially only susceptor 24 and substrate 26 is heated, the iron-containing compound and the nitrogen-containing compound may decompose to release iron and nitrogen, or may react with each other to form an iron nitride compound. Because substrate 26 is heated, this reaction or reactions may occur at the surface of substrate 26, resulting in a layer from first set of layers 104 being formed and including iron and nitrogen.

In examples in which substantially the entire volume of CVD chamber 22 is heated (e.g., by a furnace), the decomposition reactions or reaction between the iron-containing compound and the nitrogen-containing compound may occur above substrate within the volume of CVD chamber 22. The liberated iron and nitrogen atoms or iron nitride compound then may deposit over the surface of substrate 26 in the layer from first set of layers 104.

In some examples, a reaction between the iron-containing compound and the nitrogen containing compound may include:

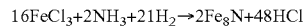

$$16\text{FeCl}_3 + 2\text{NH}_3 + 21\text{H}_2 \rightarrow 2\text{Fe}_8\text{N} + 48\text{HCl}$$

As described above, the ratio of iron to nitrogen in the gases and vapors entering CVD chamber 22 during formation of a layer from first set of layers 104 may be between about 11.5:1 (iron:nitrogen) and about 5.65:1 (iron:nitrogen), such as about 8:1 (iron:nitrogen). The layer from first set of layers 104 may include approximately the same ratio of iron to nitrogen in the gases and vapors entering CVD chamber 22. Thus, the layer from first set of layers 104 may include an iron to nitrogen ratio of between about 11.5:1 (iron:nitrogen) and about 5.65:1 (iron:nitrogen), such as about 9:1 (iron:nitrogen), about 8:1 (iron:nitrogen), or about 6.65:1 (iron:nitrogen).

In some examples, the layer from first set of layers 104, as deposited, may include at least one type of iron nitride, such as, for example, FeN, $\text{Fe}_2\text{N}$ (e.g., $\xi\text{-Fe}_2\text{N}$), $\text{Fe}_3\text{N}$ (e.g., $\epsilon\text{-Fe}_3\text{N}$), $\text{Fe}_4\text{N}$ (e.g., $\gamma'\text{-Fe}_4\text{N}$, $\gamma\text{-Fe}_4\text{N}$, or both), $\text{Fe}_2\text{N}_6$, $\text{Fe}_8\text{N}$, $\alpha''\text{-Fe}_{16}\text{N}_2$, or FeN (where x is between about 0.05 and about 0.5), in addition to iron and/or nitrogen. In some examples, the layer from first set of layers 104 may have a purity (e.g., collective iron and nitrogen content) of at least 92 atomic percent (at. %).

The layer from first set of layers 104 may include any selected thickness, and the thickness may at least partially depend on the CVD parameters, including the time for which the CVD technique is carried out. In some examples, the selected thickness of the layer from first set of layers 104 may be based on a thickness that allows coupling of layers from second set of layers 106 to layers from first set of layers 104.

In some examples, to form a layer from second set of layers 106, which includes a soft magnetic material, valves 38, 42, 46, and 54 may be controlled to allow deposition of alternating layers from first set of layers 104 and second set of layers 106 to a coating that is annealed to form multilayer magnetic material 102. To form a layer from second set of layers 106, which includes α"-$Fe_{16}C_2$, valves 38, 42, 46, and 54 may be controlled to allow the carrier gas, the vapor including the carbon-containing compound, and the vapor including the iron-containing compound to flow into CVD chamber 22, while preventing the vapor including the nitrogen-containing compound from flowing into CVD chamber 22. In some examples, to form a layer from second set of layers 106, valves 38, 42, 46, and 54 may be controlled to allow the carrier gas, the vapor including the carbon-containing compound, and the vapor including the iron-containing compound to flow into CVD chamber 22 to produce an atomic ratio of iron to nitrogen in the gases and vapors flowing into CVD chamber 22 to be between about 11.5:1 (iron:carbon) and about 5.65:1 (iron:carbon). For example, the atomic ratio between iron and nitrogen atoms in the of the gases and vapors flowing into CVD chamber 22 may be about 9:1 (iron:carbon), about 8:1 (iron:carbon), or about 6.65:1 (iron:carbon).

In some examples, to form a layer from second set of layers 106, the flow rate of the carrier gas may be between about 5 sccm and about 5,000 sccm, the flow rate of the vapor including the carbon-containing compound may be between about 10 sccm and about 1,000 sccm, and the flow rate of the vapor including the iron-containing compound may be between about 100 sccm and about 5,000 sccm. Flow rates such as these may result in a growth rate of a layer from second set of layers 106 of between about 100 µm/h and about 1,000 µm/h.

In some examples, substrate 26 may be heated by susceptor 24 and RF induction coils 30 above a decomposition temperature of the iron-containing compound, the decomposition temperature of the carbon-containing compound, or both. For example, substrate 26 may be heated to a temperature between about 200° C. and about 1,000° C. by susceptor 24 and RF induction coils 30.

In some examples in which substantially only susceptor 24 and substrate 26 is heated, the iron-containing compound and the carbon-containing compound may decompose to release iron and carbon, or may react with each other to form an iron carbide compound. Because substrate 26 is heated, this reaction or reactions may occur at the surface of substrate 26, resulting in a layer from second set of layers 106 being formed and including iron and carbon.

In examples in which substantially the entire volume of CVD chamber 22 is heated (e.g., by a furnace), the decomposition reactions or reaction between the iron-containing compound and the carbon-containing compound may occur above substrate within the volume of CVD chamber 22. The liberated iron and carbon atoms or iron carbide compound then may deposit over the surface of substrate 26 in the layer from second set of layers 106.

As described above, the ratio of iron to carbon in the gases and vapors entering CVD chamber 22 during formation of a layer from second set of layers 106 may be between about 11.5:1 (iron:carbon) and about 5.65:1 (iron:carbon), such as about 8:1 (iron:carbon). The layer from second set of layers 106 may include approximately the same ratio of iron to nitrogen in the gases and vapors entering CVD chamber 22. Thus, the layer from second set of layers 106 may include an iron to nitrogen ratio of between about 11.5:1 (iron:carbon) and about 5.65:1 (iron:carbon), such as about 9:1 (iron:carbon), about 8:1 (iron:carbon), or about 6.65:1 (iron:carbon).

As used herein, depositing or forming "over" the substrate includes both depositing or forming a layer directly on the surface of the substrate, as well as depositing a layer one another layer. The other layer may be directly on the surface of the substrate, or on yet another layer that is on or over the substrate. For example, a layer of first set of layers 104 has been described as being deposited over the surface of substrate 26 and a layer of second set of layers 106 has been described as being deposited over the surface of substrate 26. This means that the layer of first set of layers 104 may be formed directly on substrate 26, may be formed on a layer of second set of layers 106, or may be formed on another layer. Similarly, this means that the layer of second set of layers 106 may be formed directly on substrate 26, may be formed on a layer of first set of layer 104, or may be formed on another layer. Depositing or forming "on" means that the layer is formed directly on the underlying layer, with no layers in between.

The layer from second set of layers 106 may include any selected thickness, and the thickness may at least partially depend on the CVD parameters, including the time for which the CVD technique is carried out. In some examples, the selected thickness of the layer from second set of layers 106 may be based on a thickness that allows coupling of layers from second set of layers 106 to layers from first set of layers 104.

Additionally, in some examples, the selected thicknesses of the first layers and the second layers may be controlled to control the volume ratio of first set of layers 104 to second set of layers 106. For example, the volume ratio of first set of layers 104 to second set of layers 106 may be controlled so that the ratio of the volume of α"-$Fe_{16}N_2$ to α"-$Fe_{16}Z_2$ is a predetermined value, such as about 1:1 or about 4.667:5.333.

Valves 38, 42, 46, and 54 may be controlled such that a layer from first set of layers 104 and a layer from second set of layers 106 are alternately deposited, resulting in formation of a structure similar to or substantially the same as multilayer magnetic material 102 illustrated in FIG. 6. The number of layers layer from first set of layers 104 and layers from second set of layers 106 may be selected based on the desired final structure of multilayer magnetic material 102, which may be formed from a multilayer coating.

Once the predetermined number of layers 104 and 106 have been formed, the coating may be annealed under conditions similar to or substantially the same as those described with respect to FIG. 3. The annealing may facilitate formation of α"-$Fe_{16}N_2$ phase and α"-$Fe_{16}C_2$ (or α"-$Fe_{16}B_2$ or α"-$Fe_{16}O_2$) phase in respective layers 104 and 106 of the coating to form multilayer magnetic material 102.

Similarly, system 60 illustrated in FIG. 4 and system 90 in FIG. 5 may be used to form a multilayer coating that is annealed to form multilayer magnetic material 102.

Figure 7:
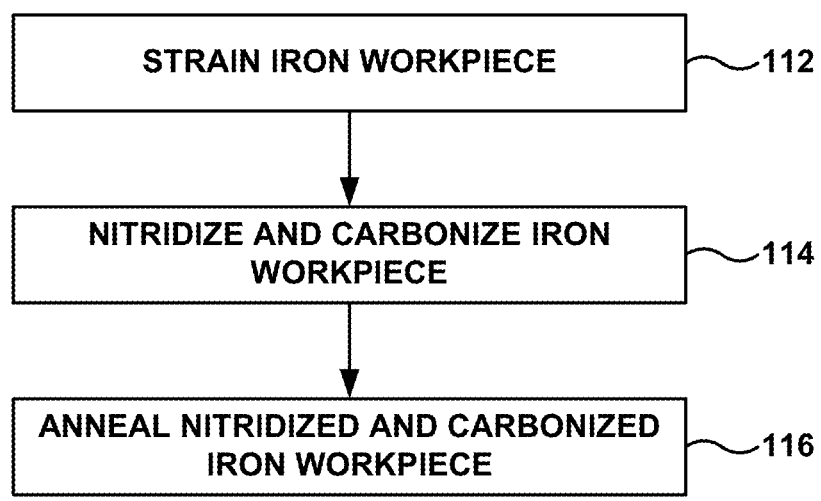
FIG. 7 is a flow diagram that illustrates an example technique for forming a bulk magnetic material including $\alpha''\text{-Fe}_{16}(N_xZ_{1-x})_2$ or a mixture of $\alpha''\text{-Fe}_{16}N_2$ and $\alpha''\text{-Fe}_{16}Z_2$, where Z includes at least one of C, B, or O.
Figure 8:
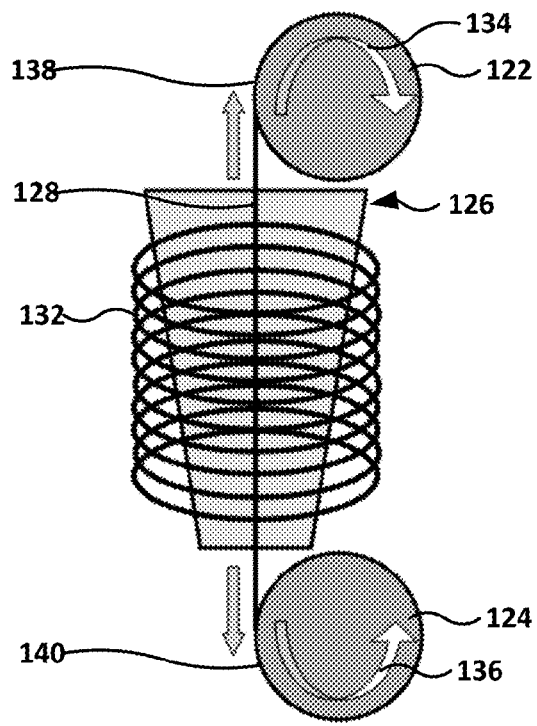
FIG. 8 illustrates a conceptual diagram of an apparatus with which the iron wire or sheet can be strained and exposed to nitrogen and carbon.
Figure 9:
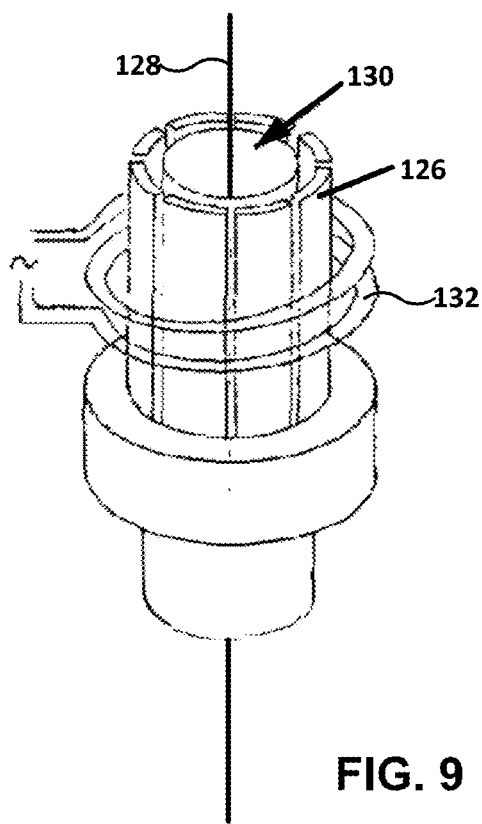
FIG. 9 illustrates further detail of one example of the crucible heating stage shown in FIG. 8.

FIG. 7 is a flow diagram that illustrates an example technique for forming a bulk magnetic material including $\alpha''\text{-Fe}_{16}(N_xZ_{1-x})_2$ or a mixture of $\alpha''\text{-Fe}_{16}N_2$ and $\alpha''\text{-Fe}_{16}Z_2$, where Z includes at least one of C, B, or O. The technique of FIG. 7 will be described with concurrent reference to FIGS. 8 and 9. FIG. 8 illustrates a conceptual diagram of an apparatus with which the iron wire or sheet can be strained and exposed to nitrogen and carbon. FIG. 9 illustrates further detail of one example of the crucible heating stage shown in FIG. 8.

The example apparatus of FIG. 8 includes a first roller 122, a second roller 124, and a crucible heating stage 126. First roller 122 and second roller 124 are configured to receive a first end 138 and a second end 140, respectively, of an iron workpiece 128, such as a wire or sheet. Iron workpiece 128 defines a major axis between first end 138 and second end 140. As best seen in FIG. 9, iron workpiece 128 passes through an aperture 130 defined by crucible heating stage 126. Crucible heating stage 126 includes an inductor 132 that surrounds at least a portion of the aperture 130 defined by crucible heating stage 126.

The example technique of FIG. 7 includes straining iron workpiece 128 along a direction substantially parallel (e.g., parallel or nearly parallel) to a <001> axis of at least one iron crystal in the iron workpiece 128 (112). In some examples, iron workpiece 128 is formed of iron having a body centered cubic (bcc) crystal structure.

In some examples, iron workpiece 128 is formed of a single bcc crystal structure. In other examples, iron workpiece 128 may be formed of a plurality of bcc iron crystals. In some of these examples, the plurality of iron crystals are oriented such that at least some, e.g., a majority or substantially all, of the <001> axes of individual unit cells and/or crystals are substantially parallel to the direction in which strain is applied to iron workpiece 128. For example, when the iron is formed as iron workpiece 128, at least some of the <001> axes may be substantially parallel to the major axis of the iron workpiece 128, as shown in FIGS. 8 and 9. In some examples, single crystal iron nitride workpieces may be formed using crucible techniques. In addition to such crucible techniques, single crystal iron workpieces may be formed by either the micro melt zone floating or pulling from a micro shaper to form iron workpiece 128.

In an unstrained iron bcc crystal lattice, the <100>, <010>, and <001> axes of the crystal unit cell may have substantially equal lengths. However, when a force, e.g., a tensile force, is applied to the crystal unit cell in a direction substantially parallel to one of the crystal axes, e.g., the <001> crystal axis, the unit cell may distort and the iron crystal structure may be referred to as body centered tetragonal (bct). For example, as described above with respect to FIG. 1, in $\alpha''\text{-Fe}_{16}N_2$, the iron unit cells are distorted such that the length of the unit cell along the <001> axis is approximately 3.14 angstroms (Å) while the length of the unit cell along the <010> and <100> axes is approximately 2.86 Å. The iron unit cell may be referred to as a bct unit cell when in the strained state. When the iron unit cell is in the strained state, the <001> axis may be referred to as the c-axis of the unit cell.

The stain may be exerted on iron workpiece 128 using a variety of strain inducing apparatuses. For example, as shown in FIG. 8, first end 138 and second end 140 of iron workpiece 128 may be received by (e.g., wound around) first roller 122 and second roller 124, respectively, and rollers 122, 124 may be rotated in opposite directions (indicated by arrows 134 and 135 in FIG. 8) to exert a tensile force on the iron workpiece 128.

Rollers 122, 124 may strain iron workpiece 128 to a certain elongation. For example, the strain on iron workpiece 128 may be between about 0.3% and about 7%. In other examples, the strain on iron workpiece 128 may be less than about 0.3% or greater than about 7%. In some examples, exerting a certain strain on iron workpiece 128 may result in a substantially similar strain on individual unit cells of the iron, such that the unit cell is elongated along the <001> axis between about 0.3% and about 7%.

As rollers 122, 124 exert the strain on iron workpiece 128 and/or once rollers 122, 124 are exerting a substantially constant strain on the iron workpiece 128, iron workpiece 128 may be nitridized and carbonized (114). In some examples, during the nitridization and carbonization process, iron workpiece 128 may be heated using a heating apparatus. One example of a heating apparatus that can be used to heat iron workpiece 128 is crucible heating stage 126, shown in FIGS. 8 and 9.

Crucible heating stage 126 defines aperture 130 through which iron workpiece 128 passes (e.g., in which a portion of iron workpiece 128 is disposed). In some examples, no portion of crucible heating stage 126 contacts iron workpiece 128 during the heating of iron workpiece 128. In some implementations, this is advantageous as it lower a risk of unwanted elements or chemical species contacting and diffusing into iron workpiece 128. Unwanted elements or chemical species may affect properties of iron workpiece 128; thus, it may be desirable to reduce or limit contact between iron workpiece 128 and other materials.

Crucible heating stage 126 also includes an inductor 132 that surrounds at least a portion of aperture 130 defined by crucible heating stage 126. Inductor 132 includes an electrically conductive material, such as aluminum, silver, or copper, through which an electric current may be passed. The electric current may by an alternating current (AC), which may induce eddy currents in iron workpiece 128 and heat the iron workpiece 128. In other examples, instead of using crucible heating stage 126 to heat iron workpiece 128, other non-contact heating sources may be used. For example, a radiation heat source, such as an infrared heat lamp, may be used to heat iron workpiece 128. As another example, a plasma arc lamp may be used to heat iron workpiece 128.

Regardless of the heating apparatus used to heat iron workpiece 128 during the nitridizing and carbonizing process, the heating apparatus may heat iron workpiece 128 to temperature for a time sufficient to allow diffusion of nitrogen and carbon to a predetermined concentration substantially throughout the thickness or diameter of iron workpiece 128. In this manner, the heating time and temperature are related, and may also be affected by the composition and/or geometry of iron workpiece 128. For example, iron workpiece 128 may be heated to a temperature between about 650° C. and about 900° C. for between about 2 hours and about 10 hours, after which the iron workpiece 128 may be quenched to room temperature by a quenching medium, such as water, ice water, oil, or brine.

In addition to heating iron workpiece 128, nitridizing and carbonizing iron workpiece 128 (114) includes exposing iron workpiece 128 to atomic nitrogen and atomic carbon, which diffuse into iron workpiece 128. In some examples, the atomic nitrogen and atomic carbon may be supplied from urea ($CO(NH_2)_2$). The nitrogen and carbon may be supplied in a gas phase alone (e.g., substantially pure urea gas) or as a mixture with a carrier gas. In some examples, the carrier gas is argon (Ar).

Regardless of the technique used to nitridize and carbonize iron workpiece 128 (114), the nitrogen and carbon may be diffused into iron workpiece 128 to a collective concentration of nitrogen and carbon between about 8 atomic percent (at. %) and about 14 at. %, such as about 11 at. %. The concentration of nitrogen and carbon in iron may be an average concentration, and may vary throughout the volume of iron workpiece 128. In some examples, the atomic ratio of iron to the combination of nitrogen plus carbon is between about 11.5:1 (iron:nitrogen+carbon) and about 5.65:1 (iron:nitrogen+carbon). For example, the atomic ratio of iron to the combination of nitrogen and carbon may be about 9:1 (iron:nitrogen+carbon), about 8:1 (iron:nitrogen+carbon), or about 6.65:1 (iron:nitrogen+carbon).

In some examples, once iron workpiece 128 has been nitridized (114), iron workpiece 128 may be annealed at a temperature for a time to facilitate diffusion of the nitrogen and carbon atoms into appropriate interstitial spaces within the iron lattice to form $\alpha''\text{-}Fe_{16}(N_xC_{1-x})_2$ or a mixture of $\alpha''\text{-}Fe_{16}N_2$ and $\alpha''\text{-}Fe_{16}C_2$ (116). In some examples, the nitridized and carbonized iron workpiece 128 may be annealed at a temperature between about 100° C. and about 210° C. The nitridized and carbonized iron workpiece 128 may be annealed using crucible heating stage 126, a plasma arc lamp, a radiation heat source, such as an infrared heat lamp, an oven, or a closed retort.

The annealing process may continue for a predetermined time that is sufficient to allow diffusion of the nitrogen and carbon atoms to the appropriate interstitial spaces. In some examples, the annealing process continues for between about 5 hours and about 100 hours, such as between about 40 hours and about 80 hours. In some examples, the annealing process may occur under an inert atmosphere, such as Ar, to reduce or substantially prevent oxidation of the iron. In some implementations, while iron workpiece 128 is annealed (116) the temperature is held substantially constant. The resulting material may include $\alpha''\text{-}Fe_{16}(N_xC_{1-x})_2$ or a mixture of $\alpha''\text{-}Fe_{16}N_2$ and $\alpha''\text{-}Fe_{16}C_2$. A similar technique may be used to form a material including $Fe_{16}(N_xZ_{1-x})_2$ or a mixture of $\alpha''\text{-}Fe_{16}N_2$ and $\alpha''\text{-}Fe_{16}Z_2$, where Z is at least one of B or O.

Figure 10:
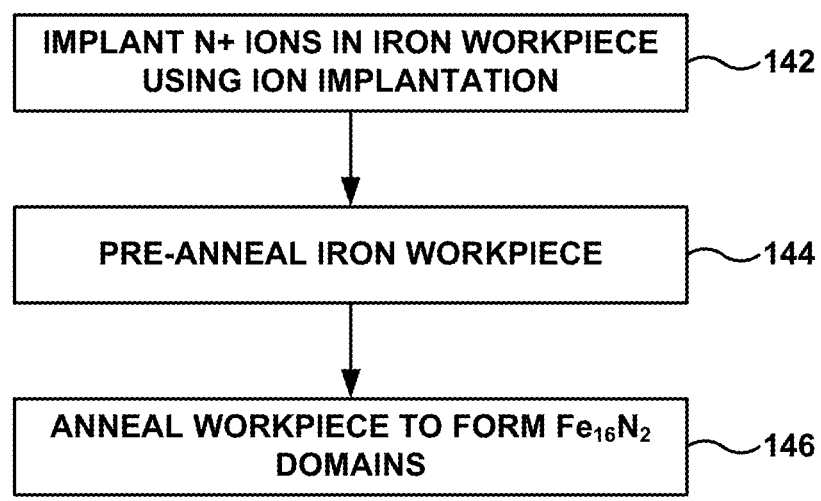
FIG. 10 is a flow diagram that illustrates an example technique for forming a magnetic material including $\alpha''\text{-Fe}_{16}(N_xZ_{1-x})_2$ or a mixture of $\alpha''\text{-Fe}_{16}N_2$ and $\alpha''\text{-Fe}_{16}Z_2$, where Z includes at least one of C, B, or O.

FIG. 10 is a flow diagram illustrating an example technique for forming a magnetic material including $Fe_{16}(N_xZ_{1-x})_2$ or a mixture of $\alpha''\text{-}Fe_{16}N_2$ and $\alpha''\text{-}Fe_{16}Z_2$, where Z is at least one of C, B, or O using ion implantation. The technique of FIG. 10 will be described with Z being carbon atoms. A similar technique may be used to form a material including $Fe_{16}(N_xZ_{1-x})_2$ or a mixture of $\alpha''\text{-}Fe_{16}N_2$ and $\alpha''\text{-}Fe_{16}Z_2$, where Z is at least one of B or O.

The technique shown in FIG. 10 includes implanting N+ and C+ ions in an iron workpiece using ion implantation (142). The iron workpiece may include a plurality of iron crystals. In some examples, the plurality of iron crystals may have crystal axes oriented in substantially the same direction. For example, a major surface of the iron workpiece may be parallel to the (110) surfaces of all or substantially all of the iron crystals. In other examples, a major surface of the iron workpiece may be parallel to another surface of all or substantially all of the iron crystals. By using a workpiece in which all or substantially all of the iron crystals have substantially aligned crystal axes, anisotropy formed when forming the $Fe_{16}(N_xC_{1-x})_2$ or a mixture of $\alpha''\text{-}Fe_{16}N_2$ and $\alpha''\text{-}Fe_{16}C_2$ phases may be substantially aligned.

In some examples, workpieces include a dimension that is longer, e.g., much longer, than other dimensions of the workpiece. Example workpieces with a dimension longer than other dimensions include fibers, wires, filaments, cables, films, thick films, foils, ribbons, sheets, or the like. In other examples, workpieces may not have a dimension that is longer than other dimensions of the workpiece. For example, workpieces can include grains or powders, such as spheres, cylinders, flecks, flakes, regular polyhedra, irregular polyhedra, and any combination thereof. Examples of suitable regular polyhedra include tetrahedrons, hexahedrons, octahedron, decahedron, dodecahedron and the like, non-limiting examples of which include cubes, prisms, pyramids, and the like.

In some examples of the technique of FIG. 10, the workpiece includes a foil. The workpiece may define a thickness on the order of hundreds of nanometers to millimeters. In some examples, the iron workpiece may define a thickness between about 500 nanometers (nm) and about 1 millimeter (mm) The thickness of the iron workpiece may affect the parameters used for ion implantation and annealing of the workpiece, as will be described below. The thickness of the workpiece may be measured in a direction substantially normal to a surface of the substrate to which the workpiece is attached.

Prior to implantation of N+ and C+ ions in the iron workpiece, the iron workpiece may be positioned on a surface of a silicon substrate or a gallium arsenide (GaAs) substrate. In some examples, the iron workpiece may be position on the (111) surface of a (single crystal) silicon substrate, although any crystalline orientation may be used. In some examples, the iron workpiece may be attached to the surface of the substrate at this time.

The average depth to which the N+ and C+ ions are implanted in the iron workpiece may depend upon the energy to which the N+ ions are accelerated. For each implant energy, N+ and C+ ions are implanted within the iron workpiece in a range depths surrounding the average implant depth.

The implant energy used to implant the N+ and C+ ions may be selected based at least in part on the thickness of the iron workpiece. The implant energy also may be selected to implant the N+ and C+ ions without doing overly significant damage to the iron workpiece, including the crystal lattice of the iron crystals in the iron workpiece. For example, while higher implant energies may allow implantation of the N+ and C+ ions at a greater average depth, higher implant energies may increase the damage to the iron workpiece, including damaging the crystal lattice of the iron crystals and ablating some of the iron atoms due to the impact of the N+ ions. Hence, in some examples, the implant energy may be limited to be below about 180 keV. In some examples, the incident angle of implantation may be about zero degrees (e.g., substantially perpendicular to the surface of the iron workpiece). In other examples, the incident angle of implantation may be adjusted to reduce lattice damage. For example, the incident angle of implantation may be between about 3° and about 7° from perpendicular.

As an example, when the iron workpiece defines a thickness of about 500 nm, an implant energy of about 100 keV may be used to implant the N+ and C+ ions in the iron workpiece. An implant energy of about 100 keV may also be used to implant the N+ and C+ ions in iron workpieces of other thicknesses. In other examples, a different implant energy may be used for iron workpieces defining a thickness of about 500 nm, and the same or different implant energy may be used for workpieces defining a thickness different than 500 nm.

Additionally, the fluency of N+ and C+ ions may be selected to implant a desired dose of N+ and C+ ions within the iron workpiece. In some examples, the fluency of N+ and C+ ions may be selected to implant approximately stoichiometric number of N+ ions within the iron workpiece. The stoichiometric ratio of iron to nitrogen in $\alpha''\text{-Fe}_{16}N_2$, iron to carbon in $\alpha''\text{-Fe}_{16}C_2$, and iron to nitrogen plus carbon in $\alpha''\text{-Fe}_{16}(N_xC_{1-x})_2$ is 8:1. Thus, the approximate number of iron atoms in the iron workpiece may be determined, and a number of N+ and C+ ions equal to approximately ⅛ (12.5%) of the iron atoms may be implanted in the iron workpiece, such as between about 8 at. % and about 15 at. %. For example, an iron workpiece having measurements of about 1 cm by 1 cm by 500 nm may include about $4.23 \times 10^{18}$ iron atoms. Thus, to achieve a stoichiometric ratio of iron atoms to N+ ions in the iron workpiece, about $5.28 \times 10^{17}$ N+ ions may be implanted in the sample. The ratio of N+ ions to C+ ions also may be controlled to be about 1:1, or about 4.667:5.333.

The temperature of the iron workpiece during the ion implantation also may be controlled. In some examples, the temperature of the iron workpiece may be between about room temperature and about 500° C.

Once the N+ and C+ ions have been implanted in the iron workpiece (142), the iron workpiece may be subjected to a first annealing step (144), which may be referred to as a pre-annealing step. The pre-annealing step may accomplish multiple functions, including, for example, securely attaching the iron workpiece to the substrate. As described below, secure attachment of the iron workpiece to the substrate allows the post-annealing step to generate stress in the iron workpiece, facilitating the transformation of the crystalline structure of at least some of the crystals in the iron workpiece from body centered cubic (bcc) iron to body centered tetragonal (bct) iron nitride. In some examples, the pre-annealing step also may activate the implanted N+ and C+ ions, repair damage to the iron crystals' lattices due to the ion implantation procedure, and/or remove any oxygen in the workpiece. In some examples, the pre-annealing step may be performed at a temperature between about 450° C. and about 550° C. for between about 30 minutes and about 4 hours. As an example, the pre-annealing step may be performed at a temperature of about 500° C. for between about 30 minutes and about 1 hour.

In some examples, in addition to heating the iron workpiece and the substrate, the pre-annealing step may include applying an external force between about 0.2 gigapascals (GPa) and about 10 GPa between the iron workpiece and the substrate. The external force may assist bonding of the iron workpiece and the substrate.

The atmosphere in which the pre-annealing step is performed may include, for example, nitrogen, argon, and/or hydrogen, such as a mixture of about 4 vol. % hydrogen, about 10 vol. % nitrogen, and about 86 vol. % argon. The composition of the atmosphere may assist with removing oxygen from the workpiece and cleaning surfaces of the workpiece.

Following the pre-annealing step (144), the iron workpiece including implanted N+ and C+ ions and the substrate may be exposed to a second annealing step (146), which may be referred to as a post-annealing step. The post-annealing step may be carried out at a temperature that produces strain in the iron workpiece due to differences in the coefficients of thermal expansion for the substrate and the iron workpiece and that accesses the $\alpha''\text{-Fe}_{16}(N_xC_{1-x})_2$ or a mixture of $\alpha''\text{-Fe}_{16}N_2$ and $\alpha''\text{-Fe}_{16}C_2$ phases. Additionally, the post-annealing step allows diffusion of N+ and C+ ions iron crystals to form $\alpha''\text{-Fe}_{15}(N_xC_{1-x})_2$ or a mixture of $\alpha''\text{-Fe}_{16}N_2$ and $\alpha''\text{-Fe}_{16}C_2$ phases. The post-annealing step may be carried out at a temperature and for a time described herein with respect to other annealing steps for forming $\alpha''\text{-Fe}_{16}(N_xC_{1-x})_2$ or a mixture of $\alpha''\text{-Fe}_{16}N_2$ and $\alpha''\text{-Fe}_{16}C_2$ phases.

Figure 11:
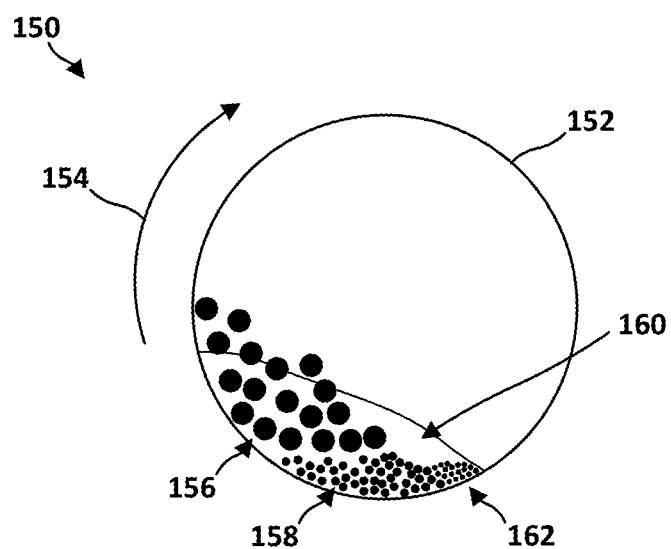
FIG. 11 is a conceptual diagram illustrating a milling apparatus that may be used to mill an iron-containing raw material with a nitrogen source and/or a carbon source.

FIG. 11 is a conceptual diagram illustrating a first milling apparatus that may be used to mill an iron-containing raw material with a nitrogen source and a carbon source to form a material including iron, carbon, and nitrogen, which may be annealed to form $\alpha''\text{-Fe}_{16}(N_xC_{1-x})_2$ or a mixture of $\alpha''\text{-Fe}_{16}N_2$ and $\alpha''\text{-Fe}_{16}C_2$ phases. The technique of FIG. 11 will be described with Z being carbon atoms. A similar technique may be used to form a material including $\text{Fe}_{16}(N_xZ_{1-x})_2$ or a mixture of $\alpha''\text{-Fe}_{16}N_2$ and $\alpha''\text{-Fe}_{16}Z_2$, where Z is at least one of B or O.

Milling apparatus 150 may be operated in rolling mode, in which the bin 152 of milling apparatus 150 rotates about a horizontal axis, as indicated by arrow 154. As bin 152 rotates, milling spheres 156 move within bin 152 and, over time, crush iron-containing raw material 158. In addition to iron-containing raw material 158 and milling spheres 156, bin 152 encloses a mixture 160 including nitrogen source and a carbon source.

In the example illustrated in FIG. 11, milling spheres 156 may include a sufficiently hard material that, when contacting iron-containing raw material 158 with sufficient force, will wear iron-containing raw material 158 and cause particles of iron-containing raw material 158 to, on average, have a smaller size. In some examples, milling spheres 156 may be formed of steel, stainless steel, or the like. In some examples, the material from which milling spheres 156 are formed may not chemically react with iron-containing raw material 158 and/or mixture 160. In some examples, milling spheres 156 may have an average diameter between about 5 millimeters (mm) and about 20 mm.

Iron-containing raw material 158 may include any material containing iron, including atomic iron, iron oxide, iron chloride, or the like. In some examples, iron-containing raw material 158 may include substantially pure iron (e.g., iron with less than about 10 atomic percent (at. %) dopants or impurities). In some examples, the dopants or impurities may include oxygen or iron oxide. Iron-containing raw material 158 may be provided in any suitable form, including, for example, a powder or relatively small particles. In some examples, an average size of particles in iron containing raw material 158 may be less than about 100 micrometers (μm).

Mixture 160 may include a nitrogen source and a carbon source. The nitrogen source and carbon source may include any sources of nitrogen and carbon described herein, including hydrazine, an amide, urea, ammonia, ammonium nitrate, or the like for a nitrogen source; and urea, carbon monoxide, carbon dioxide, methane, or the like for a carbon source.

In some examples, bin 152 also may enclose a catalyst 162. Catalyst 162 may include, for example, cobalt (Co) particles and/or nickel (Ni) particles. Catalyst 162 catalyzes the nitriding of the iron-containing raw material 158. One possible conceptualized reaction pathway for nitriding iron using a Co catalyst is shown in Reactions 1-3, below. A similar reaction pathway may be followed when using Ni as the catalyst 162.

Reaction 1

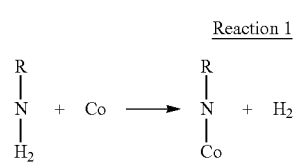

-continued

Reaction 2

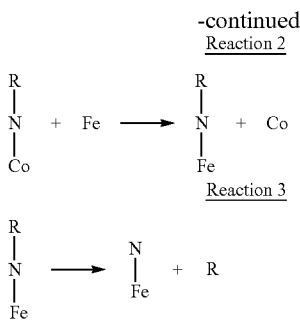

Reaction 3

Hence, by mixing sufficient amide and catalyst 162, iron-containing raw material 18 may be converted to iron nitride containing material.

Bin 152 of milling apparatus 150 may be rotated at a rate sufficient to cause mixing of the components in bin 152 (e.g., milling spheres 156, iron-containing raw material 158, mixture 160, and catalyst 162 (if present)) and cause milling spheres 156 to mill iron-containing raw material 158. In some examples, bin 152 may be rotated at a rotational speed of about 500 revolutions per minute (rpm) to about 2000 rpm, such as between about 600 rpm and about 650 rpm, about 600 rpm, or about 650 rpm. Further, to facilitate milling of iron-containing raw material 158, in some examples, the mass ratio of the total mass of milling spheres 156 to the total mass of iron-containing raw material 158 may be about 20:1. Milling may be performed for a predetermined time selected to allow nitriding and carbonizing of iron-containing raw material 158 and milling of iron-containing raw material 158 (and nitridized and carbonized iron containing material) to a predetermined size distribution. In some examples, milling may be performed for a time between about 1 hour and about 100 hours, such as between about 1 hour and about 20 hours, or about 20 hours. In some examples, the milling apparatus 150 may be stopped for about 10 minutes after each 10 hours of milling to allow milling apparatus 150, iron-containing raw material 158, mixture 160, and catalyst 162 to cool.

In other examples, the milling process may be performed using a different type of milling apparatus, such as a stirring mode milling apparatus or a vibration mode milling apparatus.

Regardless of the type of milling used to form powder including iron, carbon, and nitrogen, the resulting powder may include iron, carbon, and nitrogen. Milling an iron-containing raw material in the presence of a nitrogen source and a carbon source may be a cost-effective technique for forming an iron-carbon-nitrogen containing powder. Further, milling an iron-containing raw material in the presence of a nitrogen source and a carbon source may facilitate mass production of iron-carbon-nitrogen containing powder, and may reduce iron oxidation. The resulting iron-carbon-nitrogen containing powder then may be annealed while straining, e.g., as described above with respect to FIGS. 7-9, to form $\alpha''\text{-Fe}_{16}(N_xC_{1-x})_2$ or a mixture of $\alpha''\text{-Fe}_{16}N_2$ and $\alpha''\text{-Fe}_{16}C_2$.

In some examples, instead of using milling apparatus 150 to form a powder including iron, nitrogen, and carbon, milling apparatus 150 may instead be used to form a first powder including iron and nitrogen by milling an iron-containing raw material 158 in the presence of a nitrogen source. This powder then may be annealed to form at least one $\alpha''\text{-Fe}_{16}N_2$ phase domain. Milling apparatus 150 also may be used to form a second powder including iron and carbon by milling an iron-containing raw material 158 in the presence of a carbon source. This powder then may be annealed to form at least one $\alpha''\text{-Fe}_{16}C_2$ phase domain. The powder including at least one $\alpha''\text{-Fe}_{16}N_2$ phase domain and the powder including at least one $\alpha''\text{-Fe}_{16}C_2$ phase domain then may be consolidates, e.g., using an adhesive, sintering, shock compression, or the like to form a magnetic material as illustrated in FIG. 2.

In some examples, an iron-carbon-nitrogen containing material may be melted and continuously casted, pressed, and quenched to form workpieces containing $\alpha''\text{-Fe}_{16}(N_xC_{1-x})_2$ or a mixture of $\alpha''\text{-Fe}_{16}N_2$ and $\alpha''\text{-Fe}_{16}C_2$. In some examples, the workpieces may have a dimension in one or more axis between about 0.001 mm and about 50 mm. For example, in some examples in which the workpieces include ribbons, the ribbons may have a thickness between about 0.001 mm and about 5 mm. As another example, in some examples in which the workpieces include wires, the wires may have a diameter between about 0.1 mm and about 50 mm. The workpieces then may be strained and post-annealed to form $\alpha''\text{-Fe}_{16}(N_xC_{1-x})_2$ or a mixture of $\alpha''\text{-Fe}_{16}N_2$ and $\alpha''\text{-Fe}_{16}C_2$. In some examples, these workpieces $\alpha''\text{-Fe}_{16}(N_xC_{1-x})_2$ or a mixture of $\alpha''\text{-Fe}_{16}N_2$ and $\alpha''\text{-Fe}_{16}C_2$ then may be joined with other workpieces including $\alpha''\text{-Fe}_{16}(N_xC_{1-x})_2$ or a mixture of $\alpha''\text{-Fe}_{16}N_2$ and $\alpha''\text{-Fe}_{16}C_2$ a larger material.

Figure 12:
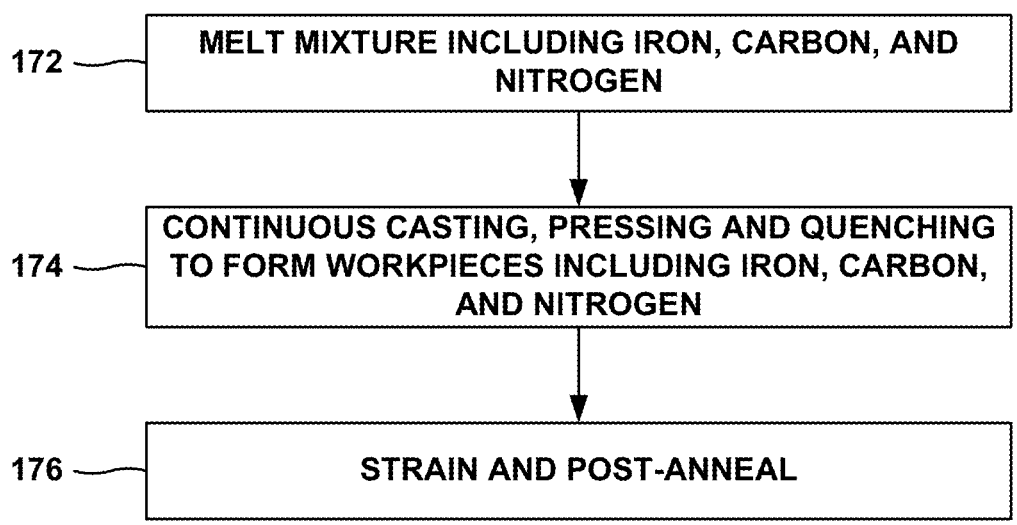
FIG. 12 is a flow diagram of an example technique for forming a workpiece including $\alpha''\text{-Fe}_{16}(N_xC_{1-x})_2$ or a mixture of $\alpha''\text{-Fe}_{16}N_2$ and $\alpha''\text{-Fe}_{16}C_2$.

FIG. 12 is a flow diagram of an example technique for forming a workpiece including $\alpha''\text{-Fe}_{16}(N_xC_{1-x})_2$ or a mixture of $\alpha''\text{-Fe}_{16}N_2$ and $\alpha''\text{-Fe}_{16}C_2$. The technique of FIG. 11 will be described with Z being carbon atoms. A similar technique may be used to form a material including $\text{Fe}_{16}(N_xZ_{1-x})_2$ or a mixture of $\alpha''\text{-Fe}_{16}N_2$ and $\alpha''\text{-Fe}_{16}Z_2$, where Z is at least one of B or O.

The technique illustrated in FIG. 12 includes melting a mixture including iron, carbon nitrogen to form a molten iron nitride-containing mixture (172). The mixture including iron, carbon, and nitrogen may include, for example, an atomic ratio of iron to nitrogen plus carbon of between about 11.5:1 (iron:nitrogen+carbon) and about 5.65:1 (iron:nitrogen+carbon). For example, the atomic ratio of iron to the combination of nitrogen and carbon may be about 9:1 (iron:nitrogen+carbon), about 8:1 (iron:nitrogen+carbon), or about 6.65:1 (iron:nitrogen+carbon). For example, the mixture may include between about 8 atomic percent (at. %) and about 15 at. % of the combination of nitrogen and carbon, with a balance iron, other elements, and dopants. As another example, the mixture may include between about 10 at. % and about 13 at. % of the combination of nitrogen and carbon, or about 11.1 at. % of the combination of nitrogen and carbon.

In some examples, the mixture including iron and nitrogen may have a purity (e.g., collective iron and nitrogen content) of at least 92 atomic percent (at. %).

In some examples, melting the mixture including iron, carbon, and nitrogen to form a molten mixture (172) may include heating the mixture including iron, carbon, and nitrogen at a temperature above about 1500° C. In some examples, the mixture including iron, carbon, and nitrogen may be heated in a furnace using a radio frequency (RF) induction coil. In other examples, the mixture including iron, carbon, and nitrogen may be heated in a furnace using a low or mid-frequency induction coil. In some examples, the furnace may be heated at a temperature greater than about 1600° C., or at a temperature greater than about 2000° C. In some examples, the mixture including iron and nitrogen may be heated under an ambient atmosphere.

Once the mixture including iron, carbon, and nitrogen is molten, the mixture may be subjected to a casting, quenching, and pressing process to form workpieces including iron, carbon, and nitrogen (174). In some examples, the casting, quenching, and pressing process may be continuous, as opposed to a batch process. The molten mixture including iron, carbon, and nitrogen may be deposited in a mold, which may shape the mixture including iron, carbon, and nitrogen into a predetermined shape, such as at least one wire, ribbon, or other article having length that is greater than its width or diameter. During the casting process, the temperature of the mold may be maintained at a temperature between about 650° C. and about 1200° C., depending on the casting speed. In some examples, during the casting process, the temperature of the mold may be maintained at a temperature between about 800° C. and about 1200° C. The casting process can be conducted in air, a nitrogen environment, an inert environment, a partial vacuum, a full vacuum, or any combination thereof. The casting process can be at any pressure, for example, between about 0.1 GPa and about 20 GPa. In some examples, the casting process can be assisted by a straining field, a temperature field, a pressure field, a magnetic field, an electrical field, or any combination thereof.

After casting is complete or while the casting process is being completed, the mixture including iron, carbon, and nitrogen may be quenched to set the crystalline structure and phase composition of the material. In some examples, during the quenching process, the workpiece may be heated to a temperature above 650° C. for between about 0.5 hour and about 20 hours. In some examples, the temperature of the workpiece may be dropped abruptly below the martensite temperature of the workpiece alloy (Ms). For example, for $Fe_{16}N_2$, the martensite temperature (Ms) is about 250° C. The medium used for quenching can include a liquid, such as water, brine (with a salt concentration between about 1% and about 30%), a non-aqueous liquid or solution such as an oil, or liquid nitrogen. In other examples, the quenching medium can include a gas, such as nitrogen gas with a flow rate between about 1 sccm and about 1000 sccm. In other examples, the quenching medium can include a solid, such as salt, sand, or the like. In some examples, the workpieces including iron, carbon, and nitrogen may be cooled at a rate of greater than 50° C. per second during the quenching process. In some examples, the casting process can be assisted by a magnetic field and/or an electrical field.

After quenching is complete, the material including iron, carbon, and nitrogen may be pressed to achieve the predetermined size of the material. During the pressing process, the temperature of the material may be maintained below about 250° C., and the material may be exposed to a pressure between about 5 tons and 50 tons, depending on the desired final dimension (e.g., thickness or diameter) of the material. When the pressing process is complete, the material including iron, carbon, and nitrogen may be in the shape of a workpiece with a dimension in one or more axis between about 0.001 mm and about 50 mm (e.g., a diameter between about 0.1 mm and about 50 mm for a wire or a thickness between about 0.001 mm and about 5 mm for a ribbon).

The technique illustrated in FIG. 12 further includes straining and post-annealing the workpiece including iron, carbon, and nitrogen (176). The straining and post-annealing process may convert at least some of the iron, carbon, and nitrogen mixture to $\alpha''\text{-}Fe_{16}(N_xC_{1-x})_2$ phase domains or a mixture of $\alpha''\text{-}Fe_{16}N_2$ and $\alpha''\text{-}Fe_{16}Z_2$ phase domains. A strain inducing apparatus may strain the workpiece to a certain elongation. For example, the strain on the workpiece may be between about 0.3% and about 12%. In other examples, the strain on the workpiece may be less than about 0.3% or greater than about 12%. In some examples, exerting a certain strain on the workpiece may result in a substantially similar strain on individual unit cells of the iron, such that the unit cell is elongated along the <001> axis between about 0.3% and about 12%.

While the workpiece including iron, carbon, and nitrogen is strained, the workpiece may be heated to anneal the workpiece. The workpiece including iron, carbon, and nitrogen may be annealed by heating the workpiece to a temperature in any of the ranges listed herein for a time in any of the time ranges listed herein. Annealing the workpiece including iron, carbon, and nitrogen while straining the workpiece may facilitate conversion of at least some of the iron, carbon, and nitrogen to $\alpha''\text{-}Fe_{16}(N_xC_{1-x})_2$ or a mixture of $\alpha''\text{-}Fe_{16}N_2$ and $\alpha''\text{-}Fe_{16}C_2$.

In other examples, a workpiece including $\alpha''\text{-}Fe_{16}(N_xZ_{1-x})_2$ or a mixture of $\alpha''\text{-}Fe_{16}N_2$ and $\alpha''\text{-}Fe_{16}Z_2$, where Z includes at least one of C, B, or O, and where x is greater than zero and less than one may be formed using sputtering. In sputtering, atoms from a sputtering target are ejected from the sputtering target due to bombardment of the sputtering target with energetic particles. The ejected atoms then deposit over a substrate in a coating.

The substrate over which the coating including iron, carbon, and nitrogen is formed may include any material over which the coating may be formed. For example, the substrate may include a semiconductor, such as silicon, GaAs, InGaAs, or the like. In other examples, the substrate may include another material, such as a glass, SiC, MgO, $SiO_2$ (e.g., a layer of $SiO_2$ on a Si or other semiconductor substrate), or the like. In some examples, the substrate may include a single crystal structure that can generate biaxial strain on the deposited film, such as silicon, GaAs, MgO, NaCl, Ge, SiC, or the like.

In some examples, the sputtering target may include iron and carbon. For example, sputtering target may include a carbon concentration of between about 1 at. % and about 10 at. %, with a balance of iron. The sputtering target may be the source of iron and nitrogen in the coating.

During the sputtering process, a nitrogen plasma may be generated. The nitrogen plasma may be the source of nitrogen in the coating.

Once the coating has been formed to a predetermined thickness, the coating may be annealed to transform at least some of the iron, carbon, and nitride mixture in the coating to at least one of $\alpha''\text{-}Fe_{16}(N_xC_{1-x})_2$ or a mixture of $\alpha''\text{-}Fe_{16}N_2$ and $\alpha''\text{-}Fe_{16}C_2$. The annealing technique may be similar to or substantially the same as that described above with respect to FIG. 3. The mismatch of coefficients of thermal expansion between the coating and the substrate may strain the coating, which may facilitate formation of at least one of $\alpha''\text{-}Fe_{16}(N_xC_{1-x})_2$ or a mixture of $\alpha''\text{-}Fe_{16}N_2$ and $\alpha''\text{-}Fe_{16}C_2$.

Although the preceding description has primarily described devices including magnetic materials that include $\alpha''\text{-}Fe_{16}(N_xZ_{1-x})_2$ or a mixture of $\alpha''\text{-}Fe_{16}N_2$ and $\alpha''\text{-}Fe_{16}Z_2$, in some examples, the magnetic materials may additionally or alternatively include $\alpha'\text{-}Fe_8(N_xZ_{1-x})$ or a mixture of $\alpha'\text{-}Fe_8N$ and $\alpha'\text{-}Fe_8Z$.

Clause 1: A magnetic material comprising: at least one $\alpha''\text{-}Fe_{16}(N_xZ_{1-x})_2$ phase domain, wherein Z includes at least one of C, B, or O, and wherein x is a number greater than zero and less than one.

Clause 2: The magnetic material of clause 1, wherein x is equal to about 0.5.

Clause 3: The magnetic material of clause 1 or 2, wherein Z consists of C.

Clause 4: The magnetic material of any one of clauses 1 to 3, further comprising at least one of an $\alpha''$-$Fe_{16}N_2$ phase domain or an $\alpha''$-$Fe_{16}Z_2$ phase domain.

Clause 5: The magnetic material of any one of clauses 1 to 4, comprising a saturation magnetization of at least about 219 emu/gram.

Clause 6: The magnetic material of any one of clauses 1 to 4, comprising a saturation magnetization of greater than about 242 emu/gram.

Clause 7: The magnetic material of any one of clauses 1 to 4, comprising a saturation magnetization of greater than about 250 emu/gram.

Clause 8: The magnetic material of any one of clauses 1 to 7, comprising a magnetic coercivity of less than or equal to about 10 Oerstads.

Clause 9: The magnetic material of any one of clauses 1 to 8, wherein at least about 35 volume percent of the magnetic material is the at least one $\alpha''$-$Fe_{16}(N_xZ_{1-x})_2$ phase domain.

Clause 10: The magnetic material of any one of clauses 1 to 8, wherein at least about 40 volume percent of the magnetic material is the at least one $\alpha''$-$Fe_{16}(N_xZ_{1-x})_2$ phase domain.

Clause 11: The magnetic material of any one of clauses 1 to 8, wherein at least about 50 volume percent of the magnetic material is the at least one $\alpha''$-$Fe_{16}(N_xZ_{1-x})_2$ phase domain.

Clause 12: The magnetic material of any one of clauses 1 to 8, wherein at least about 60 volume percent of the magnetic material is the at least one $\alpha''$-$Fe_{16}(N_xZ_{1-x})_2$ phase domain.

Clause 13: The magnetic material of any one of clauses 1 to 12, wherein the at least one $\alpha''$-$Fe_{16}(N_xZ_{1-x})_2$ phase domain comprises a plurality of $\alpha''$-$Fe_{16}(N_xZ_{1-x})_2$ crystals, and wherein respective [001] axes of the plurality of crystals are randomly distributed within the magnetic material.

Clause 14: A magnetic material comprising: at least one $\alpha''$-$Fe_{16}N_2$ phase domain; and at least one $\alpha''$-$Fe_{16}Z_2$ phase domain, wherein Z includes at least one of C, B, or O.

Clause 15: The magnetic material of clause 14, wherein the at least one $\alpha''$-$Fe_{16}N_2$ phase domain comprises a first layer comprising at least one $\alpha''$-$Fe_{16}N_2$ phase domain, wherein the $\alpha''$-$Fe_{16}Z_2$ phase domain comprises a second layer comprising at least one $\alpha''$-$Fe_{16}Z_2$ phase domain, and wherein the first layer and the second layer are adjacent to each other.

Clause 16: The magnetic material of clause 14, wherein the at least one $\alpha''$-$Fe_{16}N_2$ phase domain comprises a first set of layers, each layer of the first set of layers comprising at least one $\alpha''$-$Fe_{16}(N_2)$ phase domain, wherein the $\alpha''$-$Fe_{16}Z_2$ phase domain comprises a second set of layers, each layer of the second set of layers comprising at least one $\alpha''$-$Fe_{16}Z_2$ phase domain, and wherein one or more respective layers of the first set of layers alternate with one or more respective layers of the second set of layers.

Clause 17: The magnetic material of any one of clauses 14 to 16, wherein the at least one $\alpha''$-$Fe_{16}N_2$ phase domain comprises a plurality of $\alpha''$-$Fe_{16}N_2$ crystals, wherein the at least one $\alpha''$-$Fe_{16}Z_2$ phase domain comprises a plurality of $\alpha''$-$Fe_{16}Z_2$ crystals and wherein respective [001] axes of the plurality of $\alpha''$-$Fe_{16}N_2$ crystals and respective [001] axes of the plurality of $\alpha''$-$Fe_{16}Z_2$ crystals are randomly distributed within the magnetic material.

Clause 18: The magnetic material of any one of clauses 14 or 17, wherein Z consists of C.

Clause 19: The magnetic material of any one of clauses 14 to 18, comprising a saturation magnetization of at least about 219 emu/gram.

Clause 20: The magnetic material of any one of clauses 14 to 18, comprising a saturation magnetization of greater than about 242 emu/gram.

Clause 21: The magnetic material of any one of clauses 14 to 18, comprising a saturation magnetization of greater than about 250 emu/gram.

Clause 22: The magnetic material of any one of clauses 14 to 21, comprising a magnetic coercivity of less than or equal to about 10 Oerstads.

Clause 23: The magnetic material of any one of clauses 14 to 22, wherein the at least one $\alpha''$-$Fe_{16}N_2$ phase domain and the at least one $\alpha''$-$Fe_{16}Z_2$ phase domain together form at least about 35 volume percent of the magnetic material.

Clause 24: The magnetic material of any one of clauses 14 to 22, wherein the at least one $\alpha''$-$Fe_{16}N_2$ phase domain and the at least one $\alpha''$-$Fe_{16}Z_2$ phase domain together form at least about 40 volume percent of the magnetic material.

Clause 25: The magnetic material of any one of clauses 14 to 22, wherein the at least one $\alpha''$-$Fe_{16}N_2$ phase domain and the at least one $\alpha''$-$Fe_{16}Z_2$ phase domain together form at least about 50 volume percent of the magnetic material.

Clause 26: The magnetic material of any one of clauses 14 to 22, wherein the at least one $\alpha''$-$Fe_{16}N_2$ phase domain and the at least one $\alpha''$-$Fe_{16}Z_2$ phase domain together form at least about 60 volume percent of the magnetic material.

Clause 27: A method comprising: forming the magnetic material of any one of claims 1 to 26.

Clause 28: The method of clause 27, wherein forming the magnetic material comprises sputtering from a carbon-doped iron target to form a layer comprising iron, carbon, and nitrogen over a substrate.

Clause 29: The method of clause 28, wherein the carbon-doped iron target comprises between about 1 at. % and about 10 at. % carbon.

Clause 30: The method of clause 28 or 29, wherein sputtering comprises forming a nitrogen plasma to provide a source of nitrogen atoms.

Clause 31: The method of any one of clauses 28 to 30, further comprising annealing the layer at a temperature between about 100° C. and about 210° C. for between about 5 hours and about 100 hours.

Clause 32: The method of clause 27, wherein forming the magnetic material comprises depositing the magnetic material over a substrate using at least one of chemical vapor deposition, molecular beam epitaxy, low temperature epitaxy, liquid phase epitaxy, or ion implantation.

Clause 33: The method of clause 27, wherein forming the magnetic material comprises: straining an iron workpiece comprising at least one iron crystal in a direction substantially parallel to a <001> crystal axis of the iron crystal; nitridizing and carbonizing the iron workpiece to form a nitridized and carbonized iron wire or sheet; and annealing the nitridized and carbonized iron workpiece to form the magnetic material.

Clause 34: The method of clause 27, wherein forming the magnetic material comprises: implanting nitrogen and carbon atoms in an iron workpiece using ion implantation; pre-annealing the iron workpiece to attach the iron workpiece to a substrate; and annealing the nitridized and carbonized iron workpiece to form the magnetic material.

Clause 35: The method of clause 27, wherein forming the magnetic material comprises: heating an iron source to form a vapor comprising an iron-containing compound; depositing iron from the vapor comprising the iron-containing compound, nitrogen from a vapor comprising a nitrogen-containing compound, and at least one of carbon, boron, or oxygen from a vapor comprising the compound containing the at least one of carbon, boron, or oxygen over a substrate to form a layer comprising iron, nitrogen, and the at least one of carbon, boron, or oxygen; and annealing the layer comprising iron, nitrogen, and the at least one of carbon, boron, or oxygen to form the magnetic material.

Clause 36: The method of clause 27, wherein forming the magnetic material comprises: heating an iron source to form a vapor comprising an iron-containing compound; depositing iron from the vapor comprising the iron-containing compound and nitrogen from a vapor comprising a nitrogen-containing compound over a substrate to form a first layer comprising iron and nitrogen; heating an iron source to form a vapor comprising an iron-containing compound; depositing iron from the vapor comprising the iron-containing compound and at least one of carbon, boron, or oxygen from a vapor comprising the at least one of carbon, boron, or oxygen over the substrate to form a second layer comprising iron and the at least one of carbon, boron, or oxygen; and annealing the first layer and the second layer to form the magnetic material.

Clause 37: The method of clause 27, wherein forming the magnetic material comprises: submerging a substrate in a coating solution comprising a nitrogen-containing solvent, an iron source, and a carbon source, wherein the coating solution is saturated with the iron source at a first temperature above a liquidus temperature of an iron-carbon-nitrogen mixture to be deposited from the coating solution; cooling the coating solution to a second temperature to form a supersaturated coating solution, wherein the second temperature is below the liquidus temperature of the iron-carbon-nitrogen mixture; maintaining the substrate in the supersaturated coating solution to allow a coating comprising iron, carbon, and nitrogen to form over the substrate; and annealing the coating comprising iron, carbon, and nitrogen to form the magnetic material.

Clause 38: The method of clause 27, wherein forming the magnetic material comprises: submerging a substrate in a first coating solution comprising a nitrogen-containing solvent and an iron source, wherein the first coating solution is saturated with the iron source at a first temperature above a liquidus temperature of an iron-nitrogen mixture to be deposited from the first coating solution; cooling the first coating solution to a second temperature to form a supersaturated first coating solution, wherein the second temperature is below the liquidus temperature of the iron-nitrogen mixture; maintaining the substrate in the supersaturated first coating solution to allow a first coating comprising iron and nitrogen to form over the substrate; submerging the substrate in a second coating solution comprising a solvent, an iron source, and a compound containing at least one of carbon, boron, or oxygen, wherein the second coating solution is saturated with the iron source at a third temperature above a liquidus temperature of a mixture to be deposited from the second coating solution; cooling the second coating solution to a fourth temperature to form a supersaturated second coating solution, wherein the fourth temperature is below the liquidus temperature of the mixture; maintaining the substrate in the supersaturated second coating solution to allow a second coating comprising iron, nitrogen, and the at least one of carbon, boron, or oxygen to form over the substrate; annealing the first coating and the second coating to form the magnetic material.

Clause 39: The method of clause 27, wherein forming the magnetic material comprises: milling, in a bin of a milling apparatus, an iron-containing raw material in the presence of a nitrogen source and a source of at least one of carbon, boron, or oxygen to generate a powder including iron, nitrogen, and the at least one of carbon, boron, or oxygen; annealing the powder to form the magnetic material.

Clause 40: The method of clause 27, wherein forming the magnetic material comprises: milling, in a bin of a milling apparatus, an iron-containing raw material in the presence of a nitrogen source to generate a first powder including iron and nitrogen; annealing the first powder to form at least one phase domain including $\alpha\text{-}Fe_{16}N_2$; milling, in a bin of a milling apparatus, an iron-containing raw material in the presence of a source including at least one of carbon, boron, or oxygen to generate a second powder including iron and the at least one of carbon, boron, or oxygen; annealing the second powder to form $\alpha\text{-}Fe_{16}Z_2$, where Z includes the at least one of carbon, boron, or oxygen; and consolidating the first powder and the second powder to form the magnetic material.

EXAMPLES

Figure 13:
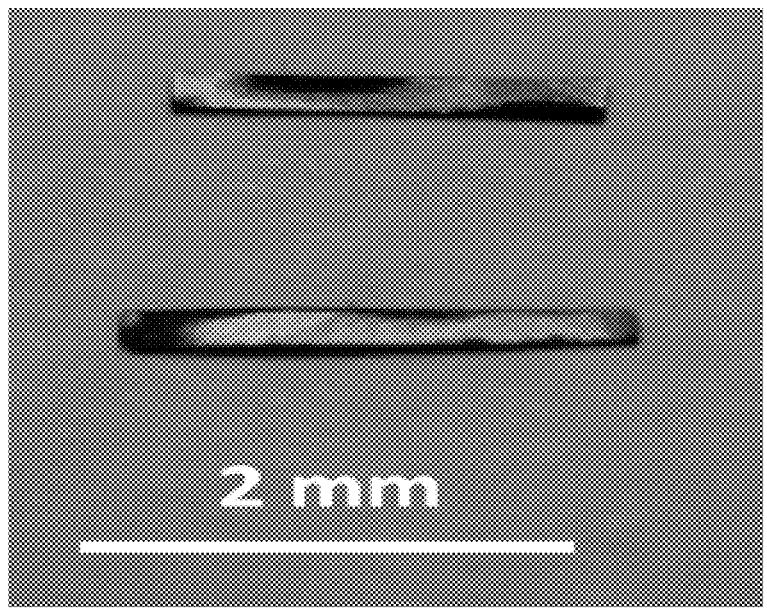
FIG. 13 is a photograph illustrating bulk samples including $\alpha''\text{-Fe}_{16}(N_xC_{1-x})_2$ phase domains.
Figure 14:
FIG. 14 is a cross-sectional micrograph illustrating the microstructure of a bulk sample including $\alpha''\text{-Fe}_{16}(N_xC_{1-x})_2$ phase domains.

Samples including $\alpha''\text{-}Fe_{16}(N_xC_{1-x})_2$ phase domains was prepared using a cold crucible technique, as described above with respect to FIGS. 7-9. FIG. 13 is a photograph illustrating the bulk samples including $\alpha''\text{-}Fe_{16}(N_xC_{1-x})_2$ phase domains. As shown in FIG. 13, the samples were rods or needles with a length of about 2 mm. FIG. 14 is a cross-sectional micrograph illustrating the microstructure of one of the bulk samples including $\alpha''\text{-}Fe_{16}(N_xC_{1-x})_2$ phase domains.

Figure 15:
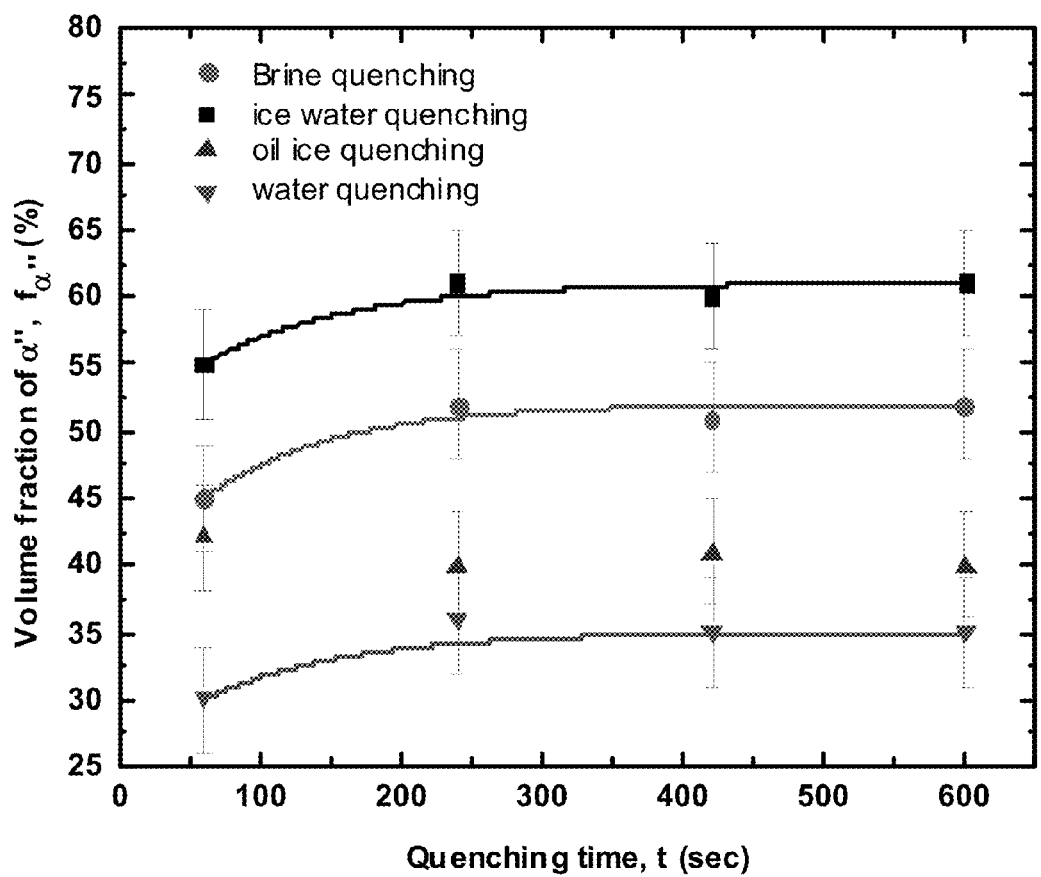
FIG. 15 is a plot of volume fraction of $\alpha''\text{-Fe}_{16}(N_xC_{1-x})_2$ phase domains in bulk samples for each of four different quenching media.

FIG. 15 is a plot of volume fraction of $\alpha''\text{-}Fe_{16}(N_xC_{1-x})_2$ phase domains in bulk samples for each of four different quenching media as a function of quenching time. To generate the results shown in FIG. 15, the samples were annealed at a temperature of about 180° C. for about 10 hours. For the samples labeled 1 (downward pointing triangles), the quenching medium was substantially pure water. For the samples labeled 2 (squares), the quenching medium was oil. For the samples labeled 3 (upward pointing triangles), the quenching medium was brine. For the samples labeled 4 (circles), the quenching medium was ice water. As shown in FIG. 15, quenching in ice water provided the highest volume fraction of $\alpha''\text{-}Fe_{16}(N_xC_{1-x})_2$ of the four quenching media tested.

Figure 16:
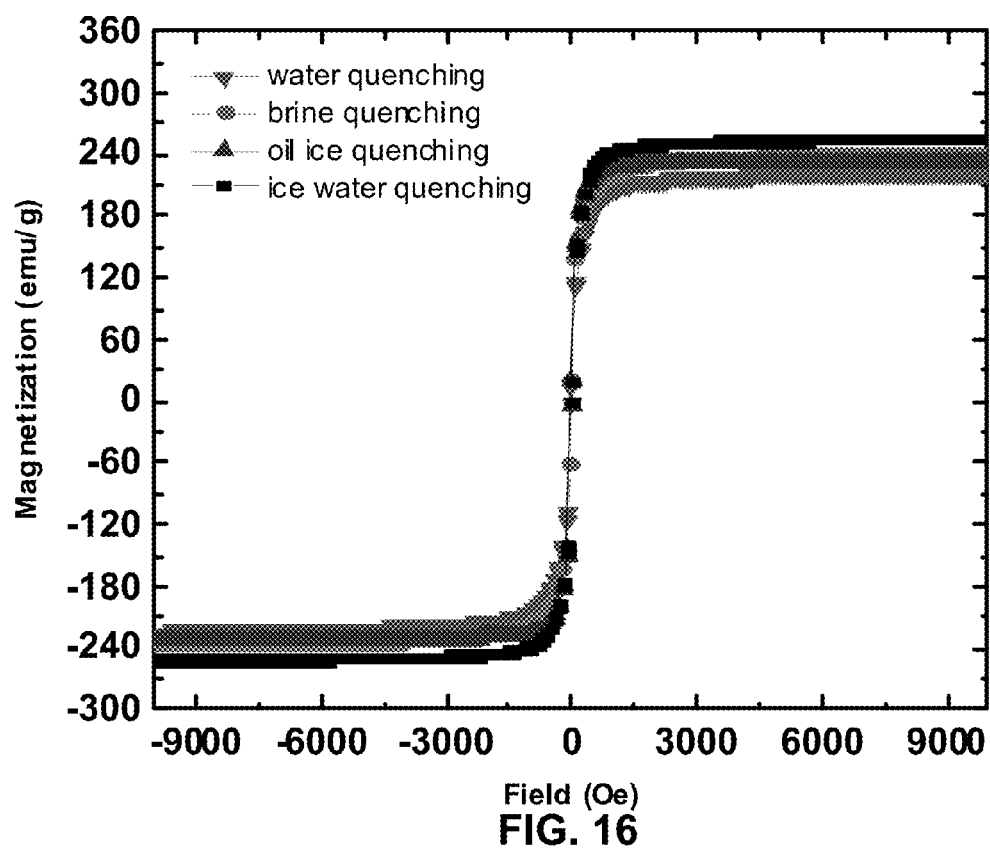
FIG. 16 is a plot of magnetization versus applied field for samples similar to those used to generate the data for FIG. 15.
Figure 17:
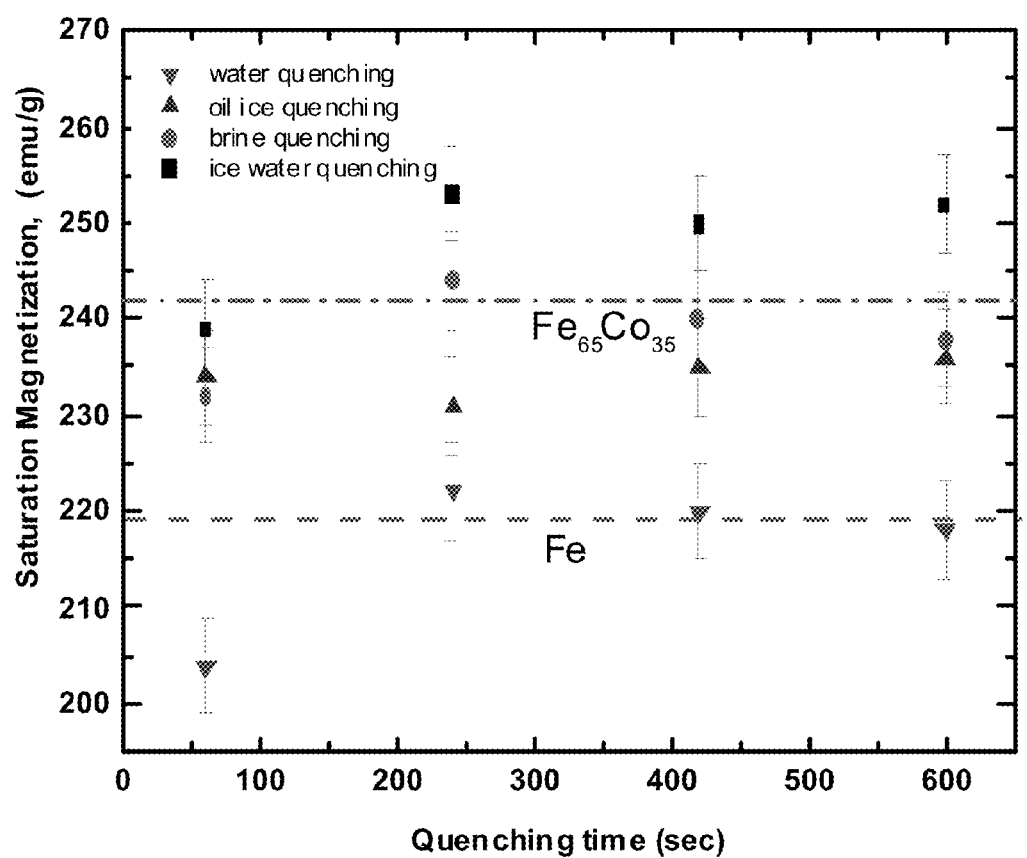
FIG. 17 is a plot of saturation magnetization versus quenching time for samples similar to those used to generate the data for FIG. 15.

FIG. 16 is a plot of magnetization versus applied field for samples similar to those used to generate the data for FIG. 15. FIG. 17 is a plot of saturation magnetization versus quenching time for samples similar to those used to generate the data for FIG. 15. As shown in FIGS. 16 and 17, each of the samples had a saturation magnetization above about 204 emu/g, and most of the samples had a saturation magnetization above about 220 emu/g. For samples quenched in ice water for greater than about 200 seconds, the saturation magnetization was above about 250 emu/g. FIG. 16 also shows that the coercivity of the samples is relatively low, near zero. Further, FIG. 16 shows that magnetic saturation was reached relatively quickly, which indicates that the samples possess relatively high permeability.

Figure 18:
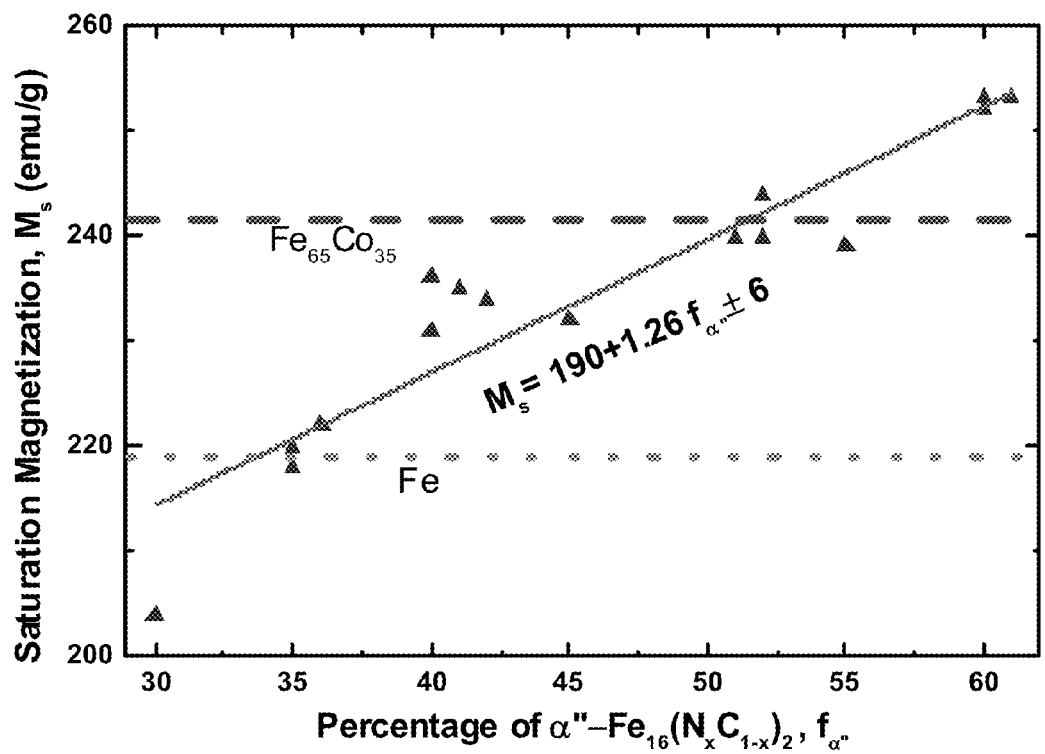
FIG. 18 is a scatter plot of saturation magnetization versus volume fraction of $\alpha''\text{-Fe}_{16}(N_xC_{1-x})_2$ phase domains in the sample.

FIG. 18 is a scatter plot of saturation magnetization versus volume fraction of $\alpha''\text{-}Fe_{16}(N_xC_{1-x})_2$ phase domains in the sample. The plot illustrated in FIG. 18 also includes a linear regression line. FIG. 18 shows that the saturation magnetization increases with increasing volume fraction of $\alpha''\text{-}Fe_{16}(N_xC_{1-x})_2$ phase domains in the sample.

When ranges are used herein for physical properties, such as molecular weight, or chemical properties, such as chemical formulae, all combinations and subcombinations of ranges for specific examples therein are intended to be included.

Various examples have been described. Those skilled in the art will appreciate that numerous changes and modifications can be made to the examples described in this disclosure and that such changes and modifications can be made without departing from the spirit of the disclosure. These and other examples are within the scope of the following claims.

The disclosure of each patent, patent application, and publication cited or described in this document are hereby incorporated herein by reference, in its entirety.

What is claimed is:

1. A soft magnetic material comprising:
at least one of an $\alpha''$-$Fe_{16}(N_xZ_{1-x})_2$ phase domain or an $\alpha'$-$Fe_8(N_xZ_{1-x})$ phase domain, wherein Z includes at least one of C, B, or O, and wherein x is a number greater than zero and less than one, wherein the at least one of the $\alpha''$-$Fe_{16}(N_xZ_{1-x})_2$ phase domain or the $\alpha'$-$Fe_8(N_xZ_{1-x})$ phase domain comprises a plurality of at least one of $\alpha''$-$Fe_{16}(N_xZ_{1-x})_2$ crystals or $\alpha'$-$Fe_8(N_xZ_{1-x})$ crystals, and wherein respective [001] axes of the plurality of crystals are randomly distributed within the soft magnetic material.

2. The soft magnetic material of claim 1, wherein x is equal to about 0.5.

3. The soft magnetic material of claim 1, wherein x is equal to about 0.4667.

4. The soft magnetic material of claim 1, wherein Z consists of C.

5. The soft magnetic material of claim 1, further comprising at least one of an $\alpha''$-$Fe_{16}N_2$ phase domain, an $\alpha''$-$Fe_{16}Z_2$ phase domain, a $\alpha'$-$Fe_8(N)$ phase domain, or an $\alpha'$-$Fe_8(Z)$ phase domain.

6. The soft magnetic material of claim 1, comprising a saturation magnetization of at least about 219 emu/gram.

7. The soft magnetic material of claim 1, comprising a magnetic coercivity of less than or equal to about 10 Oersteds.

8. The soft magnetic material of claim 1, wherein at least about 35 volume percent of the soft magnetic material is the at least one of the $\alpha''$-$Fe_{16}(N_xZ_{1-x})_2$ phase domain or the $\alpha'$-$Fe_8(N_xZ_{1-x})$ phase domain.

9. The soft magnetic material of claim 1, wherein at least about 60 volume percent of the soft magnetic material is the at least one of the $\alpha''$-$Fe_{16}(N_xZ_{1-x})_2$ phase domain or the $\alpha'$-$Fe_8(N_xZ_{1-x})$ phase domain.

10. A soft magnetic material comprising:
at least one of an $\alpha''$-$Fe_{16}N_2$ phase domain or an $\alpha'$-$Fe_8N$ phase domain; and
at least one of an $\alpha''$-$Fe_{16}Z_2$ phase domain or an $\alpha'$-$Fe_8Z$ phase domain, wherein Z includes at least one of C, B, or O, wherein the at least one of the $\alpha''$-$Fe_{16}N_2$ phase domain or the $\alpha'$-$Fe_8N$ phase domain comprises a plurality of at least one of $\alpha''$-$Fe_{16}N_2$ crystals or $\alpha'$-$Fe_8N$ crystals, wherein the at least one $\alpha''$-$Fe_{16}Z_2$ phase domain comprises a plurality of at least one of $\alpha''$-$Fe_{16}Z_2$ crystals or $\alpha'$-$Fe_8Z$ crystals and wherein respective [001] axes of the plurality of at least one of $\alpha''$-$Fe_{16}N_2$ crystals or $\alpha'$-$Fe_8N$ crystals and respective [001] axes of the plurality of at least one of $\alpha''$-$Fe_{16}Z_2$ crystals or $\alpha'$-$Fe_8Z$ crystals are randomly distributed within the soft magnetic material.

11. The soft magnetic material of claim 10, wherein the at least one of the $\alpha''$-$Fe_{16}N_2$ phase domain or the $\alpha'$-$Fe_8N$ phase domain comprises a first layer comprising the at least one of the $\alpha''$-$Fe_{16}N_2$ phase domain or the $\alpha'$-$Fe_8N$ phase domain, wherein the $\alpha''$-$Fe_{16}Z_2$ phase domain comprises a second layer comprising the at least one of the $\alpha''$-$Fe_{16}Z_2$ phase domain or the $\alpha'$-$Fe_8Z$ phase domain, and wherein the first layer and the second layer are adjacent to each other.

12. The soft magnetic material of claim 10, wherein the at least one of the $\alpha''$-$Fe_{16}N_2$ phase domain or the $\alpha'$-$Fe_8N$ phase domain comprises a first set of layers, each layer of the first set of layers comprising the at least one of the $\alpha''$-$Fe_{16}N_2$ phase domain or the $\alpha'$-$Fe_8N$ phase domain, wherein the at least one of the $\alpha''$-$Fe_{16}Z_2$ phase domain or the $\alpha'$-$Fe_8Z$ phase domain comprises a second set of layers, each layer of the second set of layers comprising the at least one of the $\alpha''$-$Fe_{16}Z_2$ phase domain or the $\alpha'$-$Fe_8Z$ phase domain, and wherein one or more respective layers of the first set of layers alternate with one or more respective layers of the second set of layers.

13. The soft magnetic material of claim 10, wherein Z consists of C.

14. The soft magnetic material of claim 10, comprising a saturation magnetization of at least about 219 emu/gram.

15. The soft magnetic material of claim 10, comprising a magnetic coercivity of less than or equal to about 10 Oersteds.

16. The soft magnetic material of claim 10, wherein the at least one of the $\alpha''$-$Fe_{16}N_2$ phase domain or the $\alpha'$-$Fe_8N$ phase domains and the at least one of the $\alpha''$-$Fe_{16}Z_2$ phase domain or the $\alpha'$-$Fe_8Z$ phase domain together form at least about 35 volume percent of the soft magnetic material.

17. The soft magnetic material of claim 10, wherein the at least one of the $\alpha''$-$Fe_{16}N_2$ phase domain or the $\alpha'$-$Fe_8N$ phase domain and the at least one of the $\alpha''$-$Fe_{16}Z_2$ phase domain or the $\alpha'$-$Fe_8Z$ phase domain together form at least about 60 volume percent of the soft magnetic material.

18. A method comprising:
forming a soft magnetic material comprising at least one of:
at least one of an $\alpha''$-$Fe_{16}(N_xZ_{1-x})_2$ phase domain or an $\alpha'$-$Fe_8(N_xZ_{1-x})$, wherein Z includes at least one of C, B, or O, wherein x is a number greater than zero and less than one, wherein the at least one of the $\alpha''$-$Fe_{16}(N_xZ_{1-x})_2$ phase domain or the $\alpha'$-$Fe_8(N_xZ_{1-x})$ phase domain comprises a plurality of at least one of $\alpha''$-$Fe_{16}(N_xZ_{1-x})_2$ crystals or $\alpha'$-$Fe_8(N_xZ_{1-x})$ crystals, and wherein respective [001] axes of the plurality of crystals are randomly distributed within the soft magnetic material; or
at least one of an $\alpha''$-$Fe_{16}N_2$ phase domain or an $\alpha'$-$Fe_8N$ phase domain, and at least one of an $\alpha''$-$Fe_{16}Z_2$ phase domain or an $\alpha'$-$Fe_8Z$ phase domain, wherein the at least one of the $\alpha''$-$Fe_{16}N_2$ phase domain or the $\alpha'$-$Fe_8N$ phase domain comprises a plurality of at least one of $\alpha''$-$Fe_{16}N_2$ crystals or $\alpha'$-$Fe_8N$ crystals, wherein the at least one $\alpha''$-$Fe_{16}Z_2$ phase domain comprises a plurality of at least one of $\alpha''$-$Fe_{16}Z_2$ crystals or $\alpha'$-$Fe_8Z$ crystals and wherein respective [001] axes of the plurality of at least one of $\alpha''$-$Fe_{16}N_2$ crystals or $\alpha'$-$Fe_8N$ crystals and respective [001] axes of the plurality of at least one of $\alpha''$-$Fe_{16}Z_2$ crystals or $\alpha'$-$Fe_8Z$ crystals are randomly distributed within the soft magnetic material.

19. The method of claim 18, wherein forming the soft magnetic material comprises sputtering from a carbon-doped iron target to form a layer comprising iron, carbon, and nitrogen over a substrate.

20. The method of claim 19, wherein the carbon-doped iron target comprises between about 1 at. % and about 10 at. % carbon.

21. The method of claim 19, wherein sputtering comprises forming a nitrogen plasma to provide a source of nitrogen atoms.

22. The method of claim 19, further comprising annealing the layer at a temperature between about 100° C. and about 210° C. for between about 5 hours and about 100 hours.

23. The method of claim 18, wherein forming the soft magnetic material comprises depositing the soft magnetic material over a substrate using at least one of chemical vapor deposition, molecular beam epitaxy, low temperature epitaxy, liquid phase epitaxy, or ion implantation.

24. The method of claim 18, wherein forming the soft magnetic material comprises:
straining an iron workpiece comprising at least one iron crystal in a direction substantially parallel to a <001> crystal axis of the iron crystal;
nitridizing and carbonizing the iron workpiece to form a nitridized and carbonized iron wire or sheet; and
annealing the nitridized and carbonized iron workpiece to form the soft magnetic material.

25. The method of claim 18, wherein forming the soft magnetic material comprises:
implanting nitrogen and carbon atoms in an iron workpiece using ion implantation;
pre-annealing the iron workpiece to attach the iron workpiece to a substrate; and
annealing the nitridized and carbonized iron workpiece to form the soft magnetic material.

26. The method of claim 18, wherein forming the soft magnetic material comprises:
heating an iron source to form a vapor comprising an iron-containing compound;
depositing iron from the vapor comprising the iron-containing compound, nitrogen from a vapor comprising a nitrogen-containing compound, and at least one of carbon, boron, or oxygen from a vapor comprising the compound containing the at least one of carbon, boron, or oxygen over a substrate to form a layer comprising iron, nitrogen, and the at least one of carbon, boron, or oxygen; and
annealing the layer comprising iron, nitrogen, and the at least one of carbon, boron, or oxygen to form the soft magnetic material.

27. The method of claim 18, wherein forming the soft magnetic material comprises:
heating an iron source to form a vapor comprising an iron-containing compound;
depositing iron from the vapor comprising the iron-containing compound and nitrogen from a vapor comprising a nitrogen-containing compound over a substrate to form a first layer comprising iron and nitrogen;
heating an iron source to form a vapor comprising an iron-containing compound;
depositing iron from the vapor comprising the iron-containing compound and at least one of carbon, boron, or oxygen from a vapor comprising the at least one of carbon, boron, or oxygen over the substrate to form a second layer comprising iron and the at least one of carbon, boron, or oxygen; and
annealing the first layer and the second layer to form the soft magnetic material.

28. The method of claim 18, wherein forming the soft magnetic material comprises:
submerging a substrate in a coating solution comprising a nitrogen-containing solvent, an iron source, and a carbon source, wherein the coating solution is saturated with the iron source at a first temperature above a liquidus temperature of an iron-carbon-nitrogen mixture to be deposited from the coating solution;
cooling the coating solution to a second temperature to form a supersaturated coating solution, wherein the second temperature is below the liquidus temperature of the iron-carbon-nitrogen mixture;
maintaining the substrate in the supersaturated coating solution to allow a coating comprising iron, carbon, and nitrogen to form over the substrate; and
annealing the coating comprising iron, carbon, and nitrogen to form the soft magnetic material.

29. The method of claim 18, wherein forming the soft magnetic material comprises:
submerging a substrate in a first coating solution comprising a nitrogen-containing solvent and an iron source, wherein the first coating solution is saturated with the iron source at a first temperature above a liquidus temperature of an iron-nitrogen mixture to be deposited from the first coating solution;
cooling the first coating solution to a second temperature to form a supersaturated first coating solution, wherein the second temperature is below the liquidus temperature of the iron-nitrogen mixture;
maintaining the substrate in the supersaturated first coating solution to allow a first coating comprising iron and nitrogen to form over the substrate;
submerging the substrate in a second coating solution comprising a solvent, an iron source, and a compound containing at least one of carbon, boron, or oxygen, wherein the second coating solution is saturated with the iron source at a third temperature above a liquidus temperature of a mixture to be deposited from the second coating solution;
cooling the second coating solution to a fourth temperature to form a supersaturated second coating solution, wherein the fourth temperature is below the liquidus temperature of the mixture;
maintaining the substrate in the supersaturated second coating solution to allow a second coating comprising iron, nitrogen, and the at least one of carbon, boron, or oxygen to form over the substrate;
annealing the first coating and the second coating to form the soft magnetic material.

30. The method of claim 18, wherein forming the soft magnetic material comprises:
milling, in a bin of a milling apparatus, an iron-containing raw material in the presence of a nitrogen source and a source of at least one of carbon, boron, or oxygen to generate a powder including iron, nitrogen, and the at least one of carbon, boron, or oxygen;
annealing the powder to form the soft magnetic material.

31. The method of claim 18, wherein forming the soft magnetic material comprises:
milling, in a bin of a milling apparatus, an iron-containing raw material in the presence of a nitrogen source to generate a first powder including iron and nitrogen;
annealing the first powder to form at least one phase domain including $\alpha$-$Fe_{16}N_2$ or at least one phase domain including $\alpha'$-$Fe_8N$;
milling, in a bin of a milling apparatus, an iron-containing raw material in the presence of a source including at least one of carbon, boron, or oxygen to generate a second powder including iron and the at least one of carbon, boron, or oxygen;

annealing the second powder to form at least one phase domain including $\alpha\text{-Fe}_{16}Z_2$ or at least one phase domain including $\alpha'\text{-Fe}_8Z$, where Z includes the at least one of carbon, boron, or oxygen; and consolidating the first powder and the second powder to form the soft magnetic material.

* * * * *